United States Patent
Pi et al.

(10) Patent No.: US 8,379,738 B2
(45) Date of Patent: Feb. 19, 2013

(54) METHODS AND APPARATUS TO IMPROVE PERFORMANCE AND ENABLE FAST DECODING OF TRANSMISSIONS WITH MULTIPLE CODE BLOCKS

(75) Inventors: Zhouyue Pi, Richardson, TX (US); Farooq Khan, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 1154 days.

(21) Appl. No.: 12/039,645

(22) Filed: Feb. 28, 2008

(65) Prior Publication Data

US 2008/0225965 A1 Sep. 18, 2008

Related U.S. Application Data

(60) Provisional application No. 60/918,503, filed on Mar. 16, 2007, provisional application No. 60/920,056, filed on Mar. 26, 2007, provisional application No. 60/920,324, filed on Mar. 27, 2007.

(51) Int. Cl.
*H04K 1/10* (2006.01)

(52) U.S. Cl. ........ 375/260; 375/259; 375/299; 375/267; 370/391; 370/328; 370/339; 455/105; 455/101; 455/102; 455/103; 455/104

(58) Field of Classification Search .................. 375/296, 375/260, 259, 299, 267; 370/391, 328, 339; 455/66, 101, 102, 103, 104, 105, 500
See application file for complete search history.

(56) References Cited

U.S. PATENT DOCUMENTS

| 6,173,431 B1 * | 1/2001 | Rittle ............................. 714/778 |
|---|---|---|
| 6,510,137 B1 | 1/2003 | Belaiche |
| 6,798,826 B1 | 9/2004 | Shiu |
| 6,920,602 B1 | 7/2005 | Park et al. |
| 6,999,498 B2 | 2/2006 | Mills et al. |
| 7,461,324 B2 | 12/2008 | Berkmann et al. |
| 7,793,194 B2 | 9/2010 | Seo et al. |
| 8,205,143 B2 | 6/2012 | Buckley et al. |
| 2003/0036403 A1 | 2/2003 | Shiu et al. |
| 2003/0123409 A1 * | 7/2003 | Kwak et al. .................... 370/335 |
| 2003/0128769 A1 | 7/2003 | Kim et al. |
| 2004/0187062 A1 * | 9/2004 | Kajita ........................... 714/755 |

(Continued)

FOREIGN PATENT DOCUMENTS

| EP | 1 130 838 A2 | 9/2001 |
|---|---|---|
| JP | 2005500735 A | 1/2005 |

(Continued)

OTHER PUBLICATIONS

International Search report from the Korean Intellectual Property Office issued in Applicant's corresponding International Patent Application No. PCT/KR2008/001425 dated Jun. 30, 2008.

(Continued)

*Primary Examiner* — Zewdu Kassa

(57) ABSTRACT

A method includes separating resource elements from multiple code blocks into different groups, and decoding the code bits of the resource elements within each group without waiting for a completed reception of a transport block to start decoding.

A method includes separating coded bits from multiple code blocks into different groups, and decoding the code blocks containing coded bits within each group. A first CRC is attached to the transport block and a second CRC is attached to at least one code block from the transport block.

An improved channel interleaver design method including mapping from coded bits of different code blocks to modulation symbols, and mapping from modulation symbols to time, frequency, and spatial resources, to make sure each code block to get roughly the same level of protection.

26 Claims, 34 Drawing Sheets

U.S. PATENT DOCUMENTS

| | | |
|---|---|---|
| 2004/0268206 A1 | 12/2004 | Kim |
| 2006/0013330 A1* | 1/2006 | Ha ................................ 375/267 |
| 2006/0013341 A1 | 1/2006 | Suzuki |
| 2006/0018279 A1* | 1/2006 | Agrawal et al. ............... 370/330 |
| 2006/0209813 A1* | 9/2006 | Higuchi et al. ................ 370/366 |
| 2007/0140377 A1* | 6/2007 | Murakami et al. ............ 375/299 |
| 2008/0192856 A1* | 8/2008 | Jongren et al. ................. 375/267 |
| 2008/0225965 A1 | 9/2008 | Pi et al. |
| 2009/0199066 A1 | 8/2009 | Kim et al. |
| 2009/0303913 A1* | 12/2009 | Yu et al. ........................ 370/312 |
| 2011/0261775 A1 | 10/2011 | Kim et al. |

FOREIGN PATENT DOCUMENTS

| | | |
|---|---|---|
| JP | 2006033157 A | 2/2006 |
| JP | 2006-203355 | 8/2006 |
| RU | 2210185 C2 | 8/2003 |
| RU | 2212103 C2 | 9/2003 |
| WO | WO 99/50963 A2 | 10/1999 |
| WO | WO 00/70771 A1 | 11/2000 |
| WO | WO 2005/069571 A1 | 7/2005 |
| WO | WO 2005/074164 A2 | 8/2005 |
| WO | WO 2006/069300 A2 | 6/2006 |
| WO | WO 2007/024932 A1 | 3/2007 |

OTHER PUBLICATIONS

Decision on Grant dated Mar. 13, 2011 in connection with Russia Patent Application No. 2009134548.

Office Action dated Mar. 13, 2012 in connection with U.S. Appl. No. 12/076,777.

* cited by examiner

|  |  |  |  | Q |  |  |  |  |
|---|---|---|---|---|---|---|---|---|
| 101111 | 101101 | 100101 | 100111 | | 000111 | 000101 | 001101 | 001111 |
| 101110 | 101100 | 100100 | 100110 | | 000110 | 000100 | 001100 | 001110 |
| 101010 | 101000 | 100000 | 100010 | | 000010 | 000000 | 001000 | 001010 |
| 101011 | 101001 | 100001 | 100011 | | 000011 | 000001 | 001001 | 001011 |
| 111011 | 111001 | 110001 | 110011 | | 010011 | 010001 | 011001 | 011011 | I
| 111010 | 111000 | 110000 | 110010 | | 010010 | 010000 | 011000 | 011010 |
| 111110 | 111100 | 110100 | 110110 | | 010110 | 010100 | 011100 | 011110 |
| 111111 | 111101 | 110101 | 110111 | | 010111 | 010101 | 011101 | 011111 |

Figure 12

METHODS AND APPARATUS TO IMPROVE PERFORMANCE AND ENABLE FAST DECODING OF TRANSMISSIONS WITH MULTIPLE CODE BLOCKS

CLAIM OF PRIORITY

This application makes reference to, incorporates the same herein, and claims all benefits accruing under 35 U.S.C. §119 from provisional applications earlier filed in the U.S. Patent & Trademark Office on 16 Mar. 2007 and there duly assigned Ser. No. 60/918,503, filed on 26 Mar. 2007 and assigned Ser. No. 60/920,056, and filed on 27 Mar. 2007 and assigned Ser. No. 60/920,324.

BACKGROUND OF THE INVENTION

1. Field of the Invention

The present invention relates to methods and apparatus for a data transmission in a communication system, and more specifically, to methods and apparatus for improving performance of transmission with multiple code blocks and enabling fast decoding of transmissions with multiple code blocks in a communication system.

2. Description of the Related Art

Orthogonal Frequency Division Multiplexing (OFDM) is a technology to multiplex data in frequency domain. Modulation symbols are carried on frequency sub-carriers and the sub-carriers overlap with each other in frequency domain. The orthogonality is, however, maintained at the sampling frequency in the assumption that the transmitter and receiver have perfect frequency synchronization. In the case of frequency offset due to an imperfect frequency synchronization or due to high mobility, the orthogonality of the sub-carriers at sampling frequencies is destroyed, resulting in Inter-Carrier-Interference (ICI).

A cylic prefix (CP) portion of the received signal is often corrupted by the previous Orthogonal Frequency Division Multiplexing (OFDM) symbol of multipath fading. When the cylic prefix (CP) portion is sufficiently long, the received Orthogonal Frequency Division Multiplexing (OFDM) symbol without a cylic prefix (CP) portion should only contain its own signal convoluted by the multipath fading channel. The main advantage of Orthogonal Frequency Division Multiplexing (OFDM) over other transmission schemes is that Orthogonal Frequency Division Multiplexing (OFDM) demonstrates robustness to compensate for multipath fading.

Single Carrier Frequency Division Multiple Access (SC-FDMA) that utilizes single carrier modulation and frequency domain equalization, is a technique that has similar performance and complexity to that of an Orthognal Frequency Division Multiplexing Access (OFDMA) system. Single Carrier Frequency Division Multiple Access (SC-FDMA) is selected as the uplink multiple access scheme in the 3rd Generation Partnership Project (3GPP) Long Term Evolution (LTE). 3GPP LTE is a project within the Third Generation Partnership Project to improve the Universal Mobile Telecommunications System mobile phone standard to cope with future requirements.

Hybrid Automatic Repeat reQuestion (HARQ) is widely used in communication systems to combat decoding failure and improve reliability. N-channel synchronous Hybrid Automatic Repeat reQuestion (HARQ) is often used in wireless communication systems because of the simplicity of N-channel synchronous Hybrid Automatic Repeat reQuestion (HARQ). The synchronous Hybrid Automatic Repeat reQuestion (HARQ) has been accepted as the HARQ scheme for long term evolution (LTE) uplink in 3GPP. On the downlink of LTE systems, asynchronous adaptive HARQ has been accepted as the HARQ scheme due to its flexibility and additional performance benefits beyond synchronous HARQ.

Multiple antenna communication systems, which are often referred to as Multiple Input Multiple Output (MIMO) systems, are widely used in wireless communication to improve the performance of communication systems. In a MIMO system, a transmitter has multiple antennas capable of transmitting independent signals and a receiver is equipped with multiple receiving antennas. Many MIMO schemes are often used in an advanced wireless system.

When a channel is favorable, e.g., when the mobile speed is low, it is possible to use a closed-loop Multiple Input Multiple Output (MIMO) scheme to improve the system performance. In closed-loop MIMO systems, the receivers feed back to the transmitter the channel condition and/or preferred transmission MIMO processing schemes. The transmitter utilizes this feedback information, together with other considerations such as scheduling priority, data and resource availability, to jointly optimize the transmission scheme. A popular closed loop MIMO scheme is called MIMO preceding. With preceding, the transmit data streams are pre-multiplied by a preceding matrix before being passed on to the multiple transmit antennas.

Another perspective of a Multiple Input Multiple Output (MIMO) system is whether the multiple data streams for transmission are encoded separately or encoded together. All the layers for data transmission are encoded together in the Single Codeword (SCW) MIMO system, while all the layers may be encoded separately in the Multiple Codeword (MCW) MIMO system. Both Single User MIMO (SU-MIMO) and Multi-User MIMO (MU-MIMO) are adopted in the downlink of Long Term Evolution (LTE). MU-MIMO is also adopted in the uplink of Long Term Evolution (LTE), the adoption of SU-MIMO for Long Term Evolution (LTE) uplink, however, is still under discussion.

In a Long Term Evolution (LTE) system, when the transport block is large, the transport block is segmented into multiple code blocks so that multiple coded packets can be generated. This break-down of transport block provides benefits such as enabling parallel processing or pipeline implementation and flexible trade-off between power consumption and hardware complexity.

Different modulation schemes, such as Quadrature phase shift keying (QPSK), binary phase shift keying (BPSK), 8 Phase-shift keying (8-PSK), 16 Quadrature amplitude modulation (16-QAM), or 64 Quadrature amplitude modulation (64-QAM) may be used for adaptive modulation and for increasing the spectral efficiency of modulation. In case of 16-QAM modulation, quadruples of bits, $b_0 b_1 b_2 b_3$, are mapped to complex-valued modulation symbols $x=I+jQ$. Different modulation positions, however, have different protection levels.

When multiple code blocks are transmitted, the performance of the transmission is dictated by the code block that has the worst performance. Channel interleaver, including mapping from coded bits of different code blocks to modulation symbols, and mapping from modulation symbols to time, frequency, and spatial resources, needs to be carefully designed to make sure that each code block gets roughly the same level of protection. When multiple code blocks are transmitted, it is beneficial to allow the receiver to start the decoding of some code blocks while the receiver is still demodulating modulation symbols for other code blocks. In a long term evolution (LTE) system, this presents a challenge because the channel estimation performance might be deleteriously impacted if there are not enough reference signals at the time of demodulation and decoding.

In order to maintain good channel estimation performance, interpolation of reference signals at selected resource elements located around a resource element to be estimated is often used to obtain channel estimation for the resource element with improved performance. This however, means that the demodulation of the modulation symbol in the resource element to be estimated needs to wait until all the resource elements selected for estimating the resource element are received. In other words, if the need for demodulation of the resource element to be estimated occurs before reception of the Orthogonal Frequency Division Multiplexing (OFDM) symbol which contains some of or all of the selected resource elements for estimating the resource element, the channel estimation performance for resource elements may be deleteriously affected.

SUMMARY OF THE INVENTION

It is, therefore, an object of the present invention to provide improved methods and apparatus of transmission of signals with multiple code blocks.

It is another object of the present invention to provide an improved design of channel interleavers and improved wireless receivers.

It is another object of the present invention to provide methods and apparatus enabling fast decoding of multiple code blocks while maintaining good channel estimation performance.

It is another object of this invention to provide an improved method and an improved apparatus for transmitting data by enabling fast decoding of transmissions of signals carrying multiple code blocks.

In one embodiment of the present invention, an improved design of a channel interleaver and receiver is provided and a separate coding method of multiple code blocks is taken into account in order to improve the performance. The design for the channel interleaver, including the mapping from coded bits of different code blocks to modulation symbols, and the mapping from modulation symbols to time, frequency, and spatial resources, assures that each code block gets roughly the same level of protection. On the receiver side, when some code blocks are received correctly and some are not, the signal of the successfully decoded code blocks may be reconstructed and cancelled from the received signal. After the cancellation, the receiver may attempt to re-decode the other code blocks. The interference with other code blocks that are not yet successfully decoded may be therefore greatly reduced, and the probability that the receiver will be able to decode the other code blocks may thus be significantly increased.

In one embodiment of the invention prior to transmission, a CRC is added to each code block to enable error detection for each code block. After the transport block CRC attachment, the bit scrambling, and the code block segmentation, a code block CRC is attached to at least one of the code blocks and the signal is transmitted. Note that if there is only one code block in the transport block, the code block CRC may not be necessary. The CRC overhead may be further reduced by only attaching one code block CRC for multiple code blocks prior to transmission.

In the present invention, a number of steps are provided to be applied in the improved channel interleaver design.

Step 1

Firstly, for each code block, symbols S, $P_1$, $P_2$, contemplate, respectively, the systematic bits, parity bits from encoder 1 of a turbo encoder, and parity bits from encoder 2 of the turbo encoder. In one embodiment of the present invention, the coded bits after the second rate matching are re-arranged based on code blocks. The re-arranged bits may be used to fill up the time-frequency resources, and the modulation positions in modulation symbols.

Step 2

Secondly, these bits first fill up the space along the dimension of frequency (i.e. sub-carrier) index. Then they fill up the space along the dimension of time (i.e. OFDM symbol) index. At last they fill up the space along the dimension of modulation position index. Other ordering of dimensions is certainly possible and covered by the present invention.

Step 3

Thirdly, for each modulation position index and each Orthogonal Frequency Division Multiplexing (OFDM) symbol, the data bits are interleaved along the frequency dimension. For example, a bit-reverse-order (BRO) interleaver or a pruned bit-reverse-order interleaver may be used. Or any other interleaver may be used for this purpose. Sometimes, one or multiple of simplified shuffling patterns may be used. For example, cyclic shifts, or predetermined interleaving/re-arrangement/shuffling/swapping patterns may be used. These patterns may or may not change for each OFDM symbol and/or each modulation position index. Sometimes the number of resource elements available in each OFDM symbol may be different due to different amount of puncturing or usage by other channels in these OFDM symbols. In that case, interleaver with different sizes may be used on different OFDM symbols.

Step 4

Fourth, for each modulation position index and each sub-carrier, the data bits are interleaved along the time dimension. For example, a bit-reverse-order (BRO) interleaver or a pruned bit-reverse-order interleaver may be used. Or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each modulation position and/or sub-carrier index. Sometimes, the number of resource elements available on each sub-carrier index may be different due to different amount of puncturing or usage by other channels on this sub-carrier. In that case, interleaver with different sizes may be used on different sub-carriers.

Step 5

Fifth, for each sub-carrier and each OFDM symbol, the data bits are interleaved along the dimension of modulation position index. For example, a bit-reverse-order (BRO) interleaver or a pruned bit-reverse-order interleaver may be used. Or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each sub-carrier and/or each OFDM symbol. Preferred patterns will be explained later in the present invention.

Another preferred embodiment of the channel interleaver design consists of at least one of the above-stated five steps.

The aforementioned embodiments of channel interleaver design may be easily extended to the case of MIMO transmissions. Suppose multiple layers are allocated to a MIMO codeword. This scenario may apply to long term evolution (LTE) systems, e.g., when the SU-MIMO transmission has rank greater than 1. In this case, a spatial dimension is added in the channel interleaver design. The space for the coded bits may be described as a four-dimensional space in time, frequency, space and modulation positions.

In another embodiment of the invention, the aforementioned embodiments are extended to MIMO transmissions with different spatial dimensions on different resource elements.

In a MIMO system, the rank (number of spatial dimensions, or layers) may be different on different frequency resource elements. The aforementioned embodiments may also be extended to transmissions with different modulation order on different resources. For example, if two resource blocks have very different CQI, the transmitter may use different modulation orders on these two resource blocks. In this case, the design goal of spreading coded bits of each code block as much as possible over time, frequency, spatial, and modulation positions still applies. Special handling needs to be implemented to handle the case of different spatial dimensions or different modulation orders on different time-frequency resources. For example, similar to the resource element map, a map can be constructed to include spatial and modulation position dimension. The layers or the modulation positions that are not available will be skipped.

In another embodiment of the invention, systematic bits priority is given in mapping coded bits, and modulation symbols formed by these coded bits, onto resource elements and spatial dimensions.

The prioritization of systematic bit may also be implemented by defining multiple regions along the dimension of modulation positions.

In another embodiment of the invention, the coded bits of each code block are allocated as uniformly as possible on different modulation positions. There are various ways to achieve this goal. One approach is to enumerate all the permutation patterns of the modulation positions.

A subset of the permutation patterns may be selected. For example, one seed permutation pattern with its cyclic shifted versions may be used as one subset of patterns.

Certainly, the selection of a subset of permutation patterns may be various and depends on other design objectives. For example, not all cyclic shifts are needed in the selected subset. Cyclic shifts from multiple seed permutation patterns may be selected.

Different preferred seed permutation patterns, and their cyclic shifts, may be obtained by reading the positions along a circle, starting from any position and by going either clockwise or counter-clockwise. In this way, maximum separation of the modulation positions with the same level of protection is achieved. This method is also applicable to other modulation orders. Although the seed permutation patterns are generated in this way, and their cyclic shifts, are preferable, this invention certainly covers the application of the modulation position interleaving, permutation, shuffling, swapping, rearranging on resource elements and/or across retransmissions with any pattern or in any fashion.

In another embodiment of this invention, an iterative operation is proposed for receiving the multiple code blocks that are multiplexed together within modulation symbols. With the aforementioned channel interleaver design, the coded bits of different code blocks are multiplexed in the same modulation symbol.

Parallel processing may be also possible in the decoding operation. After the decoding operation, some code blocks may be successfully decoded while some others are not. In this case, the code blocks of those decoded code blocks are reconstructed. Because the coded bits of these blocks are multiplexed in the same modulation symbols with the coded bits of those code blocks that are unsuccessful, the information of these coded bits are used to help the detection of the coded blocks that are yet unsuccessful.

In another embodiment of the present invention, a reduced constellation may improve the detection performance of the transmission.

In another embodiment of the present invention, the iterative operation may be performed without correctly decoding and re-encoding some of the code blocks. Instead, reliability of the coded and information bits may be used to pass through the iterations to improve detection performance. One representation of reliability is called extrinsic information, which is the new likelihood information about each bit that is passed between the multiple processing blocks within the iterative loop.

In another embodiment of the invention, multiple OFDM symbols in a subframe are separated into numbers of groups with the boundary between at least two groups located in the Reference Signal (RS) OFDM symbols, or those OFDM symbols right before or right after the RS OFDM symbols. Each group contains resource elements that will carry coded bits from at least one code block. The resource elements in each group are contiguous or close to each other in time domain. Therefore, the receiver can start decoding of at least one code block after receiving all the resource elements in each group. Different configuration of groups can be used in different situations, such as, but not limited to, different UEs, different subframes, different quality of service, etc. without departing from the spirit of this invention.

In another embodiment of this invention, the groups are defined based on code blocks instead of resource elements. Each group contains coded bits of at least one code block and may contain multiple code blocks.

With the group defined in aforementioned embodiments, either based on resource elements or code blocks, the rest of channel interleaving operations may be defined within each group.

The aforementioned embodiments of channel interleaver design can be extended to the case of MIMO transmissions. When the SU-MIMO transmission has a transmission rank greater than 1, multiple layers are allocated to a MIMO codeword. In this case, a spatial dimension can be added to the definition of one group. Therefore, there may be multiple layers or streams within each group, and there may be multiple groups within each MIMO layer or MIMO stream. In a multi-codeword MIMO transmission, the layers or streams may contain multiple MIMO codewords (CW), each of which carries multiple code blocks and a 24-bit Cyclic redundancy check (CRC). The demodulation of the later groups is parallelized with the decoding of earlier groups. With the help of CRC, the interference from one codeword to another codeword is cancelled by successive interference cancellation.

In another embodiment of this invention, Cyclic redundancy check (CRC) may be added to one or multiple code blocks of a codeword within one group. By doing so, the demodulation of the later groups in one codeword, the decoding of earlier groups in this codeword, the successive interference cancellation, the demodulation of the later groups in another codeword, and the decoding of earlier groups in the other codeword can all be processed paralleled in one way or another.

In another embodiment of this invention, Cyclic redundancy check (CRC) may be added to the groups of multiple MIMO codewords separately. In this embodiment, parallel processing may be enabled even for an iterative receiver.

Several variations and receiver structures may be obtained without deviating from the principle of this invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 12 shows a two dimensional coordinate which shows one illustration of 64-QAM constellation diagram.

FIG. 17 (b) shows a time index (OFDM symbol index)-frequency index (sub-carrier index) space for accommodating data coded bits suitable for the practice of the principles of another embodiment of the present invention;

FIG. 28(a) is a flow chart illustrating a method of transmitting data signals by separating resource elements having coded bits suitable for the practice of the principles of one embodiment of the present invention.

FIG. 28 (b) is a flow chart illustrating a method of receiving and decoding grouped resource elements having coded bits at a receiver.

DETAILED DESCRIPTION OF THE INVENTION

Figure 1:
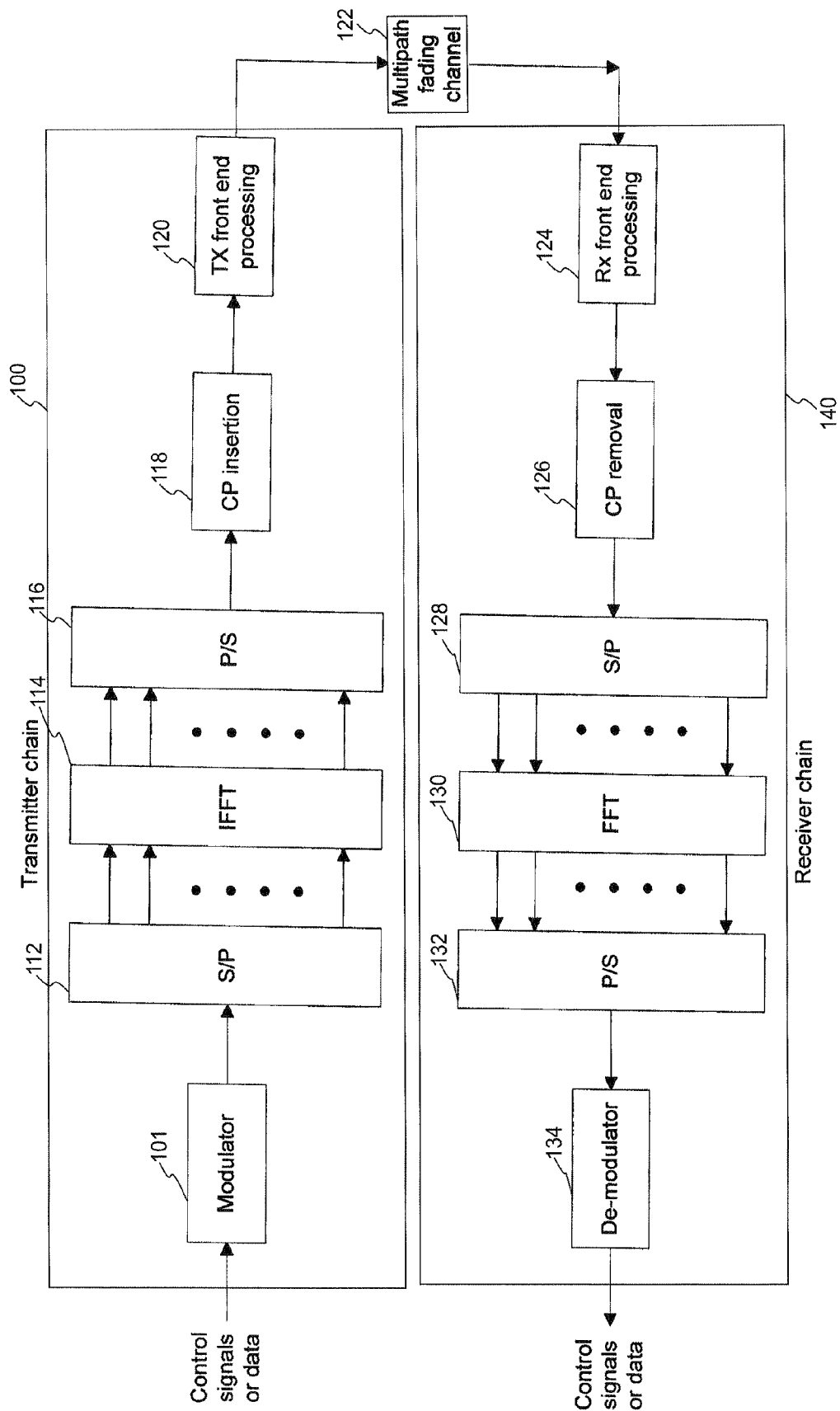
FIG. 1 is an illustration of an Orthogonal Frequency Division Multiplexing (OFDM) transceiver chain having transmitter chain and receiver chain.

In the detailed description of this invention, following terms will be frequently used and the definition of each term is provided.

A subpacket is a portion of an encoded packet, and is a subset of the total coded bits.

Data bits are a stream of information bits which are encoded to generate coded bits.

Interlace refers to a subset of transmission slots or subframes.

The synchronous hybrid automatic repeat request (S-HARQ) is a technique employed by the current high rate packet data (HRPD) standard, which establishes a set of four time-division interlaced transmission channels used for the concurrent transmission of four different sets of data. These interlaced transmission channels are sometimes referred to as "HARQ interlaces".

A transmission slot is an allocated predetermined number of consecutive clock cycles. A number of these transmission slots form a transmission frame.

Space-time coding (STC) is a method employed to improve the reliability of data transmission in wireless communication systems using multiple transmit antennas. STCs rely on transmitting multiple, redundant copies of a data stream to the receiver so that at least some of the data stream copies may survive in the physical path between transmission and reception in a good state to allow reliable decoding.

Transmit diversity method is a method that one data bit is transmitted via different independent channels.

Receiver diversity method is a method that one data bit is received via different independent channels.

Channel Quality Indicator (CQI) is a measurement of the communication quality of wireless channels. CQI (channel quality indicator) can be a value (or values) representing a measure of channel quality for a given channel.

Redundancy Version Parameter indicates which redundancy version of the data is sent.

Channel interleaver sends data interleaved via different channels in order that deep fade or collision at some channels does not void the transmission.

Resource block is a block of time and frequency resource elements that carry signals to be transmitted by the transmitter and to be received by the receiver.

Methods and apparatus to enable fast decoding of transmissions with multiple code blocks constructed according to the present invention will be described in details with reference to the accompanying drawings. Like reference numerals designate like elements throughout the specification.

Also, several acronyms frequently used in this invention are listed as below with their own full names.

SC-FDMA: Single Carrier Frequency Division Multiple Access
CP: cyclic prefix
FFT: Fast Fourier Transform
OFDM: Orthogonal Frequency Division Multiplexing
ICI: Inter-Carrier-Interference
3GPP: 3rd Generation Partnership Project
LTE: Long Term Evolution
HARQ: Hybrid Automatic Repeat reQuestion
MIMO: Multiple Input Multiple Output
QPSK: Quadrature phase shift keying
16-QAM: 16 Quadrature amplitude modulation
64-QAM: 64 Quadrature amplitude modulation
IFFT: Inverse Fast Fourier Transform
CW: codeword
Code block: a block of data bits or the block of coded bits generated by encoding the block of data bits FIG. 1 shows an Orthogonal Frequency Division Multiplexing (OFDM) transceiver chain having transmitter chain and receiver chain.

Figure 2:
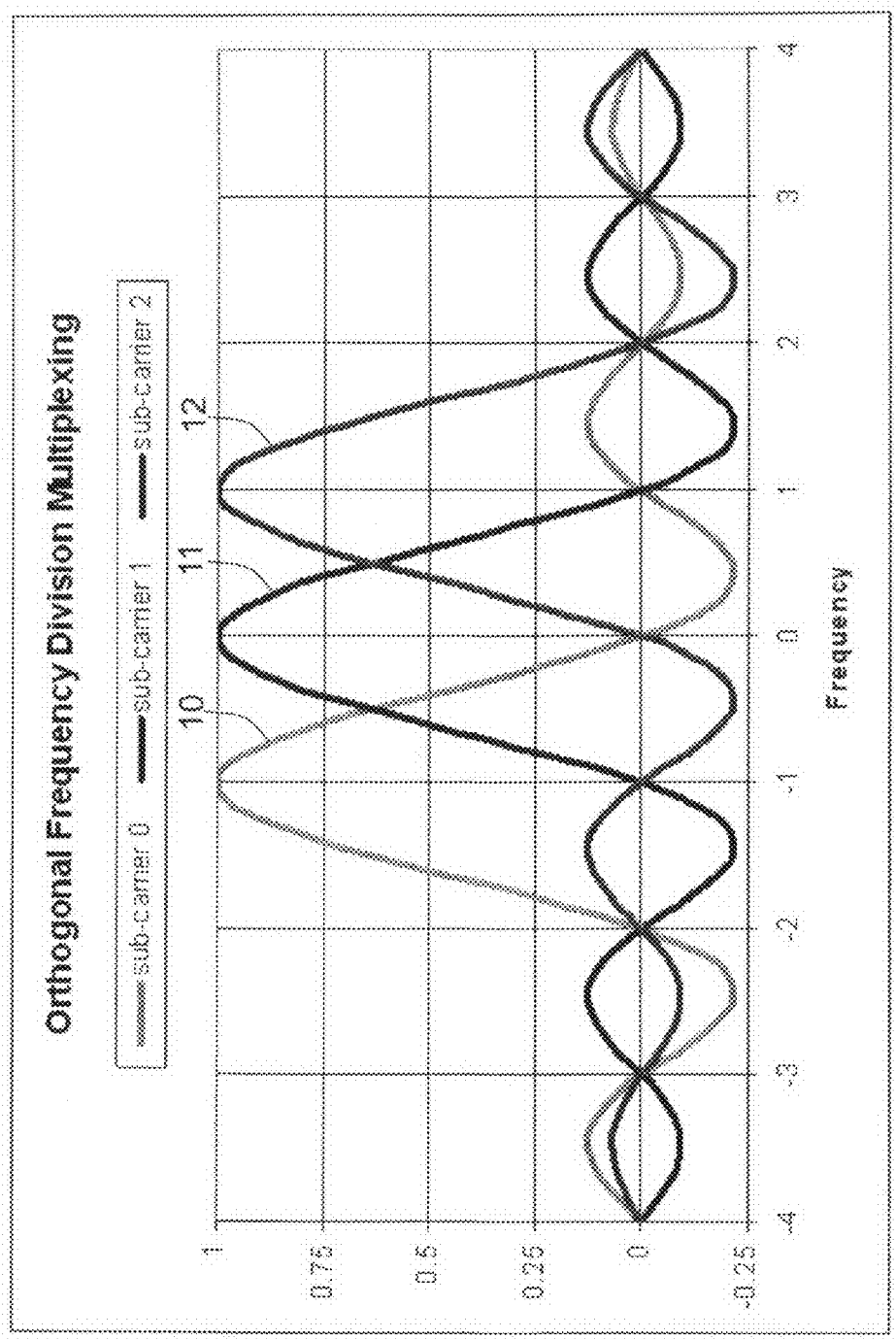
FIG. 2 is a two coordinate illustration of the orthogonality of Orthogonal Frequency Division Multiplexing (OFDM) theory.

Orthogonal Frequency Division Multiplexing (OFDM) is a technology to multiplex data in frequency domain. Modulation symbols are carried on frequency sub-carriers. A sample of Orthogonal Frequency Division Multiplexing (OFDM) transceiver chain is shown in FIG. 1. At a transmitter chain 100, control signals or data signals are modulated by a modulator 101 and the modulated signals are serial-to-parallel converted by a serial-to-parallel convertor 112. An Inverse Fast Fourier Transform (IFFT) unit 114 is used to transfer the modulated signal or data from frequency domain to time domain, and the modulated signals transferred to time domain is parallel-to-serial converted by a parallel-to-serial convertor 116. A cyclic prefix (CP) or zero prefix (ZP) is added to each OFDM symbol at a CP insertion stage 118 to avoid or mitigate the impact due to multipath fading at a multipath fading channel 122. Signals from cyclic prefix (CP) insertion stage 118 are transmitted to transmitter front end processing unit 120, for example, transmit antennas (not shown on FIG. 1). At a receiver chain 140, assuming perfect time and frequency synchronization are achieved, signals received by receiver front end processing unit 124, for example, receive antennas (not shown on FIG. 1), are processed at a cyclic prefix (CP) removal stage 126 in which removes the cyclic prefix (CP) of the received signal. Signal processed at cyclic prefix (CP) removal stage 126 is further serial-to-parallel converted by a serial-to-parallel convertor 128. A Fast Fourier Transform (FFT) unit 130 transfers the received signals from time domain to frequency domain for further processings, such as being parallel-to-serial converted by a parallel-to-serial convertor 132 and being demodulated by a de-modulator Therefore, the signals transmitted by transmitter chain 100 are received by receiver chain FIG. 2 illustrates the orthogonality of Orthogonal Frequency Division Multiplexing (OFDM) theory.

Because each OFDM symbol has finite duration in time domain, the sub-carriers overlap with each other in frequency domain. For example, as shown in FIG. 2, sub-carrier0 10, sub-carrier1 11 and sub-carrier2 12 overlap with each other in frequency domain. sub-carrier0 10, sub-carrier1 11 and sub-carrier2 12 have almost identical or similar wave shapes. These three sub-carriers are mathematically perpendicular to each other, in other words, the inner products of any two of the sub-carriers are zero. The orthogonality of Orthogonal Frequency Division Multiplexing (OFDM) theory, therefore, is maintained at the sampling frequency assuming the transmitter and receiver has perfect frequency synchronization. In the case of frequency offset due to imperfect frequency synchronization or high mobility, the orthogonality of the sub-carriers at sampling frequencies is destroyed, resulting in Inter-Carrier-Interference (ICI).

Figure 3:
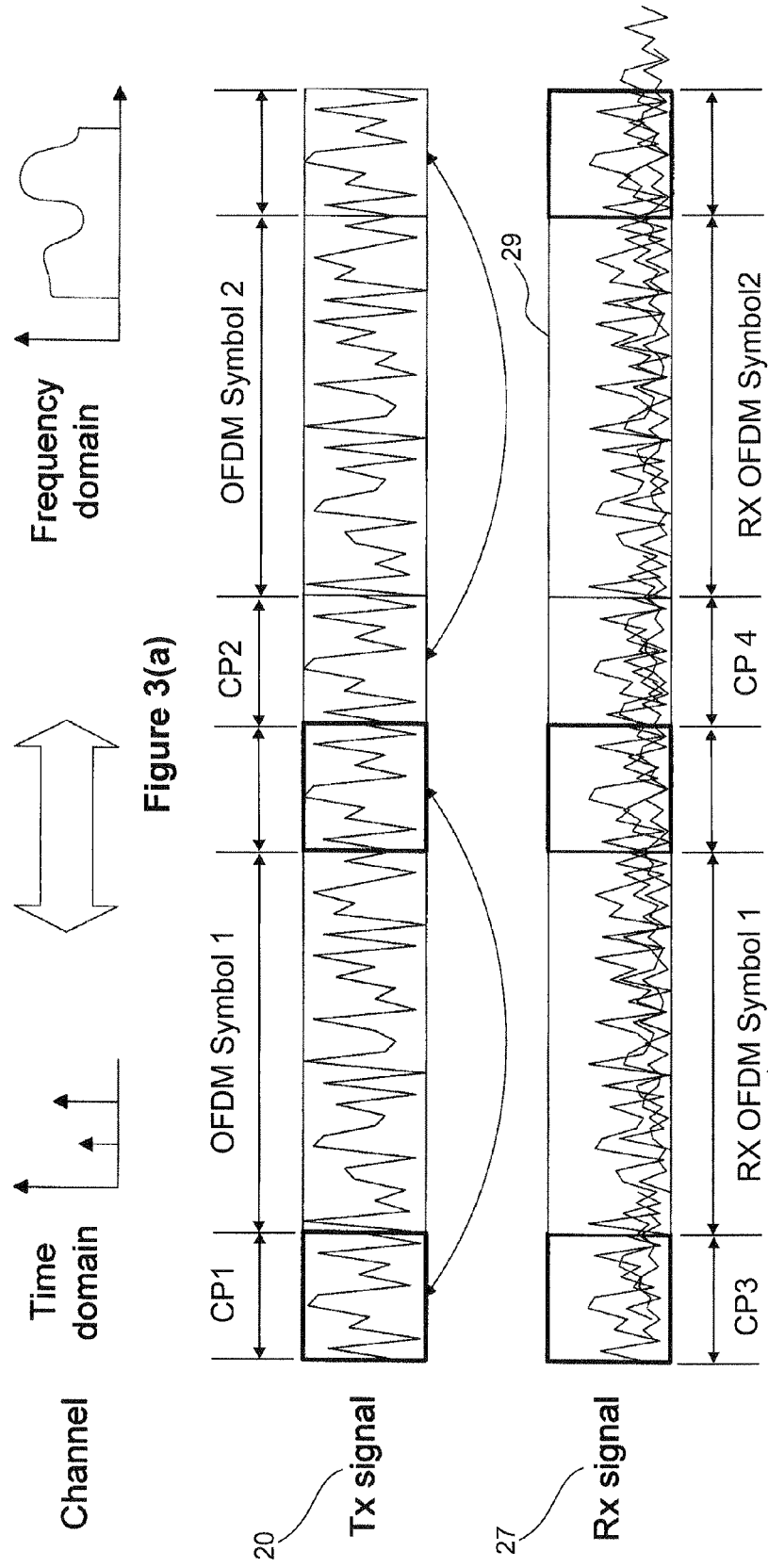
FIG. 3a is an illustration of an Orthogonal Frequency Division Multiplexing (OFDM) symbol in time domain at the transmitter.
FIG. 3b is an illustration of an Orthogonal Frequency Division Multiplexing (OFDM) symbol in time domain at the receiver.

FIG. 3a is an illustration of a transmitted OFDM symbol in time domain, and FIG. 73b is an illustration of the received OFDM symbols in time domain.

As shown in FIG. 3a, A multipath fading channel may be approximated as impulse response channel in time domain, and may be presented as a frequency selective channel in frequency domain. Because of multipath fading channel 122 in the Orthogonal Frequency 1. Division Multiplexing (OFDM) transceiver chain as shown in FIG. 1, a CP portion inserted to one received symbol is often corrupted by the previous OFDM symbol. Transmit signal 20 has continuously transmitted OFDM symbols (i.e. OFDM Symbol 1, OFDM Symbol 2, . . . ), and cylic prefix (CP) portions (i.e. CP1 and CP2) are located between any of two OFDM Symbols. After transmitted through multipath fading channel 122, receive signal 27 has continuously CP inserted OFDM symbols (i.e. Rx OFDM Symbol1 28, Rx OFDM Symbol2 29, . . . ). Rx OFDM Symbol1 28 and Rx OFDM Symbol2 29 are corrupted by their own CP, respectively. For example, CP3 corrupts into Rx OFDM Symbol1 28. When the length of cylic prefix (CP) is sufficiently long, the received OFDM symbols without cylic prefix (CP) portion, however, should only contain their own signal convoluted by the multipath fading channel. In general, a FFT process by FFT unit 130 as shown in FIG. 1 is taken at the receiver side to allow further processing in frequency domain. The advantage of Orthogonal Frequency Division Multiplexing (OFDM) over other transmission schemes is the robustness to multipath fading. The multipath fading in time domain translates into frequency selective fading in frequency domain. With the cyclic prefix or zero prefix inserted, the inter-symbol-interference between adjacent OFDM symbols are avoided or largely alleviated. Moreover, because each modulation symbol is carried over a narrow bandwidth, each modulation symbol experiences a single path fading. Simple equalization scheme may be used to combat frequency selective fading.

Single Carrier Frequency Division Multiple Access (SC-FDMA), which utilizes single carrier modulation and frequency domain equalization is a technique that has similar performance and complexity as those of an Orthognal Frequency Division Multiplexing Access (OFDMA) system. One advantage of Single Carrier Frequency Division Multiple Access (SC-FDMA) is that the Single Carrier Frequency Division Multiple Access (SC-FDMA) signal has lower peak-to-average power ratio (PAPR) because Single Carrier Frequency Division Multiple Access (SC-FDMA) has an inherent single carrier structure. Low PAPR normally results in high efficiency of power amplifier, which is particularly important for mobile stations in uplink transmission. Single Carrier Frequency Division Multiple Access (SC-FDMA) is selected as the uplink multiple access scheme in 3GPP Long Term Evolution (LTE).

Figure 4:
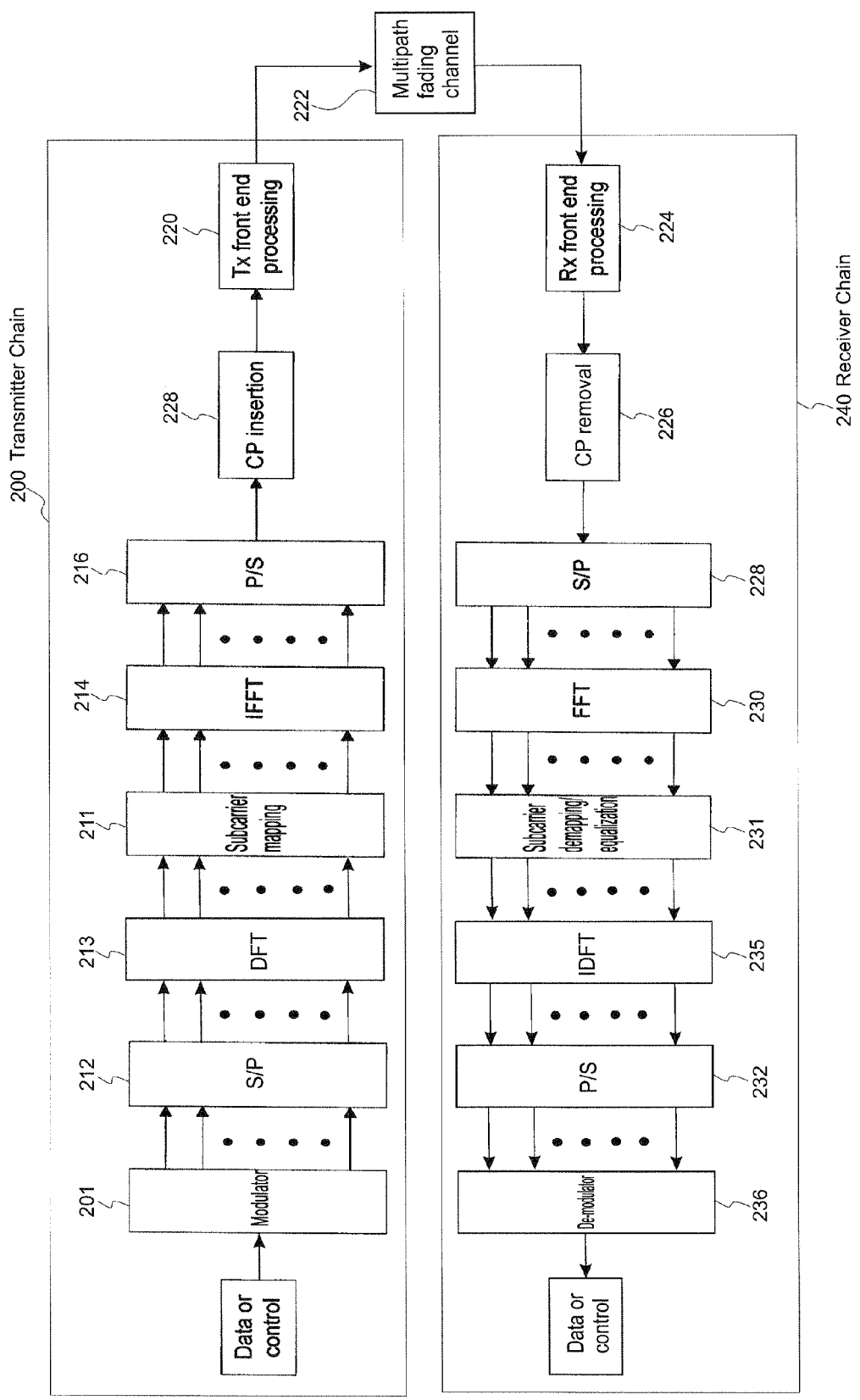
FIG. 4 shows an example of a transceiver chain for Single Carrier Frequency Division Multiple Access (SC-FDMA)

FIG. 4 shows an example of a transceiver chain for Single Carrier Frequency Division Multiple Access (SC-FDMA).

An example of the transceiver chain for Single Carrier Frequency Division Multiple Access (SC-FDMA) is shown in FIG. 4. At transmitter chain 200, time-domain data or control data is modulated by a modulator 201, and the modulated data is serial-to-parallel converted by a serial-to-parallel convertor 212. A Discrete Fourier Transform (DFT) unit 213 processes the converted data by a discrete fourier transform process. To ensure low PAPR, the transformed data is then mapped to a set of contiguous sub-carriers at a subcarrier mapping stage 211. Then an IFFT unit 214 transforms the signal back to time domain, and IFFT unit normally has a larger IFFT size than that of DFT unit 213. A parallel-to-serial convertor 216 parallel-to-serial converts the received data. Cyclic prefix (CP) is added at CP insertion stage 228 before data is transmitted and processed by a transmission front end processing unit 220. Front end processing unit 220 has an amplification stage enabling wireless transmission of the plurality of groups of the encoded data bits in a predetermined sequence via a plurality of transmitting antennas. The processed signal with a cyclic prefix added is often referred to as a Single Carrier Frequency Division Multiple Access (SC-FDMA) block. After the processed signal passes through a communication channel, e.g., a multipath fading channel 222 in a wireless communication system, a receiver chain 240 performs a receiver front end processing at a receiver front end processing unit 224, removes the cylic prefix (CP) by a CP remover 226, serial-to-parallel converts the data by a serial-to-parallel convertor 228, transforms the data by a FFT unit 230 and demaps the data at a subcarrier demapping/equalization unit 231 in frequency domain. Inverse Discrete Fourier Transform (IDFT) unit 233 processes data after the equalized signal is demapped in frequency domain. The output of IDFT unit 235 is further processed by a parallel-to-serial convertor 232 and a demodulator 236.

Figure 5:
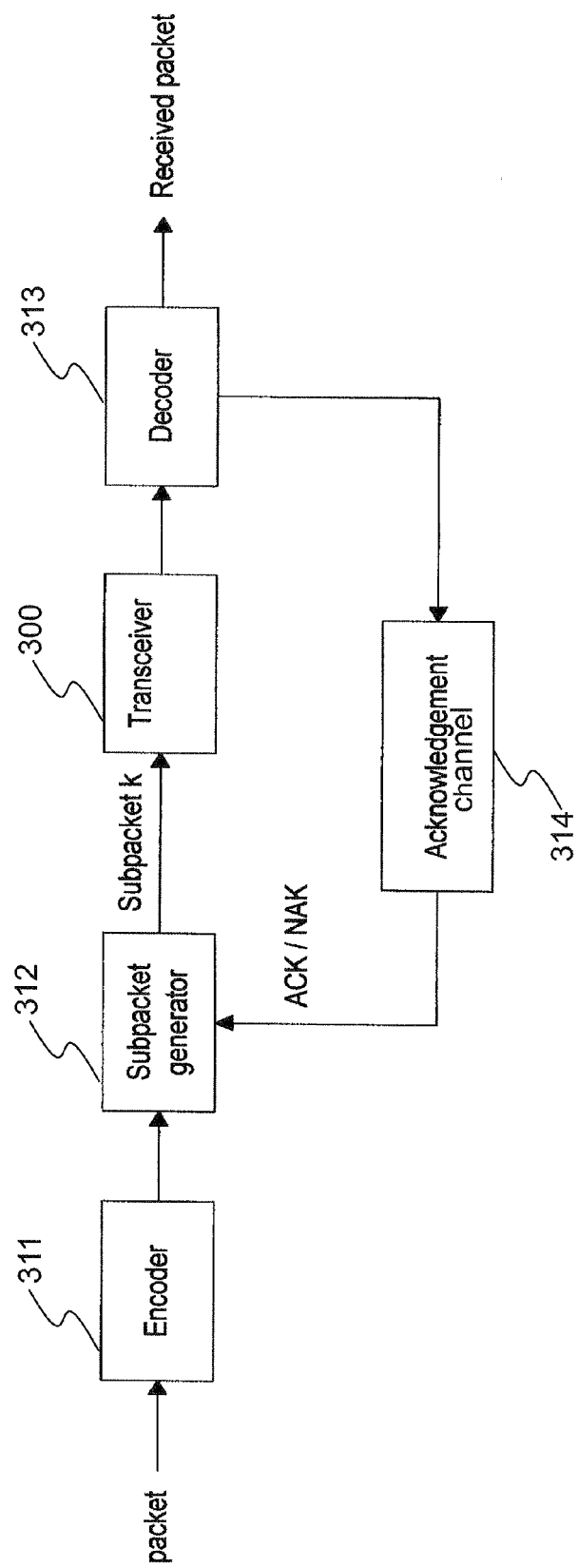
FIG. 5 is an illustration of Hybrid Automatic Repeat reQuestion (HARQ) operation.

FIG. 5 is an illustration of Hybrid Automatic Repeat reQuestion (HARQ) operation.

Hybrid Automatic Repeat reQuestion (HARQ) is widely used in communication systems to combat decoding failure and improve the reliability of data transmission. A HARQ operation is shown in FIG. 5. A data packet is coded by using an encoder 311 with a certain kind of Forward Error Correction (FEC) scheme. The data packet is processed by a subpacket generator 312 and a set of subpackets are generated. A subpacket, for example, a subpacket k may only contain a portion of the coded bits. If the transmission by a transceiver 300 for subpacket k fails, as indicated by a NAK negative acknowledgement provided by a feedback acknowledgement channel 314, a retransmission subpacket, subpackcet k+1, is provided to retransmit this data packet. If subpakcet k+1 is successfully transceived, an ACK acknowledgement is provided by feedback acknowledgement channel 314. The retransmission subpackets may contain different coded bits from previous subpackets. The receiver may softly combine or jointly decode all the received subpackets by a decoder 313 to improve the chance of decoding. Normally, a maximum number of transmissions is configured in consideration of both reliability, packet delay, and implementation complexity.

N-channel synchronous Hybrid Automatic Repeat reQuestion (HARQ) is often used in wireless communication systems because of the simplicity. For example, synchronous Hybrid Automatic Repeat reQuestion (HARQ) has been accepted as the Hybrid Automatic Repeat reQuestion (HARQ) scheme for long term evolution (LTE) uplink in 3GPP.

Figure 6:
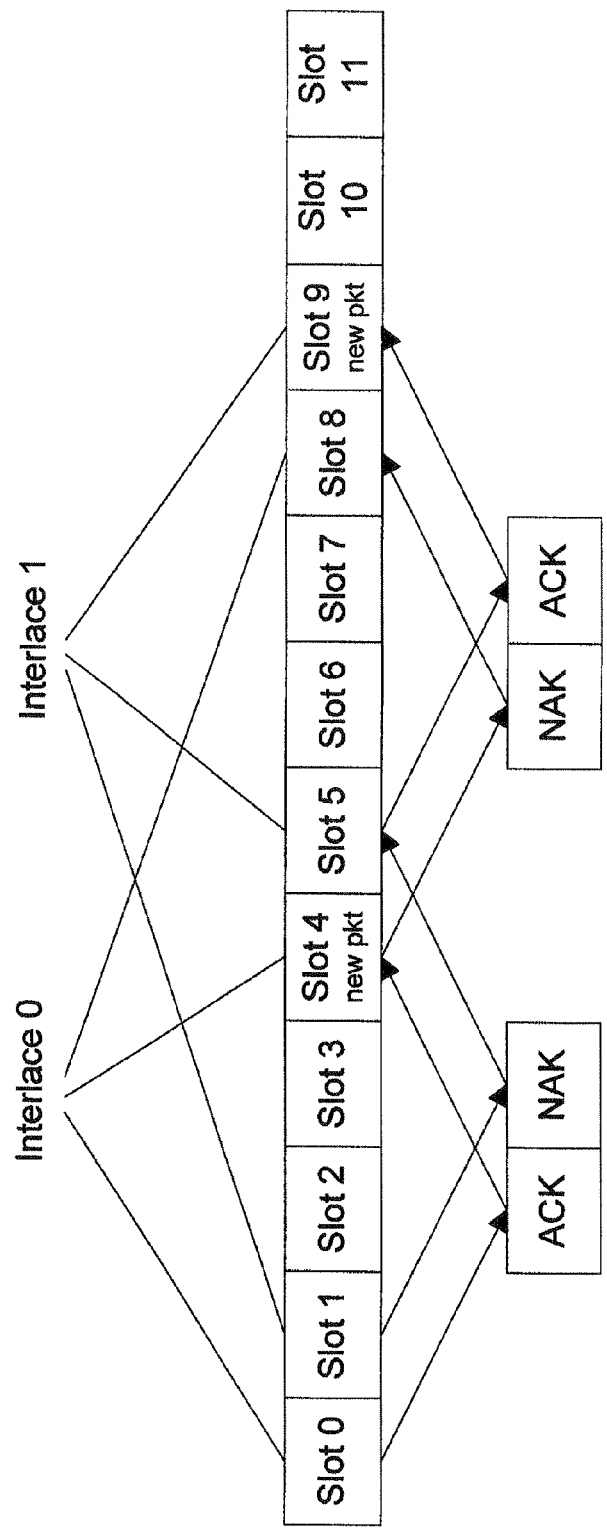
FIG. 6 shows an example of a four-channel synchronous Hybrid Automatic Repeat reQuestion (HARQ)

FIG. 6 shows an example of a four-channel synchronous Hybrid Automatic Repeat reQuestion (HARQ).

Because of the fixed timing relationship between subsequent transmissions, the transmission slots in an individual HARQ channel exhibits an interlace structure. For example, interlace 0 includes slot 0, 4, 8, . . . , 4k, . . . ; interlace 1 includes slot 1, 5, 9, . . . , 4k+1, . . . ; interlace 2 includes slot 2, 6, 10, . . . , 4k+2, . . . ; interlace 3 includes slot 3, 7, 11, . . . 4k+3. . . . A packet is transmitted in slot 0. After correctly decoding the packet, the receiver sends back an ACK acknowledgement to the transmitter. The transmitter then starts transmitting a new packet at the next slot in this interlace, i.e., slot 4. The first subpacket of the new packet transmitted in slot 4, however, is not properly received. After the transmitter receives a NAK negative acknowledgement from the receiver, the transmitter transmits another sub-packet of the same packet at the next slot in interlace 0, i.e., slot 8. Interlaces 1-3 act in similar ways as interlace 0. Sometimes the receiver may have difficulty in detecting the packet boundary, i.e., whether a subpacket is the first sub-packet of a new packet or a retransmission sub-packet. To alleviate this problem, a new packet indicator may be transmitted in a control channel that carries transmission format information for the packet. Sometimes, a more elaborated version of HARQ channel information, such as sub-packet ID, and/or HARQ channel ID, may be provided to help the receiver detect and decode the packet.

Multiple antennas communication systems, which are often referred to as Multiple Input Multiple Output (MIMO), are widely used in wireless communication to improve system performance. In a MIMO system, the transmitter has multiple antennas capable of transmitting independent signals and the receiver is equipped with multiple receive antennas. MIMO systems degenerates to Single Input Multiple Output (SIMO) if there is only one transmit antenna or if there is only one stream of data transmitted. MIMO systems degenerates to Multiple Input Signal Output (MISO) if there is only one receive antenna. MIMO systems degenerates to Single Input Single Output (SISO) if there is only one transmit antenna and one receive antenna. MIMO technology may significant increase throughput and range of the system without any increase in bandwidth or overall transmit power. In general, MIMO technology increases the spectral efficiency of a wireless communication system by exploiting the additional dimension of freedom in the space domain due to multiple antennas. There are many categories of MIMO technologies. For example, spatial multiplexing schemes increase the transmission rate by allowing multiple data streaming transmitted over multiple antennas. Transmit diversity methods such as space-time coding take advantage of spatial diversity due to multiple transmit antennas. Receiver diversity methods utilize the spatial diversity due to multiple receive antennas. Beamforming technologies improve received signal gain and reducing interference to other users. Spatial Division Multiple Access (SDMA) allows signal streams from or to multiple users to be transmitted over the same time-frequency resources. The receivers can separate the multiple data streams by the spatial signature of these data streams. Note that these MIMO transmission techniques are not mutually exclusive. In fact, multiple MIMO schemes may be used in an advanced wireless systems.

When the channel is favorable, e.g., the mobile speed is low, a closed-loop MIMO scheme may be used to improve system performance. In a closed-loop MIMO systems, receivers provide the feedback of channel condition and/or preferred transmitter MIMO processing schemes. The transmitters may utilize this feedback information, together with other considerations such as scheduling priority, data and resource availability, to jointly optimize the transmission scheme.

A popular closed-loop MIMO scheme is called MIMO precoding. During a preceding process, the data streams to be transmitted are precoded, i.e. pre-multiplied by a matrix, before being passed on to the multiple transmit antennas.

Figure 7:
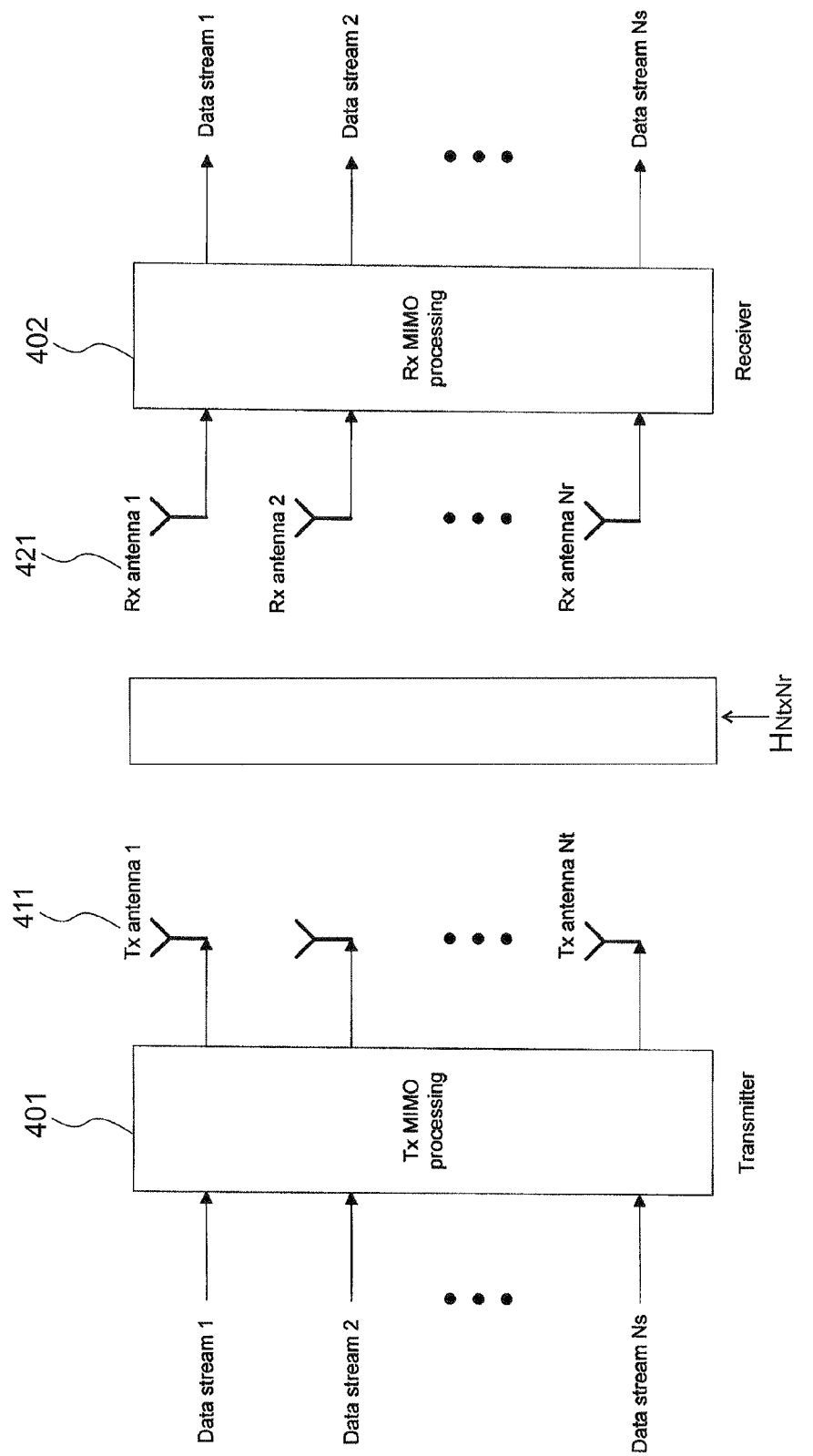
FIG. 7 is an illustration of a Multiple Input Multiple Output (MIMO) system.

FIG. 7 shows a Multiple Input Multiple Output (MIMO) system.

As shown in FIG. 7, a transmitter 401 has a number of Nt transmit antennas 411 and a receiver 402 has a number of Nr receive antenna 421. Data streams 1-Ns are transceived by this MIMO system. A matrix H is denoted as a transceive channel between transmit antennas 411 and receive antennas 421, and channel H is a Nt by Nr matrix. If transmitter 401 has the knowledge of channel matrix H, transmitter 401 can choose the most advantageous transmission scheme based on channel matrix H. For example, when maximizing throughput is the goal of the transmission system, a preceding matrix may be chosen to be the right singluar matrix of channel matrix H if the knowledge of H is available at transmitter 401. Therefore, the effective channel for the multiple data streams at the receiver side can be diagonalized, interference between the multiple data streams may be eliminated. The overhead required to feedback the exact value of channel H, however, is often prohibitive.

Figure 8:
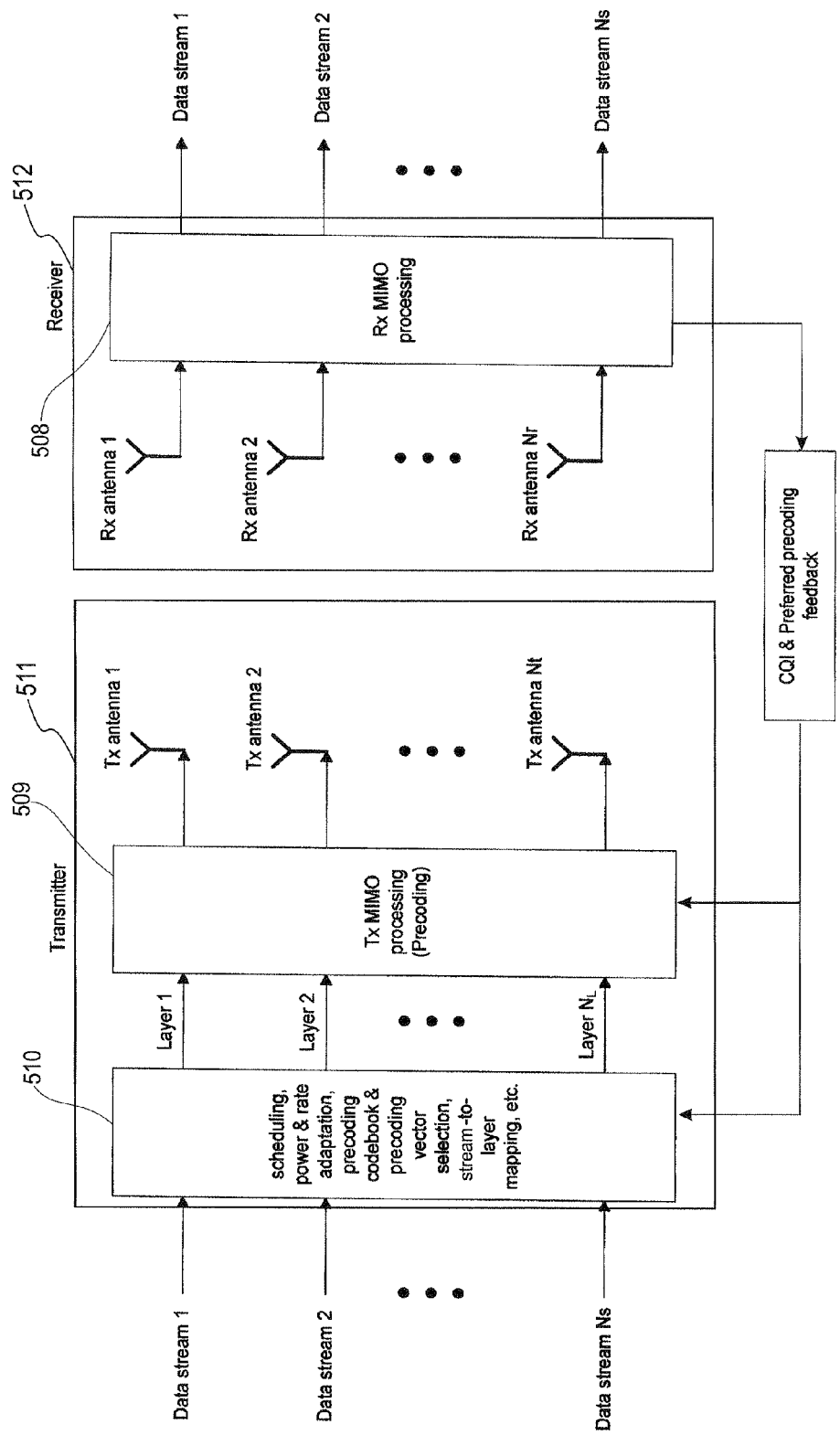
FIG. 8 is an illustration of a Multiple Input Multiple Output (MIMO) preceding process as used in a closed-loop MIMO system.

FIG. 8 shows a precoding process as used in a closed-loop MIMO system.

As shown in FIG. 8, Data streams 1-Ns are processed by a process stage 510 where a scheduling process, a power and rate adapation process, a precoding codebook and preceding vector selection process, a stream-to-layer mapping process and some other related processes are executed. Mapped data streams are transmitted via Layers 1-$N_L$ to a precoding stage 509, i.e. transmitter MINO processing stage. The precoded data is further transmitted to transmit antennas 1-Nt. A receiver 512 receives and restores data streams 1-Nr at a receiver MINO processing stage 508. In order to reduce a feedback overhead, multiple precoding matrices are defined at transmitter 511 to quantize the space of the possible values that channel matrix H could substantiate. With the space quantization, receiver 512 feeds back the preferred precoding scheme, normally in the form of the index of the preferred preceding matrix, the transmission rank, and the indices of the preferred preceding vectors. Receiver 512 may also feed back an associated Channel Quality Indication (CQI) values for the preferred precoding scheme.

Another perspective of a MIMO system is whether the multiple data streams to be transmitted are encoded separately or together. If all of the transmission layers are encoded together, this MIMO system is called Single CodeWord (SCW) MIMO system, otherwise is called a Multiple CodeWord (MCW) MIMO system. In the long term evolution (LTE) downlink system, when Single User MIMO (SU-MIMO) is used, up to two MIMO codewords can be transmitted to a single User Equipment (UE). In the case that two MIMO codewords are transmitted to a User Equipment (UE), the UE needs to acknowledge these two codewords separately. Another MIMO technique is called Spatial Division Multiple Access (SDMA), which is also referred to as Multi-User MIMO (MU-MIMO) sometimes. In SDMA, multiple data streams are encoded separately and transmitted to different intended receivers on the same time-frequency resources. By using different spatial signatures, e.g., antennas, virtual antennas, or precoding vectors, the receivers will be able to distinguish the multiple data streams. Moreover, by scheduling a proper group of receivers and choosing the proper spatial signature for each data stream based on channel state information, the signal of interest can be enhanced for the receiver of interest while the other signals can be enhanced for the other corresponding receivers at the same time. Therefore the system capacity may be improved. Both single user MIMO (SU-MIMO) and multi-user MIMO (MU-MIMO) are adopted in the downlink of long term evolution (LTE). MU-MIMO is also adopted in the uplink of long term evolution (LTE), SU-MIMO for long term evolution (LTE) uplink, however, is still under discussion.

In a long term evolution (LTE) system, when a transport block is large, the transport block is segmented into multiple code blocks so that multiple coded packets can be generated, which is advantageous because of benefits such as enabling parallel processing and pipeline implementation and flexible trade-off between power consumption and hardware complexity.

Figure 9:
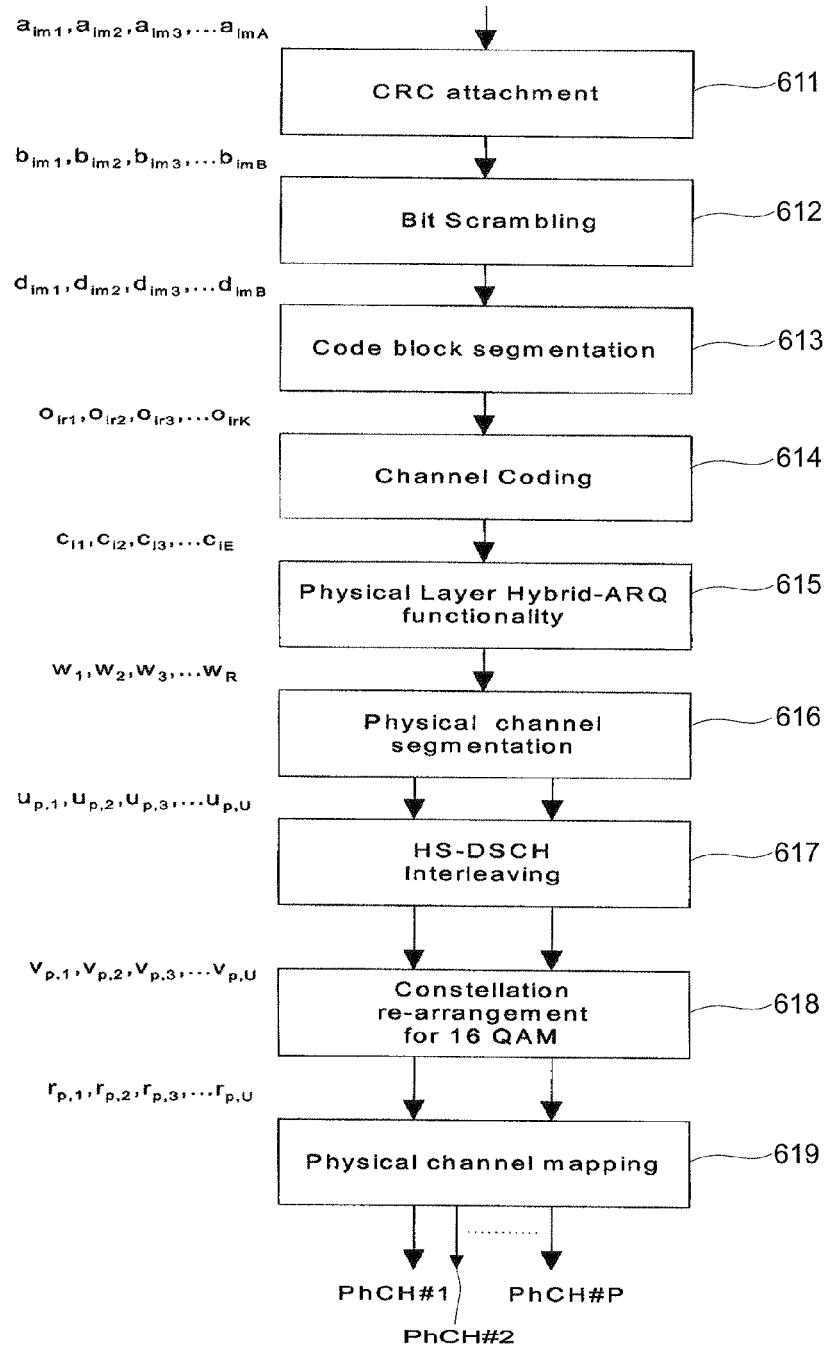
FIG. 9 is a flow chart of a coding chain for High Speed Data Shared Channel (HS-DSCH) in High Speed Downlink Packet Access (HSDPA)

As an example, the encoding process of the High Speed Data Shared Channel (HS-DSCH) in a High Speed Downlink Packet Access (HSDPA) system is illustrated in FIG. 9.

As shown in FIG. 9, data bits $a_{im1}, a_{im2}, a_{im3} \ldots a_{imA}$ are processed at a cyclic redundancy check (CRC) stage 611 and are transformed to data bits $b_{im1}, b_{im2}, b_{im3} \ldots b_{imB}$. CRC attached data bits are bit scrambled at a bit scrambling stage 612, and are transformed to data bits $d_{im1}, d_{im2}, d_{im3} \ldots d_{imB}$. Scrambled data bits are segmented at code block segmentation stage 613 and are formed to code blocks $o_{ir1}, o_{ir2}, o_{ir3} \ldots o_{irK}$. Code blocks then are coded at a channel coding stage 614 and become coded code blocks $c_{ir1}, c_{ir2}, c_{ir3} \ldots c_{irE}$. These coded code blocks are processed at a physical layer Hybrid-ARQ functionality stage 615. The resulting data bits are again segmented at a physical channel segmentation stage 616. The Hybrid-ARQ functionality matches the number of bits $w_1, w_2, w_3 \ldots w_R$ at the coded bits to the total number of bits of HS-DSCH physical channel. The resulting channel segmented data bits $u_{p,1}, u_{p,2}, u_{p,3} \ldots u_{p,U}$ are interleaved by a HS-DSCH interleaving stage 617. Interleaved data bits $v_{p,1}$, $v_{p,2}$, $v_{p,3}$ . . . $v_{p,U}$ are then re-arranged at a constellation re-arrangement stage 618 and re-arranged bits $r_{p,1}$, $r_{p,2}$, $r_{p,3}$ . . . $r_{p,U}$ are further mapped at a physical channel mapping stage 619. The resulting mapped bits are finally output to physical channel #1, physical channel #2 . . . physical channel #P. In current HS-DSCH design, only one 24-bit cyclic redundancy check (CRC) is generated for the whole transport block for the purpose of error detection for that block. If multiple code blocks are generated and transmitted in one Transmission Time Interval (TTI), the receiver may correctly decode some of the code blocks but not the others. In that case, the receiver has to feedback a is NAK negative acknowledgement to the transmitter because the CRC for the transport block will not check.

The hybrid ARQ functionality matches the number of bits at the output of the channel coder (i.e. channel coding stage 614) to the total number of bits of the HS-PDSCH set to which the HS-DSCH is mapped. The hybrid ARQ functionality is controlled by redundancy version (RV) parameters. The exact set of bits at the output of the hybrid ARQ functionality depends on the number of input bits, the number of output bits, and the RV parameters.

Figure 10:
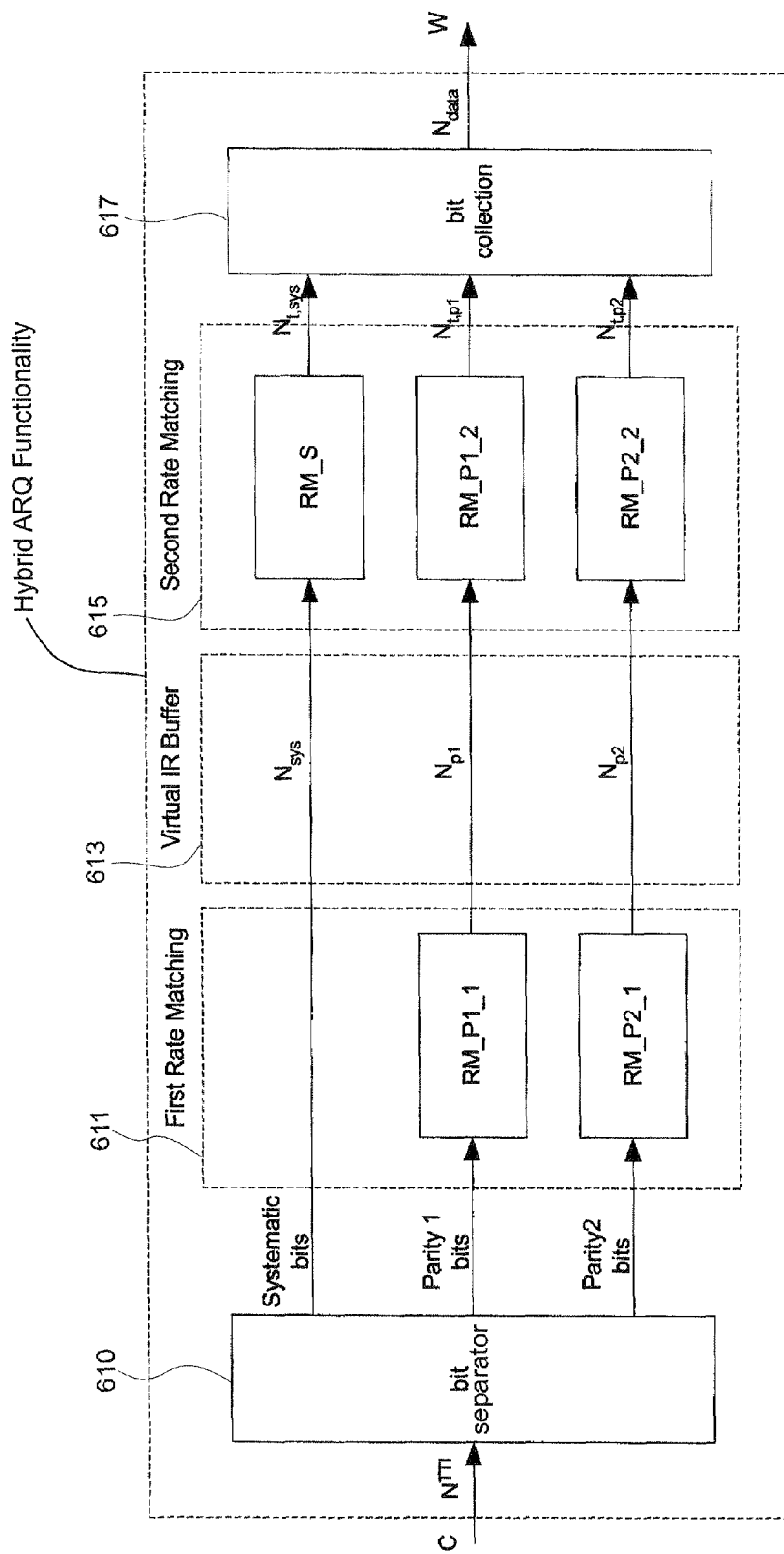
FIG. 10 is an illustration of the functionality of HS-DSCH HARQ in High Speed Downlink Packet Access (HSDPA)

The hybrid ARQ functionality has two rate-matching stages and a virtual buffer as shown in FIG. 10.

A stream of data bits $N^{TTI}$ from resource C is separated into systematic bits, parity1 bits and parity2 bits by a bit separator 610. These three groups of bits are processed differently at a first rate matching stage 611. First rate matching stage 611 matches the number of input bits to a virtual IR buffer 613, and the information about buffer 613 is provided by higher layers. Systematic bits are directly provided to buffer 613, parity1 bits are processed by rate matcher RM_P1_1 and parity2 bits are processed by rate matcher RM_P2_1. Outputs of buffer 613 are provided to a second rate matching stage 615. Second rate matching stage 615 matches the number of bits after first rate matching stage 611 to the number of physical channel bits available in the HS-PDSCH set in the Transmission Time Interval (TTI). Output $N_{sys}$ is provided to rate matcher RM_S of second rate matching stage 615, output $N_{p1}$ is provided to rate matcher RM_P1_2 of second rate matching stage 615, and output $N_{p2}$ is provided to rate matcher RM_P2_2 of second rate matching stage 615. Outputs $N_{sys}$, $N_{p1}$, and $N_{p2}$ are provided to a bit collection stage 617. Therefore, a resulting data bits stream $N_{data}$ is provided to terminal W. Note that, if the number of input bits does not exceed buffering capability virtual IR buffer 613, first rate-matching stage 611 is transparent.

Different modulation schemes, such as Quadrature phase shift keying (QPSK), binary phase shift keying (BPSK), 8 Phase-shift keying (8-PSK), 16 Quadrature amplitude modulation (16-QAM), or 64 Quadrature amplitude modulation (64-QAM) may be used for an adaptive modulation and increasing the spectral efficiency of modulation. In case of 16-QAM modulation, quadruples of bits, b0b1b2b3, are mapped to complex-valued modulation symbols x=I+jQ. One implementation of 16-QAM is illustrated in Table 1.

TABLE 1

16-QAM modulation mapping

| $b_0b_1b_2b_3$ | I | Q |
|---|---|---|
| 0000 | $1/\sqrt{10}$ | $1/\sqrt{10}$ |
| 0001 | $1/\sqrt{10}$ | $3/\sqrt{10}$ |
| 0010 | $3/\sqrt{10}$ | $1/\sqrt{10}$ |
| 0011 | $3/\sqrt{10}$ | $3/\sqrt{10}$ |
| 0100 | $1/\sqrt{10}$ | $-1/\sqrt{10}$ |
| 0101 | $1/\sqrt{10}$ | $-3/\sqrt{10}$ |
| 0110 | $3/\sqrt{10}$ | $-1/\sqrt{10}$ |
| 0111 | $3/\sqrt{10}$ | $-3/\sqrt{10}$ |
| 1000 | $-1/\sqrt{10}$ | $1/\sqrt{10}$ |
| 1001 | $-1/\sqrt{10}$ | $3/\sqrt{10}$ |
| 1010 | $-3/\sqrt{10}$ | $1/\sqrt{10}$ |
| 1011 | $-3/\sqrt{10}$ | $3/\sqrt{10}$ |
| 1100 | $-1/\sqrt{10}$ | $-1/\sqrt{10}$ |
| 1101 | $-1/\sqrt{10}$ | $-3/\sqrt{10}$ |
| 1110 | $-3/\sqrt{10}$ | $-1/\sqrt{10}$ |
| 1111 | $-3/\sqrt{10}$ | $-3/\sqrt{10}$ |

Figure 11:
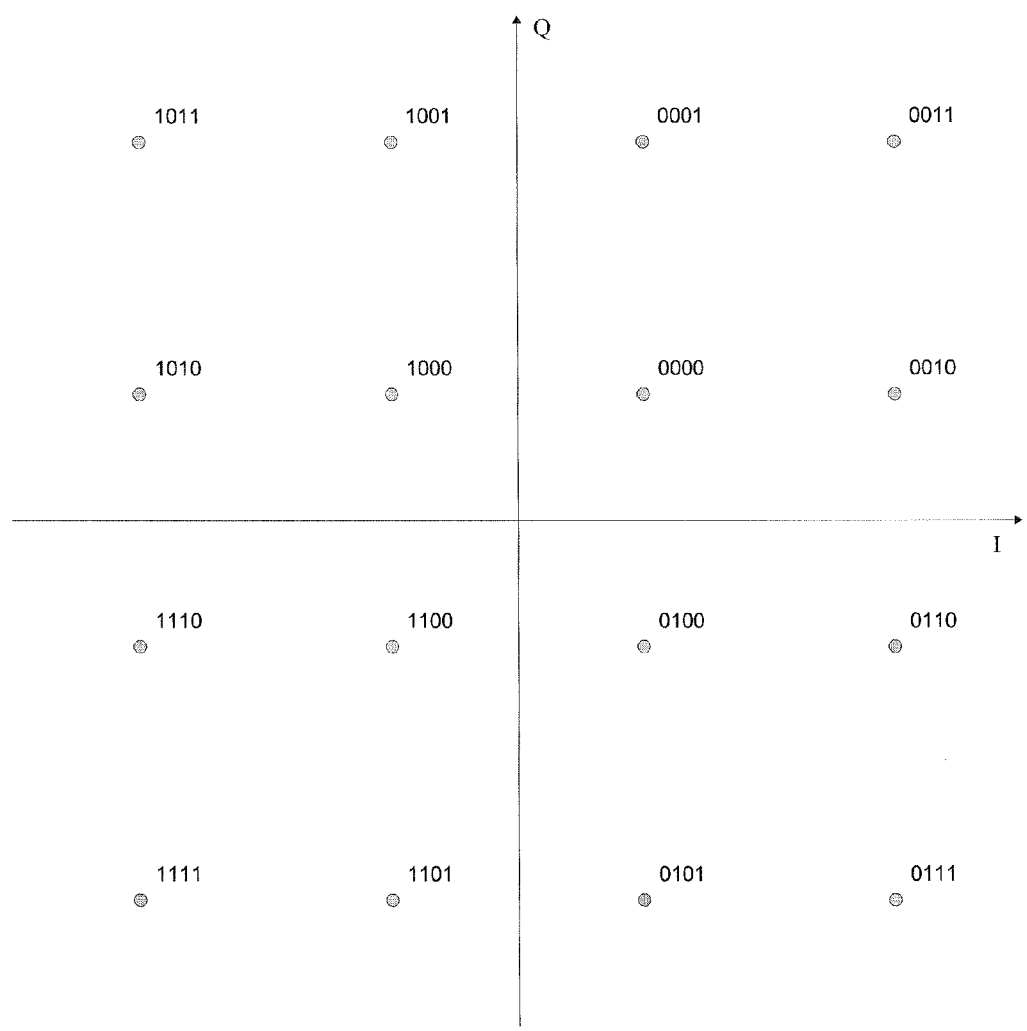
FIG. 11 shows a two dimensional coordinate which shows one illustration of 16-QAM constellation diagram.

The constellation of the 16-QAM modulation in Table 1 is shown in FIG. 11. FIG. 11 shows a two dimensional coordinate which shows one illustration of 16-QAM constellation diagram. A constellation diagram is a representation of a signal modulated by a digital modulation scheme. The constellation diagram displays signals on a two-dimensional coordinate diagram in a complex plane at symbol sampling instants. The constellation diagram represents the possible symbols selected by a given modulation scheme as dots in the complex plane. Each dot on FIG. 11 illustrates a corresponding symbol of b0b1b2b3 on the I-Q complex plan when I and Q have predetermined values as show in Table 1. This constellation provides different protection levels on the four bits (i.e. bit b0, b1, b2 and b3). As shown in FIG. 11, the protection level on bits b0 and b1 are the same, the protection level on bits b2 and b3 are the same. The protection level on b0 and b1, however, are higher than the protection level on bits b2 and b3.

In case of 64QAM modulation, sextuplets of bits, b0b1b2b3b4b5, are mapped to complex-valued modulation symbols x=I+jQ. One implementation of 64-QAM is shown in Table 2. The constellation of the 64-QAM modulation in Table 2 is shown in FIG. 11. FIG. 12, shows a two dimensional coordinate which shows one illustration of 64-QAM constellation diagram. This constellation provides different protection levels on the six bits. Similar to FIG. 11, each dot on FIG. 12 illustrates a corresponding symbol of b0b1b2b3b4b5 on the I-Q complex plan when I and Q have predetermined values as show in Table 2. The protection level on bits b0 and b1 are the same, the protection on bits b2 and b3 are the same, and the protection level on bits b4 and b5 are the same. The protection levels on bits b0 and b1, however, are stronger than the protection levels on bits b2 and b3 that are stronger than the protection on bits b4 and b5. For convenience, the index of a bit is defined in a modulation symbol as the modulation position of that bit.

TABLE 2

64-QAM modulation mapping

| $b_0b_1b_2b_3b_4b_5$ | I | Q |
|---|---|---|
| 000000 | $3/\sqrt{42}$ | $3/\sqrt{42}$ |
| 000001 | $3/\sqrt{42}$ | $1/\sqrt{42}$ |
| 000010 | $1/\sqrt{42}$ | $3/\sqrt{42}$ |
| 000011 | $1/\sqrt{42}$ | $1/\sqrt{42}$ |
| 000100 | $3/\sqrt{42}$ | $5/\sqrt{42}$ |
| 000101 | $3/\sqrt{42}$ | $7/\sqrt{42}$ |
| 000110 | $1/\sqrt{42}$ | $5/\sqrt{42}$ |
| 000111 | $1/\sqrt{42}$ | $7/\sqrt{42}$ |

TABLE 2-continued

64-QAM modulation mapping

| $b_0b_1b_2b_3b_4b_5$ | I | Q |
|---|---|---|
| 001000 | $5/\sqrt{42}$ | $3/\sqrt{42}$ |
| 001001 | $5/\sqrt{42}$ | $1/\sqrt{42}$ |
| 001010 | $7/\sqrt{42}$ | $3/\sqrt{42}$ |
| 001011 | $7/\sqrt{42}$ | $1/\sqrt{42}$ |
| 001100 | $5/\sqrt{42}$ | $5/\sqrt{42}$ |
| 001101 | $5/\sqrt{42}$ | $7/\sqrt{42}$ |
| 001110 | $7/\sqrt{42}$ | $5/\sqrt{42}$ |
| 001111 | $7/\sqrt{42}$ | $7/\sqrt{42}$ |
| 010000 | $3/\sqrt{42}$ | $-3/\sqrt{42}$ |
| 010001 | $3/\sqrt{42}$ | $-1/\sqrt{42}$ |
| 010010 | $1/\sqrt{42}$ | $-3/\sqrt{42}$ |
| 010011 | $1/\sqrt{42}$ | $-1/\sqrt{42}$ |
| 010100 | $3/\sqrt{42}$ | $-5/\sqrt{42}$ |
| 010101 | $3/\sqrt{42}$ | $-7/\sqrt{42}$ |
| 010110 | $1/\sqrt{42}$ | $-5/\sqrt{42}$ |
| 010111 | $1/\sqrt{42}$ | $-7/\sqrt{42}$ |
| 011000 | $5/\sqrt{42}$ | $-3/\sqrt{42}$ |
| 011001 | $5/\sqrt{42}$ | $-1/\sqrt{42}$ |
| 011010 | $7/\sqrt{42}$ | $-3/\sqrt{42}$ |
| 011011 | $7/\sqrt{42}$ | $-1/\sqrt{42}$ |
| 011100 | $5/\sqrt{42}$ | $-5/\sqrt{42}$ |
| 011101 | $5/\sqrt{42}$ | $-7/\sqrt{42}$ |
| 011110 | $7/\sqrt{42}$ | $-5/\sqrt{42}$ |
| 011111 | $7/\sqrt{42}$ | $-7/\sqrt{42}$ |
| 100000 | $-3/\sqrt{42}$ | $3/\sqrt{42}$ |
| 100001 | $-3/\sqrt{42}$ | $1/\sqrt{42}$ |
| 100010 | $-1/\sqrt{42}$ | $3/\sqrt{42}$ |
| 100011 | $-1/\sqrt{42}$ | $1/\sqrt{42}$ |
| 100100 | $-3/\sqrt{42}$ | $5/\sqrt{42}$ |
| 100101 | $-3/\sqrt{42}$ | $7/\sqrt{42}$ |
| 100110 | $-1/\sqrt{42}$ | $5/\sqrt{42}$ |
| 100111 | $-1/\sqrt{42}$ | $7/\sqrt{42}$ |
| 101000 | $-5/\sqrt{42}$ | $3/\sqrt{42}$ |
| 101001 | $-5/\sqrt{42}$ | $1/\sqrt{42}$ |
| 101010 | $-7/\sqrt{42}$ | $3/\sqrt{42}$ |
| 101011 | $-7/\sqrt{42}$ | $1/\sqrt{42}$ |
| 101100 | $-5/\sqrt{42}$ | $5/\sqrt{42}$ |
| 101101 | $-5/\sqrt{42}$ | $7/\sqrt{42}$ |
| 101110 | $-7/\sqrt{42}$ | $5/\sqrt{42}$ |
| 101111 | $-7/\sqrt{42}$ | $7/\sqrt{42}$ |
| 110000 | $-3/\sqrt{42}$ | $-3/\sqrt{42}$ |
| 110001 | $-3/\sqrt{42}$ | $-1/\sqrt{42}$ |
| 110010 | $-1/\sqrt{42}$ | $-3/\sqrt{42}$ |
| 110011 | $-1/\sqrt{42}$ | $-1/\sqrt{42}$ |
| 110100 | $-3/\sqrt{42}$ | $-5/\sqrt{42}$ |
| 110101 | $-3/\sqrt{42}$ | $-7/\sqrt{42}$ |
| 110110 | $-1/\sqrt{42}$ | $-5/\sqrt{42}$ |
| 110111 | $-1/\sqrt{42}$ | $-7/\sqrt{42}$ |
| 111000 | $-5/\sqrt{42}$ | $-3/\sqrt{42}$ |
| 111001 | $-5/\sqrt{42}$ | $-1/\sqrt{42}$ |
| 111010 | $-7/\sqrt{42}$ | $-3/\sqrt{42}$ |
| 111011 | $-7/\sqrt{42}$ | $-1/\sqrt{42}$ |
| 111100 | $-5/\sqrt{42}$ | $-5/\sqrt{42}$ |
| 111101 | $-5/\sqrt{42}$ | $-7/\sqrt{42}$ |
| 111110 | $-7/\sqrt{42}$ | $-5/\sqrt{42}$ |
| 111111 | $-7/\sqrt{42}$ | $-7/\sqrt{42}$ |

For example, the modulation position of b0 in a 64-QAM is 0, the modulation position of b1 in a 64-QAM is 1. Therefore, for the given 64-QAM constellation, the first and second modulation positions, i.e., b0 and b1, have the strongest protection; the third and fourth modulation positions, i.e., b2 and b3, have weaker protection levels; the fifth and the sixth modulation positions, i.e., b4 and b5, have the weakest protection level.

In this invention, methods and apparatus are provided to improve the performance of transmissions with information bits or parity bits from multiple coded packets.

Aspects, features, and advantages of the invention are readily apparent from the following detailed description, simply by illustrating a number of particular embodiments and implementations, including the best mode contemplated for carrying out the invention. The present invention is also capable of other and different embodiments, and several details of the present invention may be modified into various obvious respects, all without departing from the spirit and scope of the invention. Accordingly, the drawings and description are to be regarded as illustrative in nature, and not as restrictive. The present invention is illustrated by way of example, and not by way of limitation, in the figures of the accompanying drawings.

In the following illustrations, downlink data channel in long term evolution (LTE) systems are used as an example. However, the technique illustrated here can certainly be used in uplink data channel in long term evolution (LTE) systems, control channels in either downlink or uplink in long term evolution (LTE) systems, and other data, control, or other channels in other systems whenever applicable.

In the present invention, an improved design of channel interleaver and receiver is provided and a separate coding method of multiple code blocks is taken into account to improve the performance. When multiple code blocks are transmitted, the performance of the transmission is dictated by the code block that has the worst performance. The idea is to carefully design the channel interleaver, including the mapping from coded bits of different code blocks to modulation symbols, and the mapping from modulation symbols to time, frequency, and spatial resources, to make sure each code block get roughly the same level of protection. On the receiver side, when some code blocks are received correctly and some are not, the signal of the successfully decoded code blocks may be reconstructed and cancelled from the received signal. After the cancellation, the receiver may attempt to re-decode the other code blocks. Because the interference with other code blocks that are not yet successfully decoded may be greatly reduced, the probability that the receiver will be able to decode the other code blocks can be significantly increased. In the case of hybrid ARQ (HARQ), if the receiver is not able to decode one of the code blocks, the receiver will feedback NAK for the whole transport block, assuming there is only one ACK channel. Because the Node B has no knowledge which code block is successfully decoded by the UE and which is not, the Node B will retransmit as if the whole transport block including all code blocks are NAKed. In that case, UE should be able to utilize the knowledge about those successfully decoded code blocks to help decoding those code blocks that have not been successfully decoded. The channel interleaver design proposed in this invention facilitates that operation. Preferred embodiments of the receiver operation are also disclosed.

Figure 13:
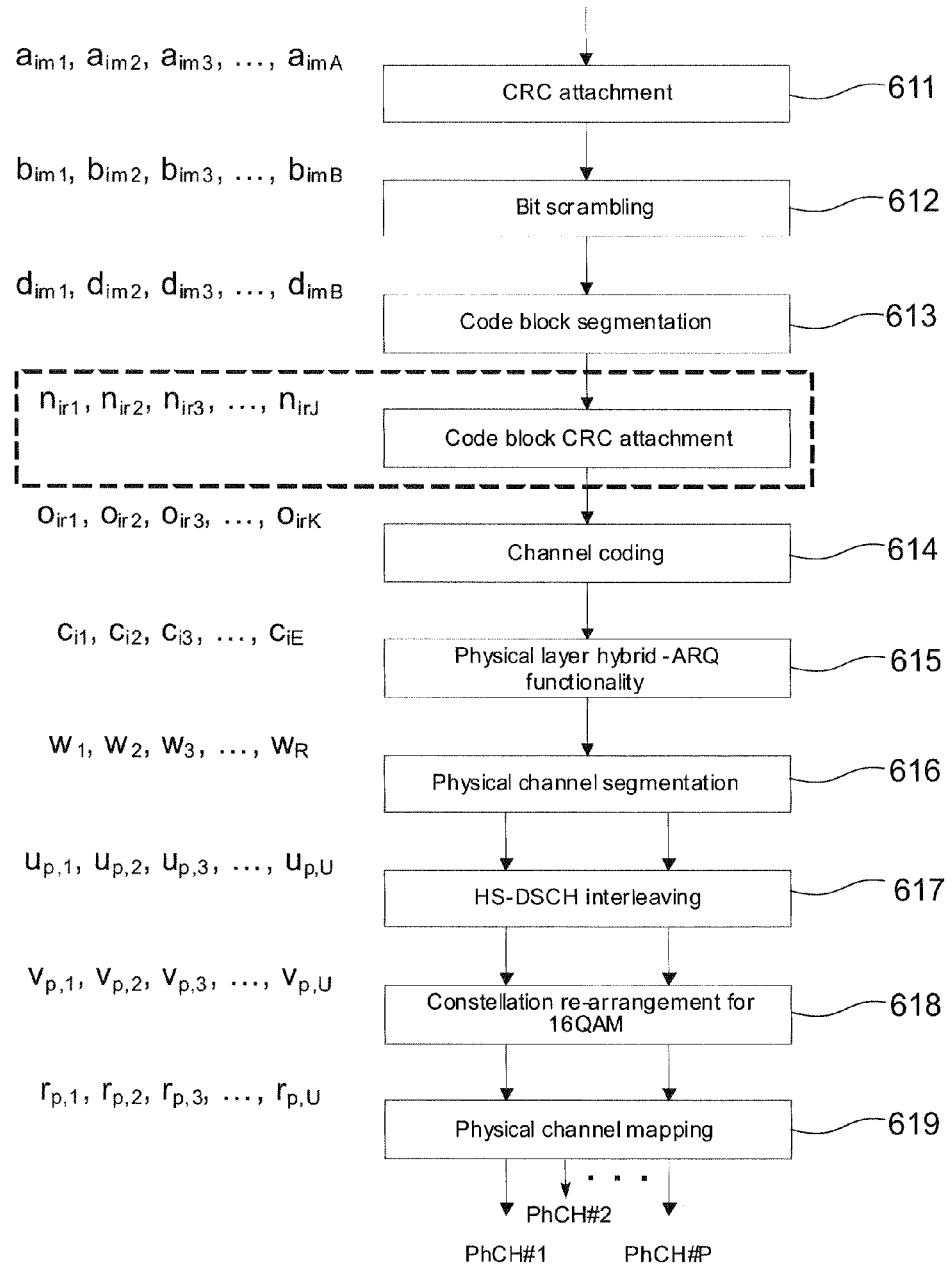
FIG. 13 shows an example of the attachment of code block CRC suitable for the practice of the principles of one embodiment of the present invention.

In one embodiment of the invention, a CRC is added to each code block to enable error detection for each code block. FIG. 13 shows an example of the attachment of code block CRC. Comparing to FIG. 9, after the transport block CRC attachment, the bit scrambling, and the code block segmentation, an additional step of attaching code block CRC to at least one of the code blocks follows immediately after the step of code clock segmentation as shown in FIG. 13. The transport block is segmented into one or multiple code blocks. If there is only one code block in the transport block, the code block CRC may not be necessary. If there is more than one code block in the transport block, the attachment of code block CRC becomes important. As an example, the transport block CRC for HS-DSCH in HSDPA is 24-bit, which provides very low detection error (about $2^{-24} \approx 6 \times 10^{-8}$). One purpose of attaching CRC to each code block is to provide sufficient code block error detection so that the receiver can cancel the signals of those code blocks that are correctly decoded. A CRC detection error of $\sim 10^{-2}$ may be sufficient for this operation. Note that an 8-bit CRC can provide a detection error rate of about 4×10⁻³. In this case, an 8-bit CRC may be used for code block CRC for code block error detection and cancellation, while a 24-bit CRC may be used for transport block error detection. By doing so, the CRC overhead is minimized while providing means to facilitate cancellation of successfully decoded code blocks. Obviously, the CRC overhead can be further reduced by only attaching one code block CRC for multiple code blocks.

In the present invention, a number of steps are provided to be applied in channel interleaver design. Note that not all of these steps need to be incorporated in order to use this invention. In other words, the present invention covers the interleavers and interleaving methods that use at least one of the steps illustrated in this invention. Note that the constellation re-arrangement for 16-QAM as shown in FIG. 13 may not be necessary with the proposed channel interleaver design.

Figure 14:
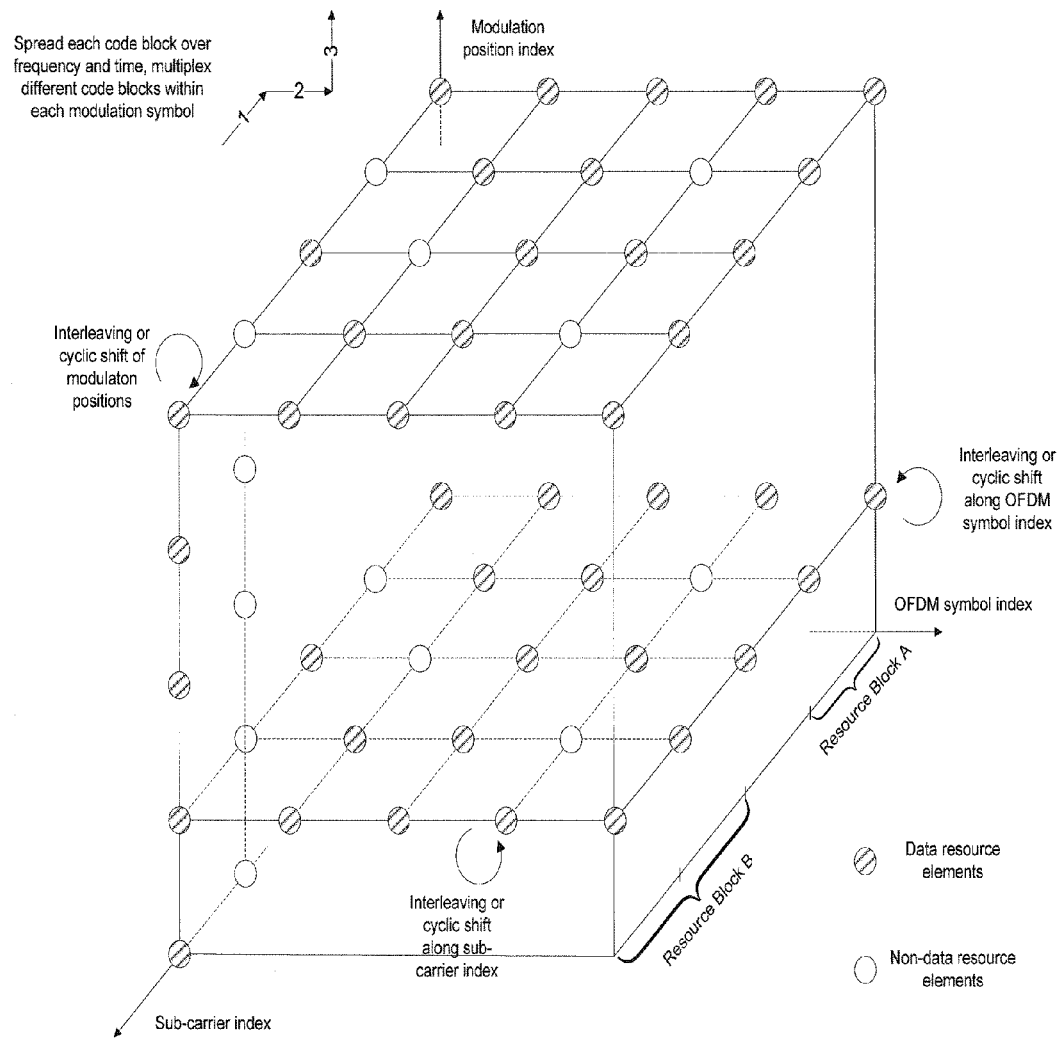
FIG. 14 illustrates channel interleaver for Orthogonal Frequency Division Multiplexing (OFDM) systems suitable for the practice of the principles of another embodiment of the present invention.
Figure 15:
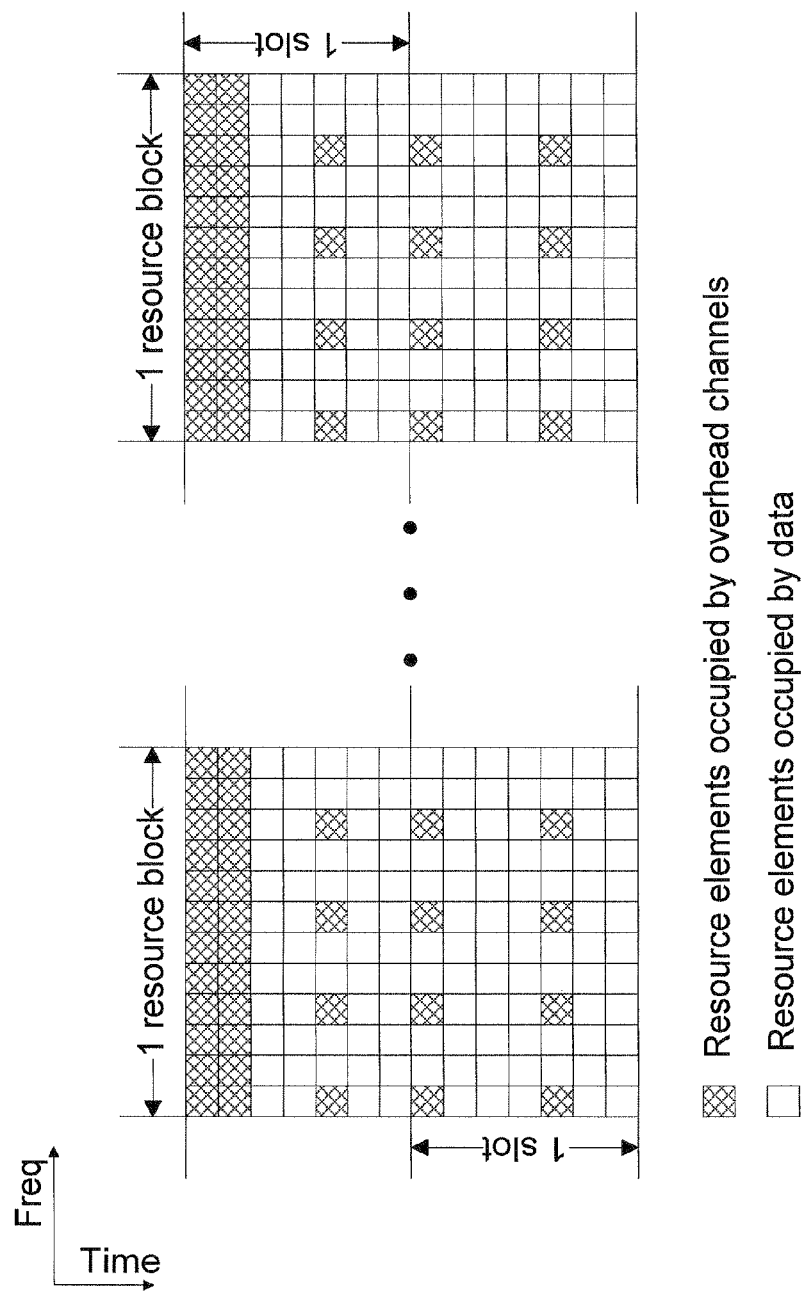
FIG. 15 illustrates a resource element map for a data transmission suitable for the practice of the principles of another embodiment of the present invention.
Figure 16:
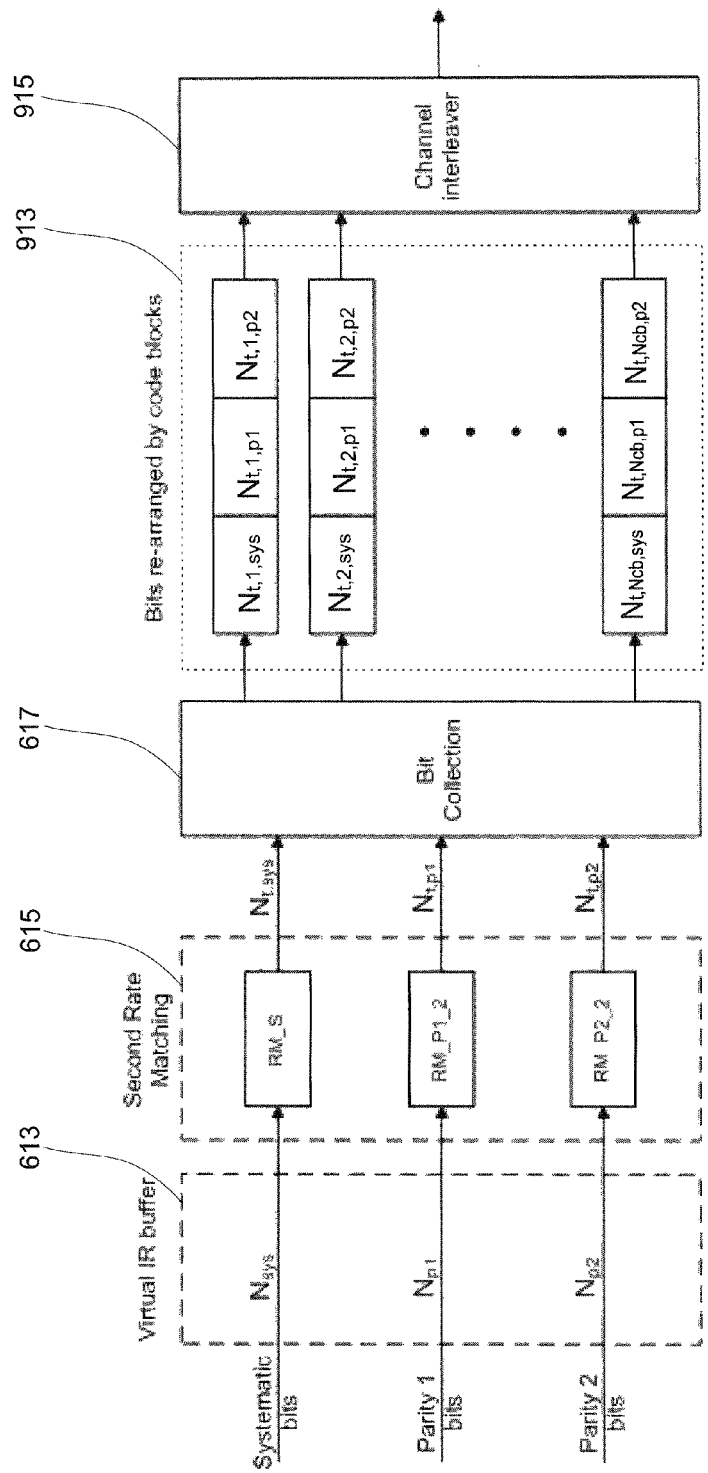
FIG. 16 shows a re-arrangement of coded bits by code blocks after rate matching suitable for the practice of the principles of another embodiment of the present invention.

Turning now to FIG. 14, FIG. 15 and FIG. 16.

FIG. 14 illustrates channel interleaver for Orthogonal Frequency Division Multiplexing (OFDM) systems suitable for the practice of the principles of one embodiment of the present invention. FIG. 15 illustrates a resource element map for a data transmission suitable for the practice of the principles of one embodiment of the present invention. FIG. 16 shows a re-arrangement of coded bits by code blocks after rate matching suitable for the practice of the principles of one embodiment of the present invention. As shown in FIG. 14, the resource allocated to a data transmission is N OFDM symbols in time, and M sub-carriers in frequency. Each sub-carrier of one OFDM symbol is called one resource element. Resource elements include data resource elements and non-data resource elements. Each resource element carries a modulation symbol, which in turn carries multiple coded bits. For example, 2 bits can be carried in one QPSK modulation symbol; 4 bits can be carried in one 16-QAM modulation symbol, etc. The number of bits carried in each modulation symbol is denoted as a modulation order L, each modulation position in a modulation symbol is represented by one modulation position index as shown in FIG. 14. One preferred embodiment of the channel interleaver design consists at least one of the following operations.

Step 1

First, for each code block, symbols S, $P_1$, $P_2$, are, respectively, the systematic bits, parity bits from encoder 1 of a turbo encoder, and parity bits from encoder 2 of the turbo encoder. A turbo encoder is formed by parallel concatenation of two recursive systematic convolutional (RSC) encoders separated by an interleaver. In one embodiment of the present invention, the coded bits after the second rate matching are re-arranged based on code blocks. As illustrated in FIG. 16, there are a number of $N_{cb}$ code blocks in transmission for this transport block. Comparing to FIG. 10, a stage 913 called bits re-arrangement by code blocks immediately follows bit collection stage 617. In stage 913, the systematic bits, parity 1 bits, and parity 2 bits of code block 1 are collected together and arranged in the order of S, $P_1$, $P_2$. The number of systematic bits, parity 1 bits, and parity 2 bits of the i-th code block are denoted by $N_{t,i,sys}$, $N_{t,i,p1}$, $N_{t,i,p2}$, respectively. The re-arranged bits then enter a stage 915, which is called channel interleaver stage. $N_{t,sys}$, $N_{t,p1}$, $N_{t,p2}$ may be presented as following equations respectively.

$$N_{t,sys} = \sum_{i=1}^{Ncb} N_{t,i,sys} \quad (1)$$

$$N_{t,p1} = \sum_{i=1}^{Ncb} N_{t,i,p1} \quad (2)$$

$$N_{t,p2} = \sum_{i=1}^{Ncb} N_{t,i,p2} \quad (3)$$

The re-arranged bits can be used to fill up the time-frequency resources, and the modulation positions in modulation symbols.

Step 2

Secondly, these bits are written into a three-dimensional space as shown in FIG. 14. These bits first fill up the space along the dimension of frequency (i.e. sub-carrier) index. Then they fill up the space along the dimension of time (i.e. OFDM symbol) index. At last they fill up the space along the dimension of modulation position index. Note other ordering of dimensions is certainly possible and covered by the present invention. Each position in the three dimensional space may be represented by a coordinate (b, t, f). If the first bit is placed at (0, 0, 0), then the second bit should be placed at (0, 0, 1), the third bit should be placed at (0, 0, 2), etc. After the frequency dimension is exhausted for a given OFDM symbol index, the OFDM symbol index is increased. For example, the (M−1)-th bit should be placed at (0, 0, M−1), and the M-th bit may be placed at (0, 1, 0). After the frequency and time indices are exhausted, the modulation position index is increased. For example, the (MN−1)-th bit should be placed at (0, N−1, M−1), and the MN-th bit should be placed at (1, 0, 0). Note there might be some resource elements punctured or occupied by other channels and thus are not available to the data channel transmission. In a preferred embodiment of this invention, the time-frequency resources with a resource element map are represented in FIG. 15. The resource elements assigned to a data transmission are grouped together to form a resource element map. The map shows the resource elements available to data transmission and resource elements that are occupied by other channels such as reference signal, downlink control channels, etc. The resource elements occupied by other channels are skipped. Note this resource element map can be reused for each modulation position, as shown in FIG. 15. Eventually, the space that accommodates the coded bits can be described as a cube as shown in FIG. 14, with some resource elements taken by other channels and these taken resource elements are called non-data resource elements.

Step 3

Thirdly, for each modulation position index and each OFDM symbol, the data bits are interleaved along the frequency dimension. For example, a bit-reverse-order (BRO) interleaver or a pruned bit-reverse-order interleaver may be used. Or any other interleaver may be used for this purpose. Sometimes, one or multiple of simplified shuffling patterns may be used. For example, cyclic shifts, or predetermined interleaving/re-arrangement/shuffling/swapping patterns may be used. These patterns may or may not change for each OFDM symbol and/or each modulation position index. Sometimes the number of resource elements available in each OFDM symbol may be different due to different amount of puncturing or usage by other channels in these OFDM symbols. In that case, interleaver with different sizes may be used on different OFDM symbols.

Step 4

Fourth, for each modulation position index and each sub-carrier, the data bits are interleaved along the time dimension. For example, a bit-reverse-order (BRO) interleaver or a pruned bit-reverse-order interleaver may be used. Or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each modulation position and/or sub-carrier index. Sometimes, the number of resource elements available on each sub-carrier index may be different due to different amount of puncturing or usage by other channels on this sub-carrier. In that case, interleaver with different sizes may be used on different sub-carriers.

Step 5

Fifth, for each sub-carrier and each OFDM symbol, the data bits are interleaved along the dimension of modulation position index. For example, a bit-reverse-order (BRO) interleaver or a pruned bit-reverse-order interleaver may be used. Or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each sub-carrier and/or each OFDM symbol. Preferred patterns will be explained later in the present invention.

One preferred embodiment of the channel interleaver design consists at least one of the above-stated five steps.

Figure 19:
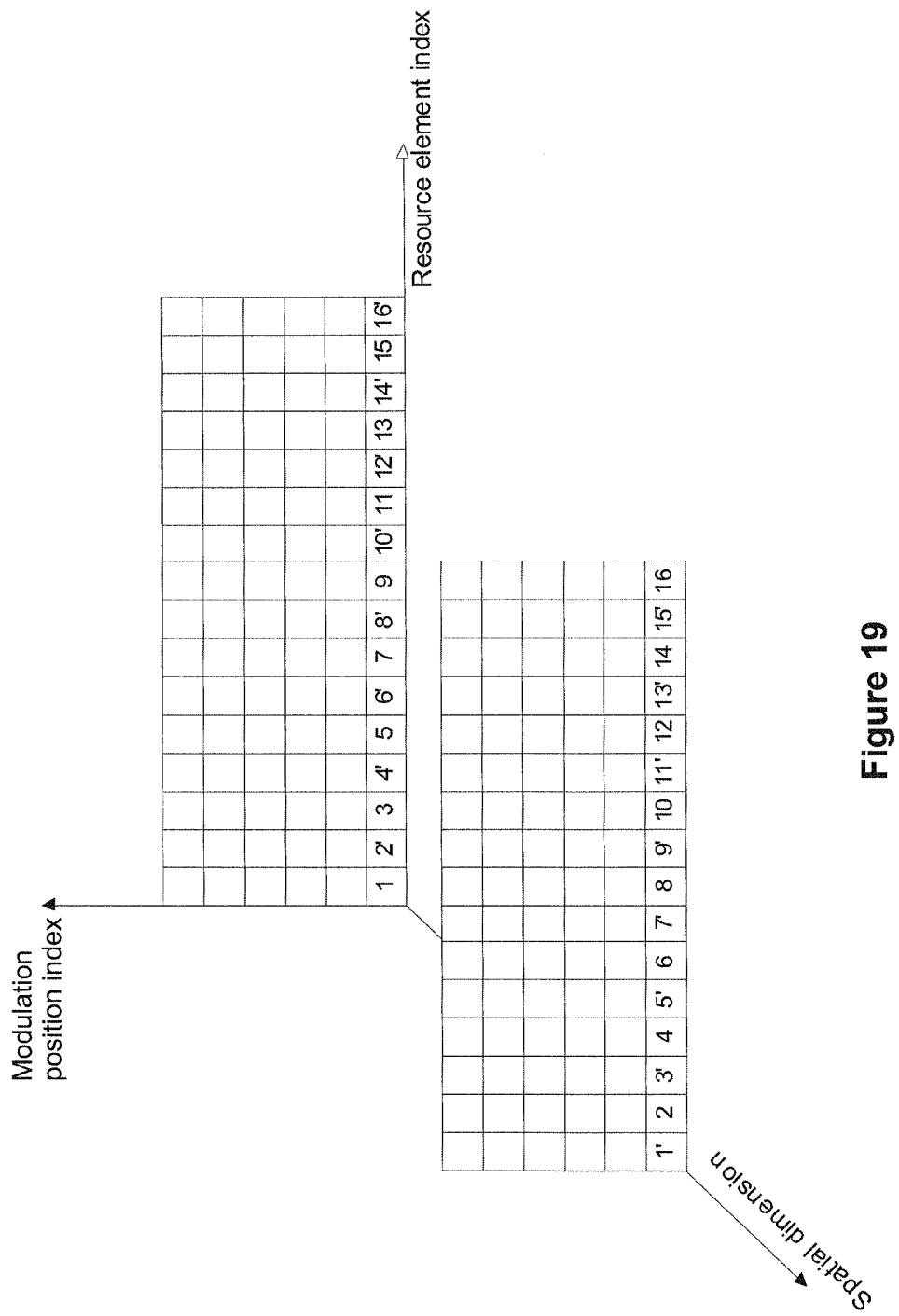
FIG. 19 shows an example of spreading the coded bits of a code block over time, frequency, and spatial domains suitable for the practice of the principles of another embodiment of the present invention.

In the following description, embodiments and variations to the aforementioned steps are disclosed. Note these embodiments only describe one or multiple intermediate steps of the whole interleaving process. Particularly, pictorial illustrations used only show the effect of one or multiple intermediate steps and may not reflect the final outcome of the interleaving process. For example, FIG. 19 shows the coded bits of a code block are spread over time, frequency, and spatial domain. The coded bits of the code block, however, are all in the first modulation position of all the modulation symbols. Subsequent interleaving steps will interleave these coded bits in time, frequency, and spatial dimension, and will shift the modulation positions of these coded bits in modulation symbols.

Steps 1 and 2 attempt to spread the coded bits of each code block in frequency and time domains as much as possible to maximize frequency and time diversity. For long term evolution (LTE) systems, frequency diversity is normally more pronounced than time diversity within one transmission. Therefore, it is preferable to first increase the frequency sub-carrier index and then increase the OFDM symbol index. Different ordering of increasing the indices of different dimensions is certainly covered by the present invention. Normally forward error correction codes, especially when implemented with practical decoders, handle separated or random errors better than burst or contiguous errors. Step 3 transfers burst errors in frequency domain into separated errors. Step 4 transfers burst errors in time domain into separated errors. For higher order modulation, each modulation position within a modulation symbol may enjoy different protection. Step 5 attempts to randomize or uniformly distribute the bits of each code block into different modulation positions of modulation symbols so that on average coded bits of each code block enjoys the same level of protection. The order of Step 3, Step 4, and Step 5 may be changed without escaping the idea of the present invention. Certain steps may also be combined into a single step. For example, Step 2 and Step 5 may be easily combined by jumping to a different modulation position as frequency and time indices change.

There are many alternative implementations to Steps 2, 3, and 4 that achieve similar effects in spreading the coded bits of each code blocks into time-frequency domain. In one embodiment of the invention, some other two-dimension matrices may be used to represent the time-frequency resources instead of the resource element map. For example, a two-dimension matrix with the number of rows equal to the number of resource blocks and the number of columns equal to the number of resource elements available for data in each resource block can be used. Suppose the data transmission is assigned as a number of $N_{block}$ resource blocks, and there are a number of $N_{DataRE}$ bits available for data transmission in each resource block, then the coded bits may be placed into the $L \times N_{block} \times N_{DataRE}$ space. Preferably, the block index increases first, then the resource element index, then the modulation position index. By doing so, the adjacent coded bits are separated into different resource blocks which are likely to experience different channel conditions. The same operation may also be described as a row-column interleaving/permutation with a size of $N_{block} \times N_{DataRE}$ applied on each modulation position, or as a row-column interleaving/permutation with the size of $N_{block} \times N_{DataRE}$ applied on modulation symbols. On each modulation position, the coded bits are written into a matrix $N_{block} \times N_{DataRE}$ with the block index increases first. Interleaving along the block index or the data resource element (RE) index can certainly be performed, if desired. The purpose of interleaving along the block index is to randomize the location of coded bits into blocks that are far apart. The purpose of interleaving along the data RE index is to randomize the location of coded bits within a resource block. At last, when these bits are mapped to time-frequency resources, they are read out and placed on time-frequency resources with the resource element index increases first to achieve the effect of row-column interleaving. Again, note this operation can be applied on the whole modulation symbols instead of being applied on each modulation position.

Figure 17A:
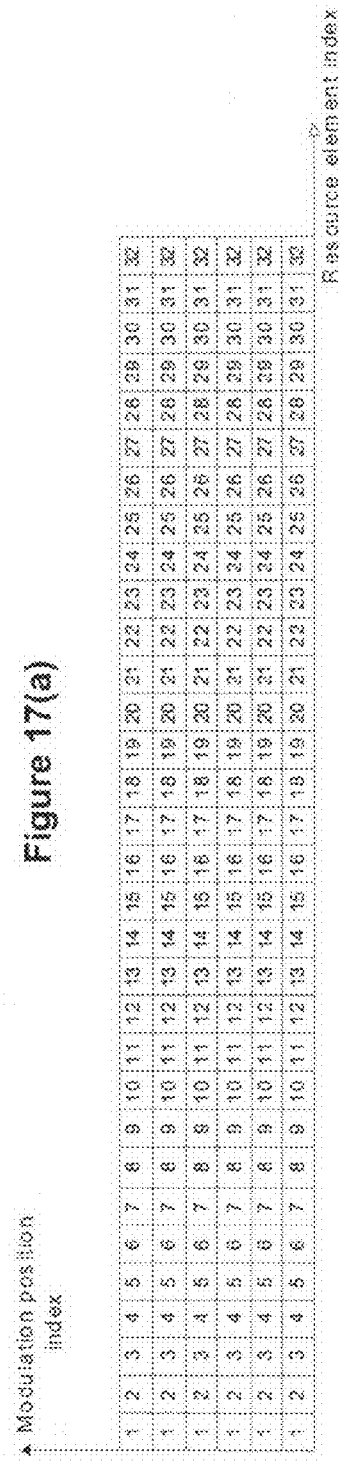
FIG. 17 (a) shows the resources elements represented in one dimension suitable for the practice of the principles of another embodiment of the present invention.
Figure 17B:
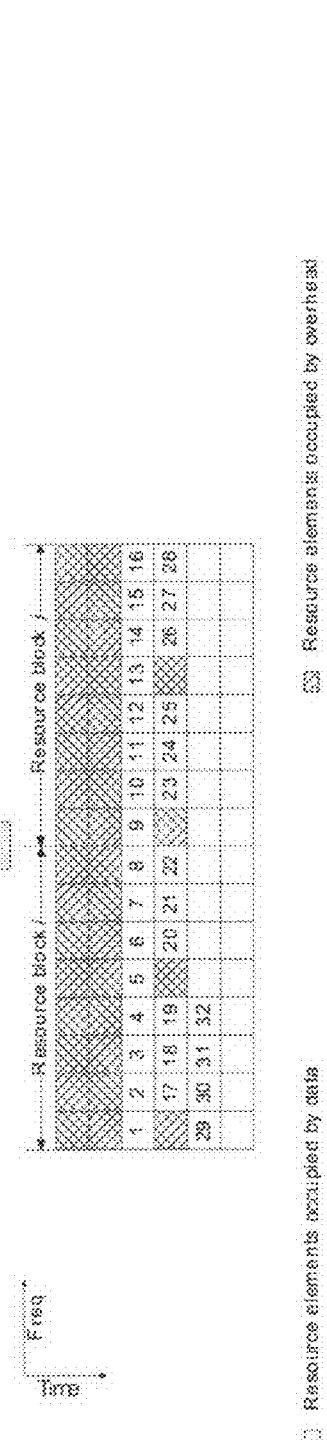

Alternatively, to ease the implementation of Step 2, 3, and 4, one dimension may be employed to represent the time-frequency resources. The resource elements are indexed on the resource element map. The assignment of indices to resource elements may be arbitrary. For example, starting from the one with the lowest OFDM symbol index and the lowest sub-carrier index, the resource elements may be exhausted by first increasing the sub-carrier index and then increasing the OFDM symbol index. Alternatively, the resource elements may be exhausted by first increasing the OFDM symbol index and then increasing the sub-carrier index. One example is shown in FIG. 17 (a) and FIG. 17 (b). FIG. 17 (b) shows a time (OFDM symbol index)-frequency (sub-carrier index) space for accommodating data coded bits, this time-frequency space is shown as one dimension in FIG. 17 (a), and this dimension grows along modulation position index direction and becomes a two-dimensional matrix as shown in FIG. 17 (a). The resources elements occupied by data as shown in FIG. 17 (b), i.e., resources elements 1-32 are expended in the modulation position index and becomes ha two-dimensional matrix as shown in FIG. 17 (a). After the time-frequency space as shown in FIG. 17 (b) is filled up by the coded bits of multiple resource blocks i, j, interleave may be done along the resource element dimension to spread adjacent coded bits in the time-frequency resources. Bit-reverse-order, or pruned bit-reversal-order, or any other type of interleaver may be used.

Figure 18:
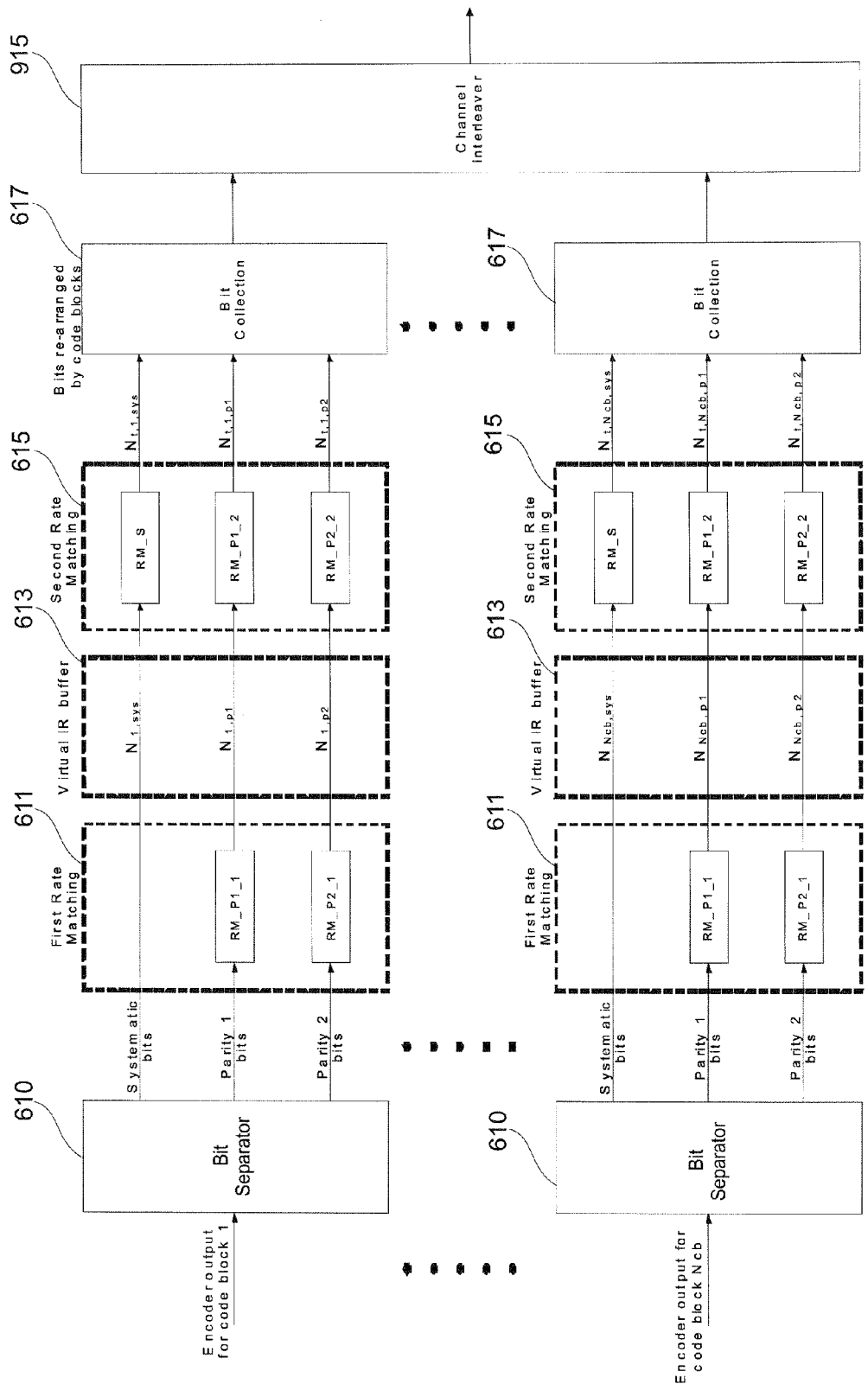
FIG. 18 shows an implementation of rate matching and bit collection on a code block basis suitable for the practice of the principles of another embodiment of the present invention.

Alternatively, the implementation of Step 1, 2, 3, and 4 may be more integrated with the encoding processes ahead of these steps. For example, the HSDPA system assumes the systematic bits of all code blocks are placed together followed by the parity 1 bits of all coded blocks and then followed by the parity 2 bits of all coded blocks. To group the systematic bits, parity 1 bits, and parity 2 bits of at least one code block after rate matching, this can also be achieved by performing the entire rate matching process separately for the code blocks. FIG. 18 shows an implementation of rate matching and bit collection on a code block basis. Each code block, i.e., code block 1, code block 2, . . . , code block Ncb, is processed by bit separator 610, first rate matching stage 611, virtual IR buffer 613, second rate matching stage 615 and bit collection stage 617 in a sequence. All of the re-arranged bits then enter a stage 915, which is called channel interleaver stage. For each code block, the processes are similar to the processes taught in the descriptions of FIG. 10. Therefore, detailed explanation is omitted here. In this implementation, the encoder output of at least one code block are passed through first rate matching stage 611, virtual IR buffer 613, and second rate matching stage 615 separately. So, the output of the second rate matching will naturally have the systematic bits, parity 1 bits, and parity 2 bits of the code block grouped together. Although the actual rate matching processes for multiple code blocks is done separately, the parameter and configuration of these rate matching processes for multiple code blocks may need coordination. Certainly, this invention covers other variants of the implementation with some steps in the rate matching process simplified, modified, or skipped, as long as the rate matching process is done on code block basis. For example, the first rate matching stage 611, virtual IR buffer 613, and second rate matching process 615 may be simplified and combined into one step which simply selects the appropriate coded bits for each transmission. For example, bit separation stage 610 and bit collection stage 617 may not be necessary if the encoder output is already grouped in to systematic bits, parity 1 bits, and parity 2 bits.

For a suboptimal though simpler implementation, Step 1 may be skipped. In this case, the systematic bits, parity 1 bits, and parity 2 bits of each code block are not grouped together. With the efforts in the rest of the interleaving steps, the coded bits of each code block are still sufficiently spread and good performance may be achieved.

The aforementioned embodiments of channel interleaver design may be easily extended to the case of MIMO transmissions. Suppose multiple layers are allocated to a MIMO codeword. This scenario may apply to long term evolution (LTE) systems, e.g., when the SU-MIMO transmission has rank greater than 1. In this case, a spatial dimension is added in the channel interleaver design. The space for the coded bits may be described as a four-dimensional space in time, frequency, space and modulation positions. To illustrate the idea in a three-dimensional space, which allows us a pictorial presentation, the time-frequency dimension is simplified into one dimension of resource elements as shown in FIG. 17. Therefore, the space for coded bits may be represented as a three-dimensional space in resource elements, space, and modulation positions, as shown in FIG. 19. FIG. 19 illustrates spreading coded bits of each code clock over time, frequency and spatial domain. The interleaver will allocate coded bits of each code block along the space dimension first, then along the resource element dimension to make sure the code block collects maximal diversity in time, frequency, and space. Resource element index refers resource elements dimension, spatial dimension refers to space dimension, and modulation position index refers to modulation positions dimension. If multiple code blocks are transmitted, the code blocks within each of the codeword should be spread over time, frequency, and spatial domain. In FIG. 19, coded bits 1, 2, 3, . . . , 16 belong to one code block while coded bits 1', 2', 3', . . . , 16' belong to another code block.

In another embodiment of the invention, the aforementioned embodiments are extended to MIMO transmissions with different spatial dimensions on different resource elements.

Figure 20:
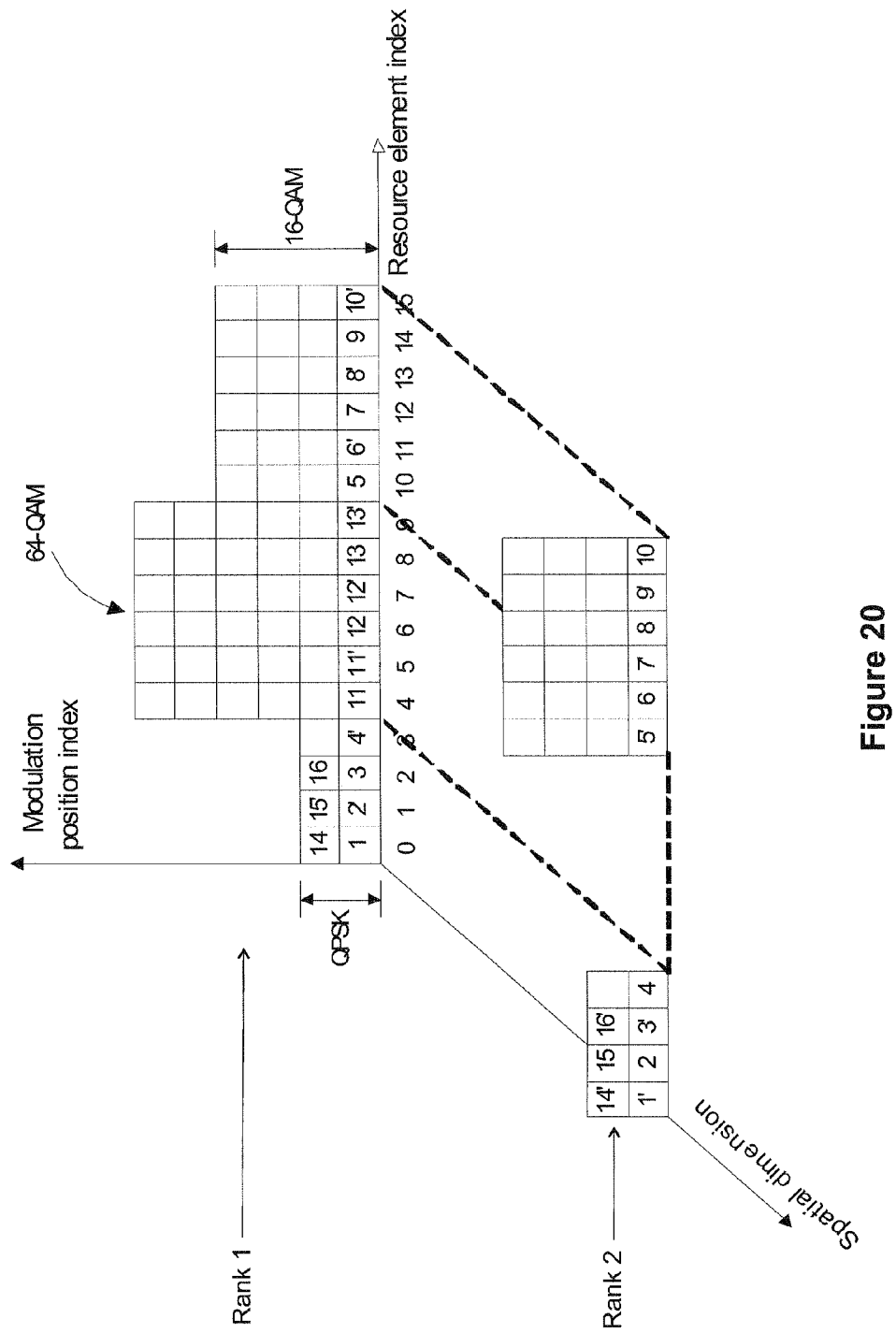
FIG. 20 shows an example of writing coded bits into resources with different layers and different modulation orders suitable for the practice of the principles of another embodiment of the present invention.

In a MIMO system, the rank (number of spatial dimensions, or layers) may be different on different frequency resource elements. The aforementioned embodiments may also be extended to transmissions with different modulation order on different resources. For example, if two resource blocks have very different CQI, the transmitter may use different modulation orders on these two resource blocks. In this case, the design goal of spreading coded bits of each code block as much as possible over time, frequency, spatial, and modulation positions still applies. Special handling needs to be implemented to handle the case of different spatial dimensions or different modulation orders on different time-frequency resources. For example, similar to the resource element map, a map can be constructed to include spatial and modulation position dimension. The layers or the modulation positions that are not available will be skipped. FIG. 20 shows an example of writing coded bits into resources with different layers and different modulation orders. In FIG. 20, different modulation orders such as QPSK, 16-QAM and 64-QAM are shown, and rank 2 on resource element index 0,1,2,3,10,11, 12,13,14, and 15 and rank 1 on resource element index 4,5, 6,7,8 and 9. In this example, the two code blocks still try to spread over spatial dimensions first, when the spatial dimension is collapsed to 1, as in resource elements 4, 5, 6, 7, 8, 9, the two code blocks will both be placed in the same layer at the spatial dimension. Each code block, however, will still be spread in time and frequency dimension (Not shown in FIG. 20 because time and frequency dimensions are shown as one dimension of resource elements). After all coded bits are mapped into resource elements, other interleaving processing such as row-column interleaving, interleaving of modulation positions, can be performed to further randomize the location of coded bits.

Figure 21:
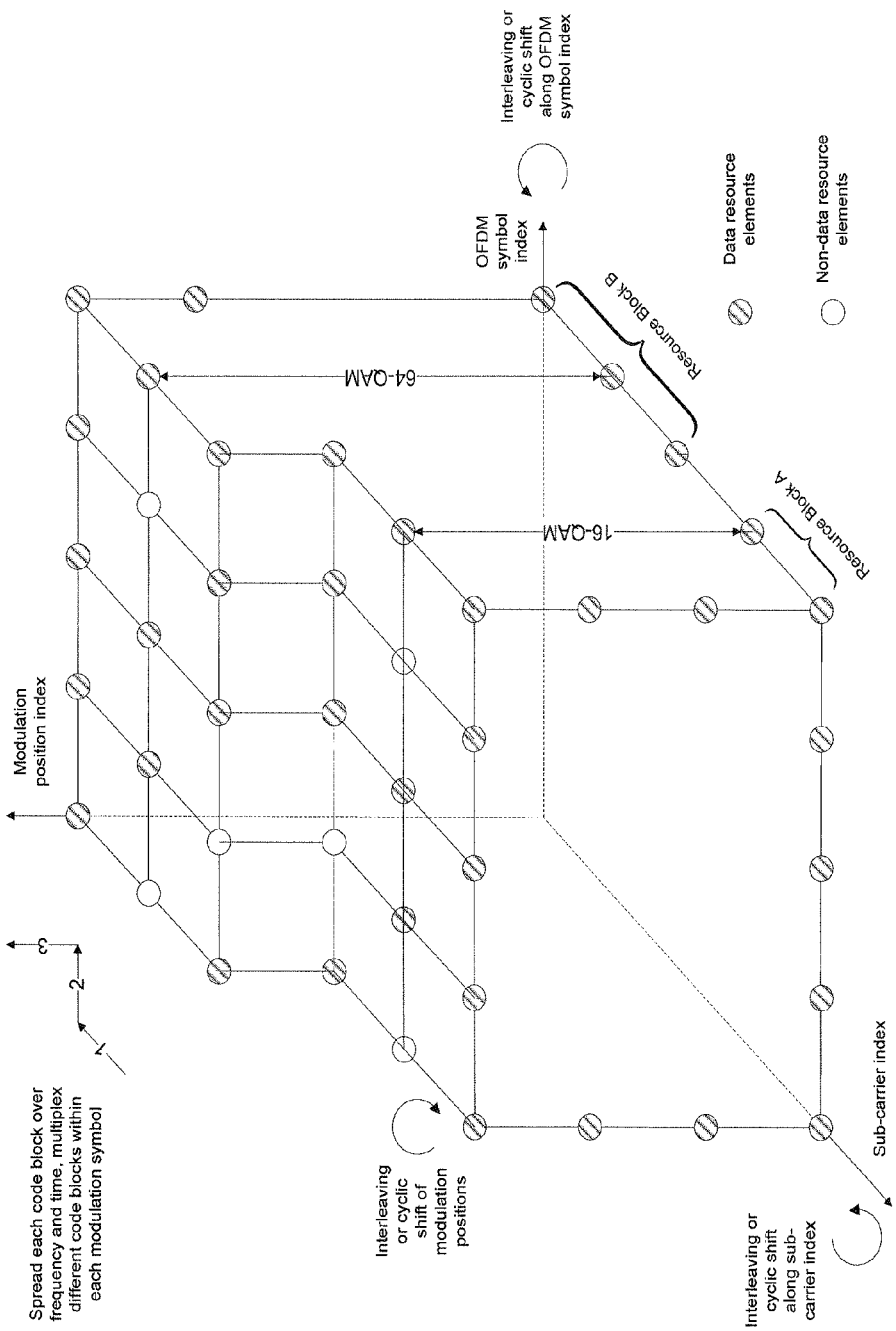
FIG. 21 illustrates channel interleaver with different modulation order on resources suitable for the practice of the principles of another embodiment of the present invention.

A pictorial illustration of channel interleaver when different modulation orders are used on different resources is also shown in FIG. 21. FIG. 21 illustrates channel interleaver with different modulation order on resources. In this case, resource block A uses 16-QAM while resource block B uses 64-QAM. The coded bits fill up the space defined by time, frequency, and available modulation positions on each resource elements, skipping resource elements occupied by other channels. In summary, the aforementioned interleaving steps and embodiments apply in this case.

Figure 22:
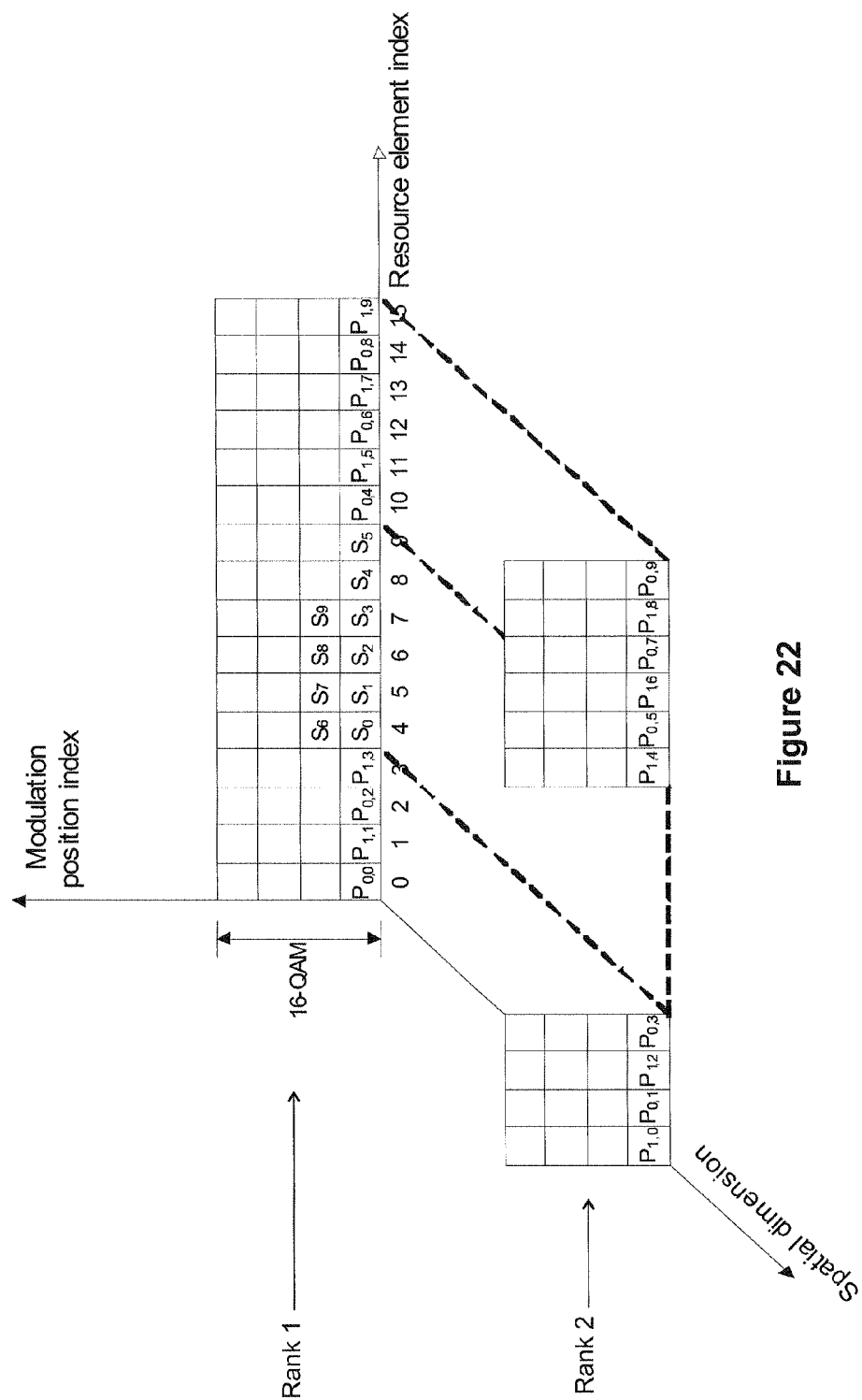
FIG. 22 shows an example of spread coded bits on resources with different spatial dimensions suitable for the practice of the principles of another embodiment of the present invention.

In another embodiment of the invention, systematic bits priority is given in mapping coded bits, and modulation symbols formed by these coded bits, onto resource elements and spatial dimensions. FIG. 22 shows an example of spread coded bits on resources with different spatial dimensions. For example, as shown in FIG. 22, the rank (number of spatial dimensions, or layers) is 2 on resource element 0, 1, 2, 3, 10, 11, 12, 13, 14, 15; and the rank is 1 on resource element 4, 5, 6, 7, 8, 9. In this example, the same modulation order is applied to all the resources and all the layers, and the modulation order is 16-QAM. Due to the interference between MIMO layers, the CQI (channel quality indicator) on resource element 4, 5, 6, 7, 8, 9 is often higher than the CQI per layer on resource elements 0, 1, 2, 3, 10, 11, 12, 13, 14, 15. In this case, the systematic bits are given more protection by being given priority to be placed on those resource elements with smaller number of layers. On the other hand, parity bits are given priority to be placed on those resource elements with bigger number of layers. In the example shown in FIG. 22, all systematic bits, i.e., $S_0, S_1, S_2, S_3, S_4, S_6, S_7, S_8, S_9$, are placed on resource elements index 4, 5, 6, 7, 8, 9, while all parity bits, i.e., $P_{0,0}, P_{1,1}, P_{0,2}, P_{1,3}, P_{1,0}, P_{0,1}, P_{1,2}, P_{0,3}, P_{0,4}, P_{1,5}, P_{0,6}, P_{1,7}, P_{0,8}, P_{1,9}, P_{1,4}, P_{0,5}, P_{1,6}, P_{0,7}, P_{1,8}, P_{0,9}$, are placed on resource elements 0, 1, 2, 3, 10, 11, 12, 13, 14, 15.

The prioritization of systematic bit may also be implemented by defining multiple regions along the dimension of modulation positions. For example, for the 64-QAM constellation as defined in Table 2 and FIG. 12, two regions are defined, i.e., a first region which contains b0, b1, b2, b3 for systematic bits and a second region which contains b4, b5 for parity bits. Systematic bits are prioritized in the first region while parity bits are prioritized in the second region. The first region may contain some parity bits in certain cases, e.g., there are not enough systematic bits to fill up the first region. Similarly, the second region may contain some systematic bits in certain cases, e.g., there are not enough parity bits to fill up the second region. All the aforementioned embodiments, interleaving steps may be performed separately in these two regions. Because the modulation positions are divided into two regions, the interleaving/permutation along modulation positions needs to be done separately for these two regions. In other words, the region {b0, b1, b2, b3} is permuted as if it is a 16-QAM modulation while {b4, b5} is permuted as if it is a QPSK modulation. Again, there may still be variations of this idea. For example, instead of defining two regions, two starting points and directions may be defined separately for systematic bits and parity bits. Systematic bits start at the modulation positions with the strongest protection and move towards modulation positions with weaker protection while parity bits start at the modulation positions with the weakest protection and move towards modulation positions with stronger protection.

In another embodiment of the present invention, the coded bits of each code block are allocated as uniformly as possible on different modulation positions. There are various ways to achieve this goal. One approach is to enumerate all of the permutation patterns of the modulation positions. The permutation patterns for the modulation positions of QPSK and 16-QAM are shown in Table 3. By assigning different permutation patterns to different modulation symbols, the modulation positions of the coded bits are changed in a code block. By doing so, the coded bits of each code block are roughly uniformly distributed among all modulation positions. So no code block is particularly favored or disadvantaged. Another benefit of interleaving or permutation along the modulation positions is to alleviate the problem caused by I-Q imbalance. If the SNR on I-branch and Q-branch is different, interleaving or permutation can ensure the coded bits of each code block spread across both I and Q branches.

TABLE 3

| Modulation | Modulation position permutation |
|---|---|
| QPSK | 01, 10 |
| 16-QAM | 0123, 0132, 0213, 0231, 0312, 0321, 1023, 1032, 1230, 1203, 1302, 1320, 2013, 2031, 2103, 2130, 2301, 2310, 3012, 3021, 3102, 3120, 3201, 3210 |

Obviously, a subset of the permutation patterns may be selected. For example, one seed permutation pattern with its cyclic shifted versions may be used as one subset of patterns. A few examples for QPSK, 16-QAM, and 64-QAM are shown in Table 4. In Table 4, the natural ordering patterns are used as the seed pattern. The subset of permutation patterns are generated by cyclic shifts of the seed pattern. These permutation patterns may be applied to modulation symbols on different resource elements. These subsets of patterns may change every resource elements, or every a few resource elements. By doing so, the coded bits of each code block will be shifted to different modulation positions in different modulation symbols. Therefore, each code block will get roughly equal protection from modulation. This technique may also be applied in retransmissions in HARQ. One example of application is to change the permutation patterns of the same modulation symbols across transmissions. This may be achieved by using different cyclic shifts of the same seed permutation pattern, or using different seed permutation patterns in retransmissions.

TABLE 4

| Modulation | Seed permutation pattern | Cyclic shifts of seed permutation patterns |
|---|---|---|
| QPSK | 01 | 01, 10 |
| 16-QAM | 0123 | 0123, 1230, 2301, 3012 |
| 64-QAM | 012345 | 012345, 123450, 234501, 345012, 450123 501234 |

Certainly, the selection of a subset of permutation patterns may be various and depends on other design objectives. For example, not all cyclic shifts are needed in the selected subset. Cyclic shifts from multiple seed permutation patterns may be selected. In one preferable embodiment of the invention, the preferred seed for QPSK, 16-QAM (as shown in FIG. 11), 64-QAM (as shown in FIG. 12) are listed in Table 5. Because of the relatively higher order modulation, the protection level on some positions is equal, while the protection level on some other positions is different. For the constellation of 16-QAM as shown in FIG. 11 and the constellation of 64-QAM as shown in FIG. 12, b0 and b1 receives the strongest protection, b2 and b3 receive less protection, while b4 and b5 (in the case of 64-QAM) receive the least amount of protection. According to Table 5, 0213 and its cyclic shifted versions are used for 16-QAM, while 042153 and its cyclic shifted versions are used for 64-QAM. Another preferred seed permutation for 16-QAM is 0312 (not shown in Table 5). Other preferred seed permutations for 64-QAM are 024135, 052143, 043152, 053142, 025134, 034125, 035124 (not shown in Table 5). The preferred seed permutation pattern may change as the constellation design of 16-QAM or 64-QAM changes.

TABLE 5

| Modulation | Preferred Seed permutation pattern | Cyclic shifts of seed permutation patterns |
|---|---|---|
| QPSK | 01 | 01, 10 |
| 16-QAM | 0213 | 0213, 2130, 1302, 3021 |
| 64-QAM | 042153 | 042153, 421530, 215304, 153042, 530421, 304215 |

Figure 23:
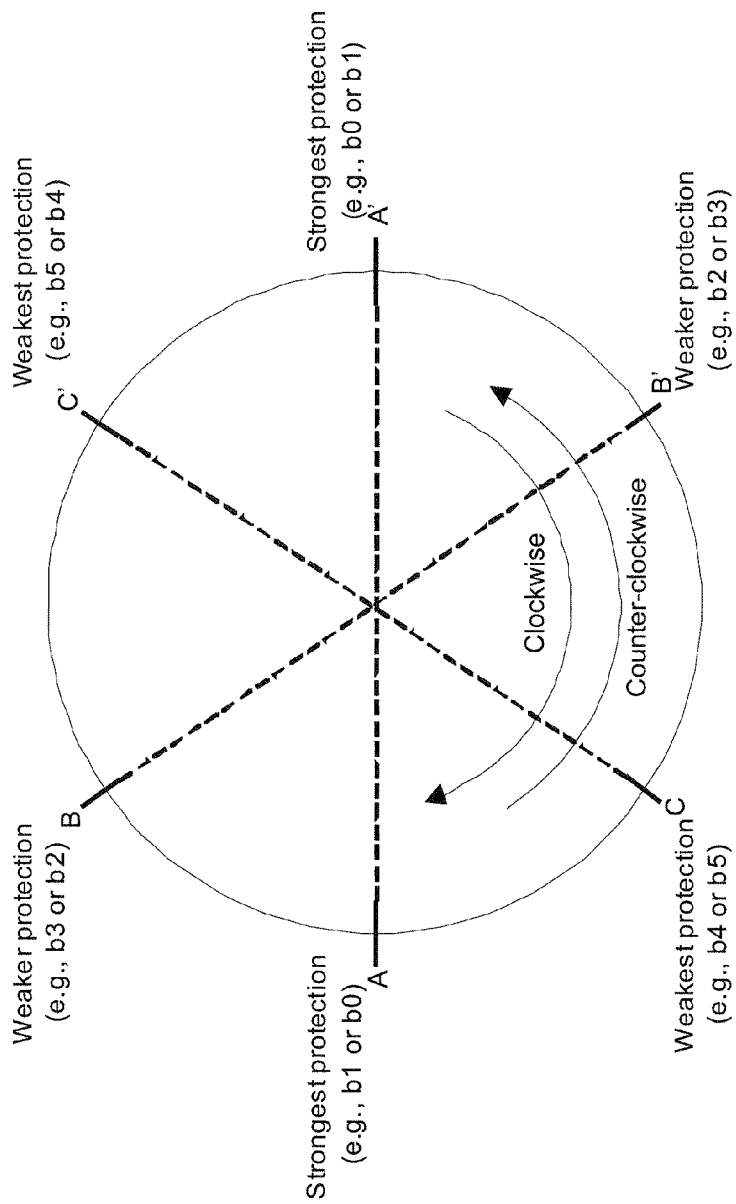
FIG. 23 shows a general method of obtaining the preferred permutation pattern for 64-QAM suitable for the practice of the principles of another embodiment of the present invention.

FIG. 23 shows a general method of obtaining the preferred permutation pattern for 64-QAM. The modulation positions are placed with the same level of protection at two ends of a diameter of a circle, and the modulation positions are placed with different level of protection at different angle along the circle. For example, the modulation positions of b0 and b1 are placed with the strongest protection at two ends of diameter A-A' of the circle as shown in FIG. 23, the modulation positions of b2 and b3 are placed with the weaker protection at two ends of diameter B-B' of the circle, and the modulation positions of b4 and b5 are placed with the weakest protection at two ends of diameter C-C' of the circle. Different preferred seed permutation patterns, and their cyclic shifts, may be obtained by reading the positions along the circle, starting from any position and by going either clockwise or counter-clockwise. In this way, maximum separation of the modulation positions with the same level of protection is achieved. This method is also applicable to other modulation orders. As shown in Table 5, a preferred seed for 64-QAM is 042153. According to FIG. 23, when starting from point A' and counting in counter-clockwise along the periphery of the circle, b0b4b2b1b5b3 is achieved. Therefore, a preferred seed for 64-QAM is 046153. By the same method, all of the preferred permutation pattern maybe achieved for 64-QAM. Although the seed permutation patterns are generated in this way, and their cyclic shifts, are preferable, this invention certainly covers the application of the modulation position interleaving, permutation, shuffling, swapping, re-arranging on resource elements and/or across retransmissions with any pattern or in any fashion.

Figure 24:
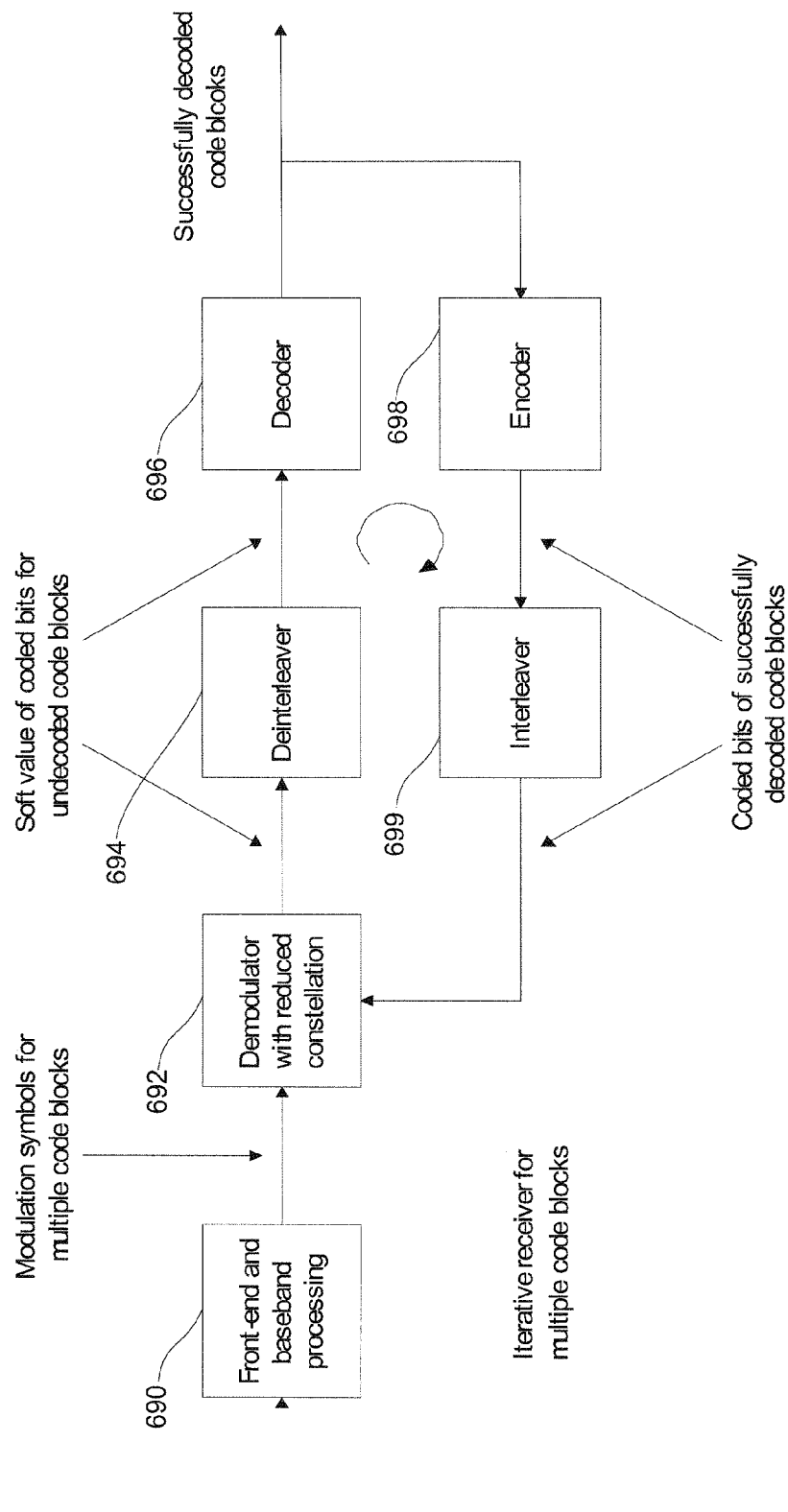
FIG. 24 illustrates an iterative receiver for decoding multiple code blocks multiplexed within same modulation symbols suitable for the practice of the principles of another embodiment of the present invention.

In another embodiment of this invention, an iterative operation is proposed for receiving the multiple code blocks that are multiplexed together within modulation symbols. With the aforementioned channel interleaver design, the coded bits of different code blocks are multiplexed in the same modulation symbol. FIG. 24 illustrates an iterative receiver for decoding multiple code blocks multiplexed within same modulation symbols. Here, an iterative operation is proposed to improve the receiver performance. An illustration of this operation is shown in FIG. 24. After processed by receiver front end and some baseband processing stage 690, e.g., FFT, channel estimation, equalization etc., soft values of coded bits are obtained by demodulating the modulation symbol by demodulator 692. These soft values are then deinterleaved by deinterleaver 694 and are fed into decoder 696. There are multiple code blocks. Decoder 696 attempts to decode one, or multiple, or all of the code blocks. Parallel processing is also possible in the decoding operation. After the decoding operation, some code blocks may be successfully decoded while some others are not. In this case, the code blocks of those decoded code blocks are reconstructed. Because the coded bits of these blocks are multiplexed in the same modulation symbols with the coded bits of those code blocks that are unsuccessful, the information of these coded bits are used to help the detection of the coded blocks that are yet unsuccessful. Code clocks successfully decoded are feedback to an encoder 698 and then fed to an interleaver 699. Therefore, the information of these successfully decoded code blocks are used to help the detection of the coded blocks that are yet unsuccessful.

Figure 25:
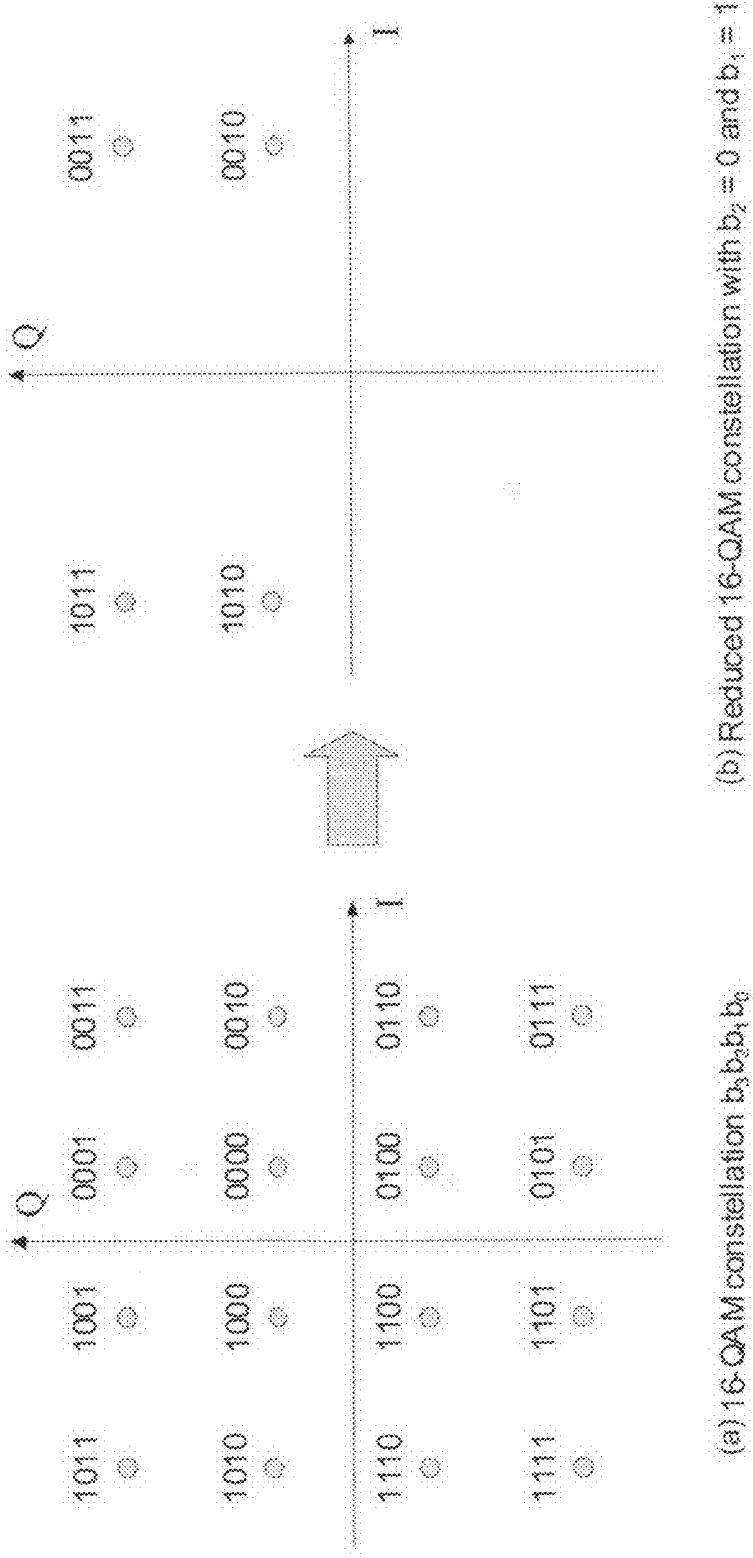
FIG. 25 shows an example of a reduced constellation which improves the detection performance of the transmission suitable for the practice of the principles of another embodiment of the present invention.

FIG. 25 shows an example of a reduced constellation which improves the detection performance of the transmission. For example, a 16-QAM constellation b3b2b1b0 is shown in sub-figure (a) of FIG. 24. b3 is supposed to belong to code block 1, b2 and b1 are supposed belong to code block 2, and b0 is supposed belong to code block 3. If code block 2 is successfully decoded, the knowledge of the value of b2 and b1 is obtained. If b2=0 and b1=1, then the constellation is reduced as shown in FIG. 25. In this case, the demodulation of b3 and b0 based on the reduced constellation may have an improved performance.

Figure 26:
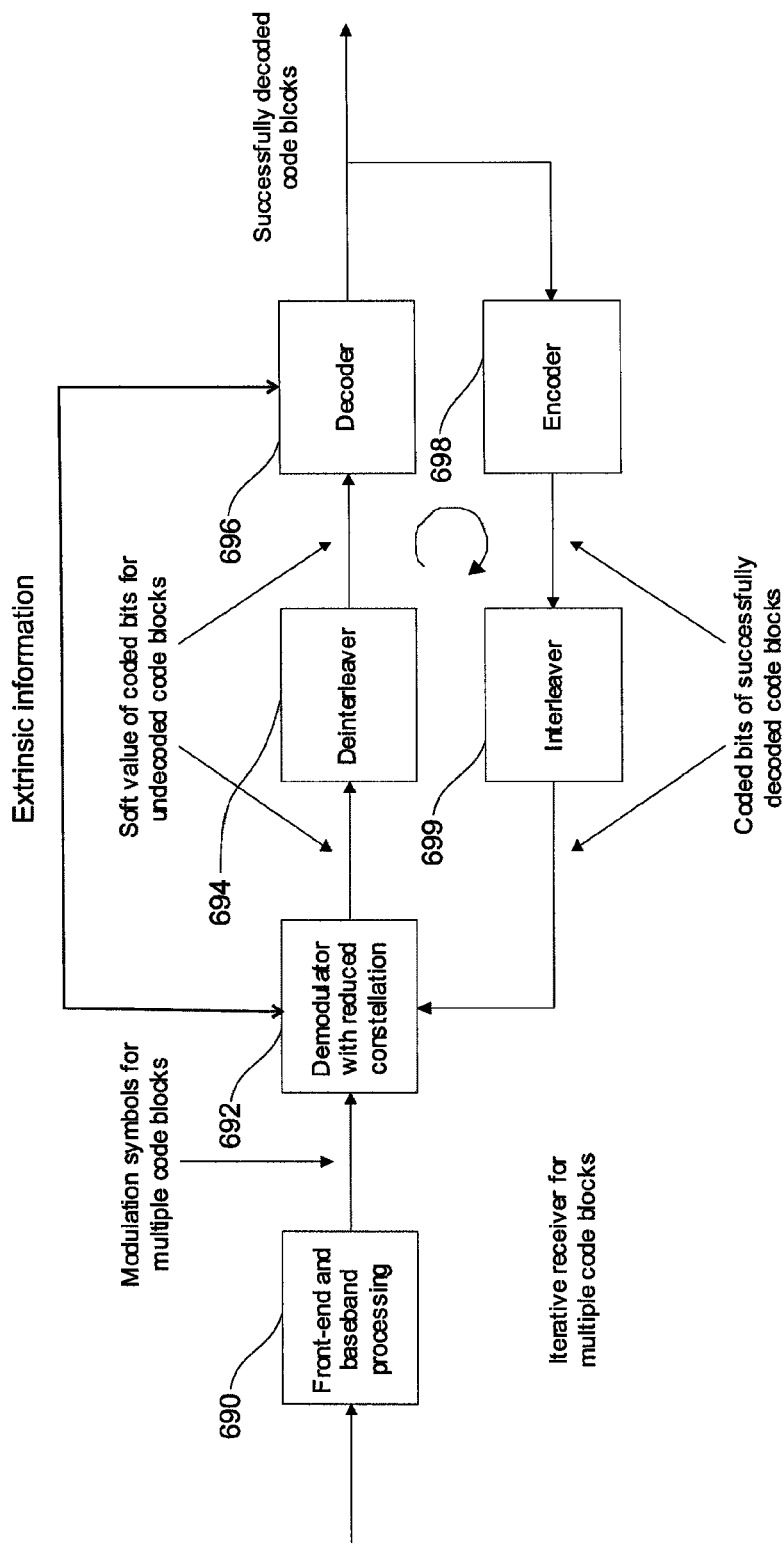
FIG. 26 illustrates an alternative iterative receiver for decoding multiple code clocks multiplexed in same modulation symbols suitable for the practice of the principles of another embodiment of the present invention.

In another embodiment of the invention, the iterative operation may be performed without correctly decoding and re-encoding some of the code blocks. Instead, reliability of the coded and information bits may be used to pass through the iterations to improve detection performance. One representation of reliability is called extrinsic information, which is the new likelihood information about each bit that is passed between the multiple processing blocks within the iterative loop. An example is shown in FIG. 26. FIG. 26 illustrates an alternative iterative receiver for decoding multiple code clocks multiplexed in same modulation symbols. Because FIG. 26 is almost same as FIG. 24, detailed explanation is omitted and only difference will be described. Extrinsic information is passed between demodulator 692 and decoder 696. Each takes the extrinsic information from the other as prior information in the calculation of likelihood of each bit and generates a new round of extrinsic information. For a successful decoding, as the iteration goes on, the likelihood of the bits will improve and eventually leads to decoding success.

Figure 27:
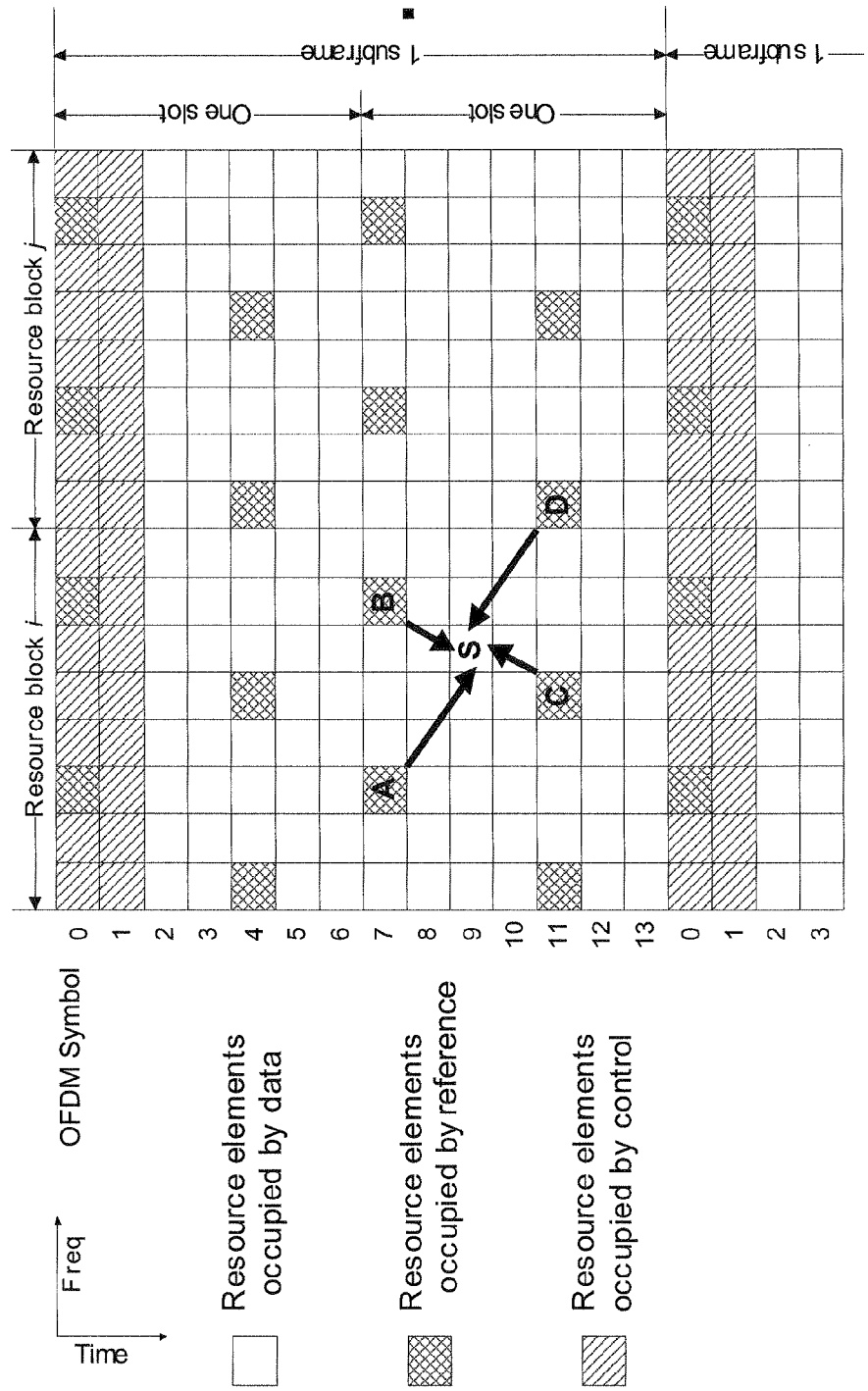
FIG. 27 shows the downlink subframe structure in a 3rd Generation Partnership Project (3GPP) Long Term Evolution (LTE) system.

In a long term evolution (LTE) system, the downlink subframe structure is shown in FIG. 27.

As shown in FIG. 27, each subframe contains two slots with each slot containing seven OFDM symbols (i.e. OFDM symbols 0-6) in time domain. Control channel signals are located in the first two or three OFDM symbols in a subframe. In this case, control channel signals are located in the first two OFDM symbols. Reference signals are located at OFDM symbol 0, 4, 7, and 11. For simplicity, only the reference signals of the first transmit antenna will be discussed. In frequency domain, data may be presented by multiple resource blocks, such as resource blocks i and j. The ideas of the present invention may certainly be extended to systems with multiple transmit antennas and multiple reference signals. In order to maintain good channel estimation performance, interpolation or averaging of downlink reference signals is usually used. For example, as shown in FIG. 27, interpolation of reference signals at resource elements A, B, C, and D can be used to obtain channel estimation for resource element S with improved performance. However, this also means that the demodulation of the modulation symbol in resource element S need to wait until reference signals in resource element C and D are received. In other words, if the demodulation of resource element S happens before OFDM symbol 11 that contains resource elements C and D, the channel estimation performance for resource element S may be negatively impacted.

In the present invention, methods and apparatus to enable fast decoding of transmissions with information bits or parity bits from multiple coded packets are also proposed.

Aspects, features, and advantages of the present invention are readily apparent from the following detailed description, simply by illustrating a number of particular embodiments and implementations, including the best mode contemplated for carrying out the invention. The present invention is also capable of other and different embodiments, and several details can be modified in various obvious respects, all without departing from the spirit and scope of the invention. Accordingly, the drawings and description are to be regarded as illustrative in nature, and not as restrictive. The present invention is illustrated by way of example, and not by way of limitation, in the figures of the accompanying drawings. In the following illustrations, downlink data channel in long term evolution (LTE) systems is used as an example. The technique illustrated in the present invention, may certainly be used in uplink data channel in long term evolution (LTE) systems, control channels in either downlink or uplink in long term evolution (LTE) systems, and other data, control, or other channels in other systems whenever applicable.

When multiple code blocks are transmitted, the performance of the data transmission is dictated by the code block which has the worst performance. The channel interleaver, including the mapping from coded bits of different code blocks to modulation symbols, and the mapping from modulation symbols to time, frequency, and spatial resources, needs to be carefully designed to make sure each code block get roughly the same level of protection. When multiple code blocks are transmitted, it is beneficial to allow the receiver to start decoding of some code blocks while the receiver is still demodulating modulation symbols for other code blocks. In a long term evolution (LTE) system, this presents a challenge because the channel estimation performance might be impacted if there are not enough reference signals at the time of demodulation and decoding. In the present invention, techniques that allow fast decoding of multiple code blocks are proposed while good channel estimation performance is maintained.

In an OFDMA system, e.g., long term evolution (LTE), there are normally multiple OFDM symbols in a subframe. In long term evolution (LTE), reference signals are present in a few OFDM symbols called Reference Signal OFDM symbols, while absent in other OFDM symbols.

In one embodiment of the present invention, multiple OFDM symbols in a subframe are separated into groups with the boundary between at least two groups located in the Reference Signal OFDM symbols, or those OFDM symbols right before or right after the Reference Signal OFDM symbols. Each group contains resource elements that will carry coded bits from at least one code block. The resource elements in each group are contiguous or closely to each other in time domain. The receiver can start decoding of at least one code block after receiving all the resource elements in each group.

Figure 28:
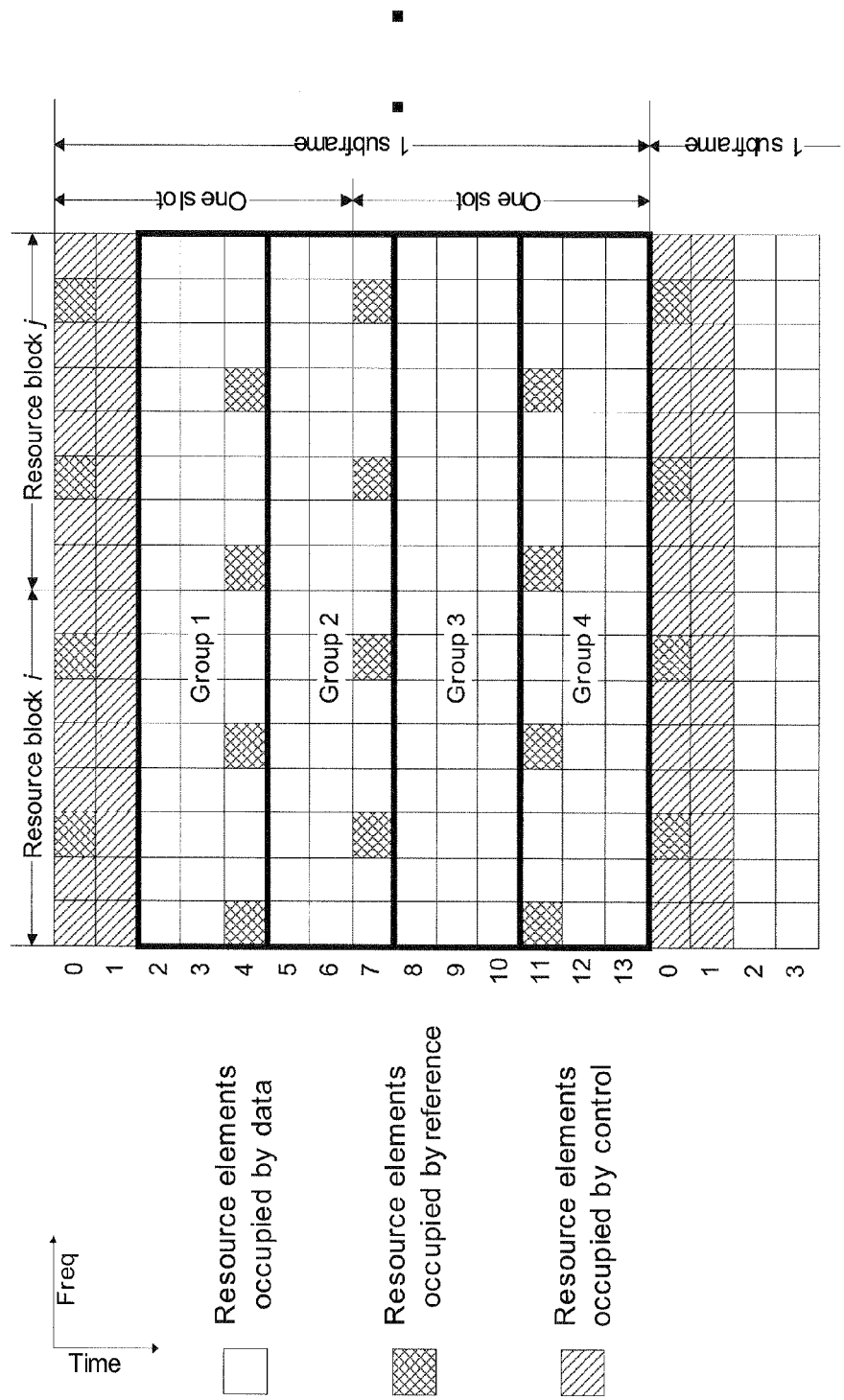
FIG. 28 shows another example of the configuration of grouping multiple OFDM symbols in a subframe suitable for the practice of the principles of one embodiment of the present invention.
Figure 28:
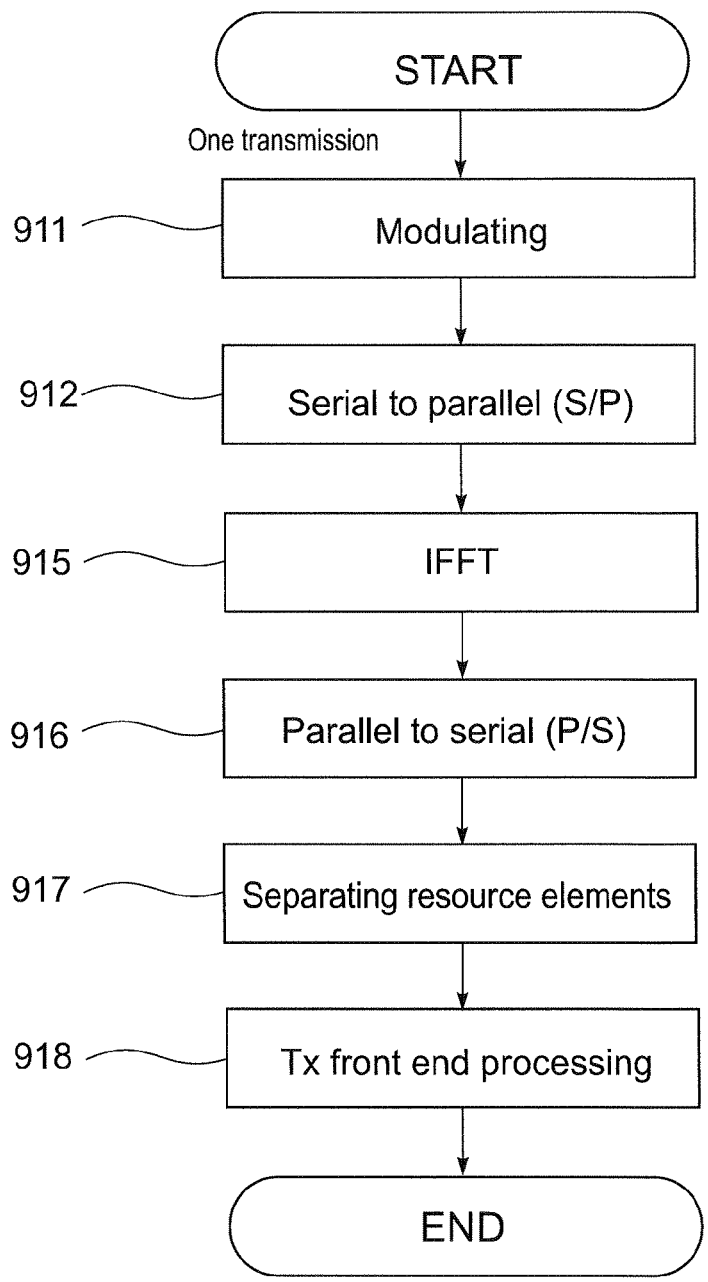
Figure 28:
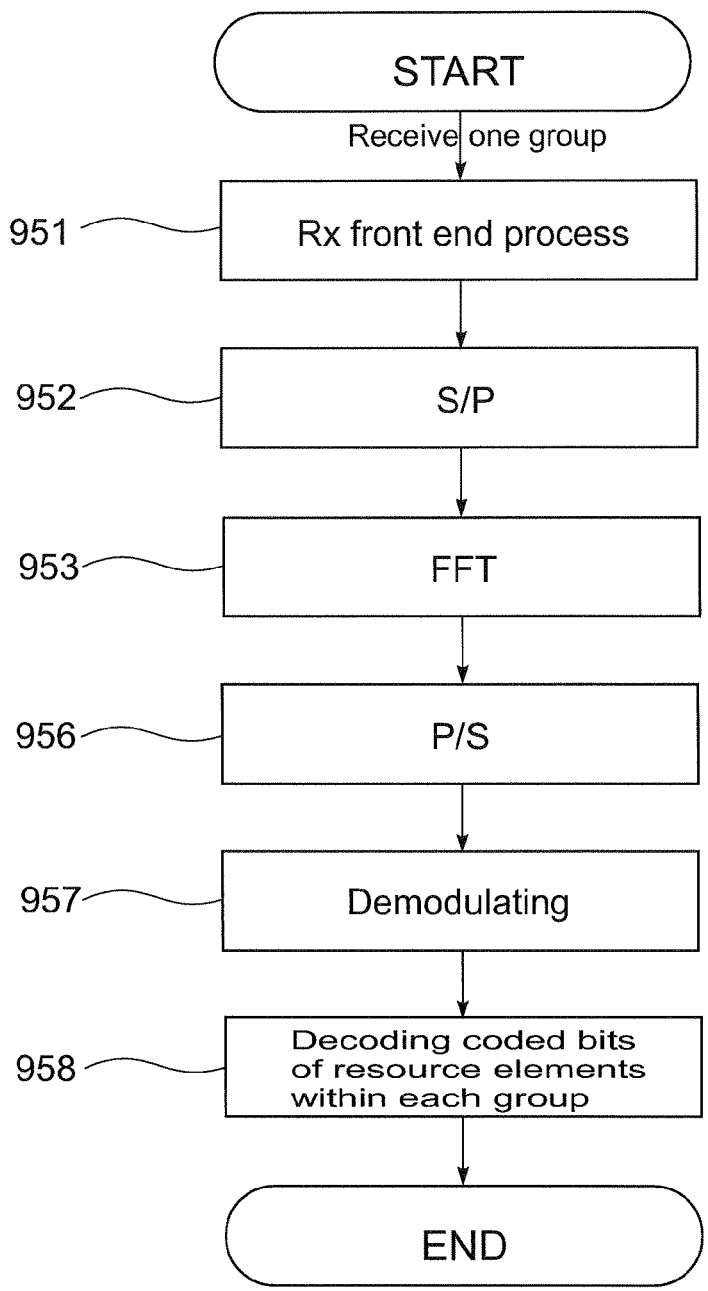

FIG. 28 shows one example of the configuration of grouping multiple OFDM symbols in a subframe constructed according to one embodiment of the present invention.

As shown in FIG. 28, control channel signals are located in the first two or three OFDM symbols in a subframe. In this case, control channel signals are located in the first two OFDM symbols. Group 1 is defined as a set of resource elements in OFDM symbol 2, 3, and 4 that are available to data channel; Group 2 is defined as a set of resource elements in OFDM symbol 5, 6 and 7 that are available to data channel; Group 3 is defined as a set of resource elements in OFDM symbol 8, 9, and 10 that are available to data channel; Group 4 is defined as a set of resource elements in OFDM symbol 11, 12, and 13 that are available to data channel. OFDM symbol 4 contains downlink reference signal; the boundary between Group 1 and Group are located between OFDM symbol 4 and 5. OFDM symbol 11 contains downlink reference signals; the boundary between Group 3 and Group 4 are located between OFDM symbol 10 and Because the boundary is always at or close to where the reference signal is, the receiver can start decoding of the code blocks carried within a group right after the group is received, or wait for one additional OFDM symbol, without sacrificing channel estimation performance. The receiver can take advantage of the latest available reference signal for the demodulation and decoding of the code blocks carried within a group. For example, there are 8 code blocks, the coded bits of two code blocks may be put into each group. For example, coded bits of code block 1 and 2 are contained in Group 1. After receiver received OFDM symbol 2, 3, 4, because all the resource elements in Group 1 is contained in these OFDM symbols, the receiver has received all the coded bits for code block 1 and 2. Therefore, the receiver can start decoding of these two code blocks. In this way, the receiver does not have to wait until the end of the subframe (after OFDM symbol 13) to start decoding. This design brings a few benefits to the receiver design in terms of hardware complexity and power consumption.

FIG. 28(a) is a flow chart illustrating a method of transmitting data signals by separating resource elements having coded bits suitable for the practice of the principles of one embodiment of the present invention. FIG. 28 (b) is a flow chart illustrating a method of receiving and decoding grouped resource elements having coded bits at a receiver. In FIG. 28(a), data bits are modulated in step 911, are then transformed from serial to parallel in step 912. Then data is transformed by IFFT method at step 915 and then processed from parallel to serial at step 916. Then the data in different code blocks are mapped to resources elements that are separated into different groups in step 917. Finally, transmitting front end having one or multiple transmitting antennas transmits the OFDM symbols that includes one or multiple groups of resource elements. In FIG. 28(b), the receiver starts receive OFDM symbols that include one group of resource elements by receiving front end process at step 951. Then the received OFDM symbols are processed by serial to parallel stage at step 952 and by FFT method at step 953. The group of resource elements are processed by parallel to serial processing at step 956 and finally are demodulated at step 957. The receiver then decodes the coded bits of the resources elements within the one group at step 958. As the receiver continues to receive OFDM symbols, the following groups of resource elements can be received and processed.

Figure 29:
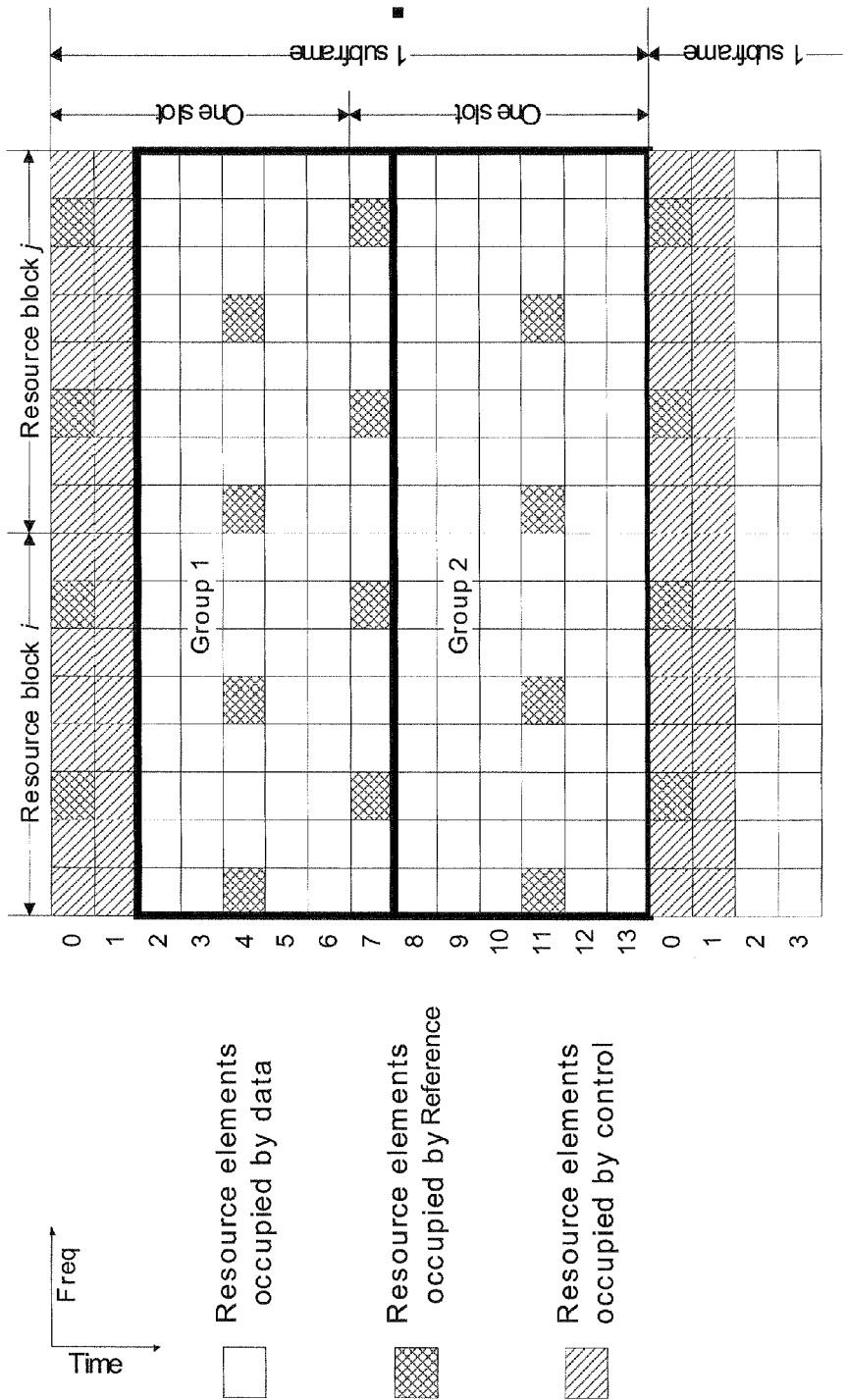
FIG. 29 shows another example of the configuration of grouping multiple OFDM symbols in a subframe suitable for the practice of the principles of one embodiment of the present invention.

FIG. 29 shows another example of the configuration of grouping multiple OFDM symbols in a subframe suitable for the practice of the principles of the present invention. In this example, two groups are defined. Control channel signals are located in the first two or three OFDM symbols in a subframe. Group 1 includes resource elements in OFDM symbol 2, 3, 4, 5, 6, 7 and Group 2 includes resource elements in OFDM symbol 8, 9, 10, 11, 12, 13. OFDM symbols 2-13 in a subframe are separated into two groups with the boundary between two groups located at OFDM symbol 7 and 8. Note that OFDM symbol 7 carries Reference Signals. Different configuration of groups can be used in different situations, such as, but not limited to, different UEs, different subframes, different quality of service, etc. without departing from the spirit of this invention.

Figure 30:
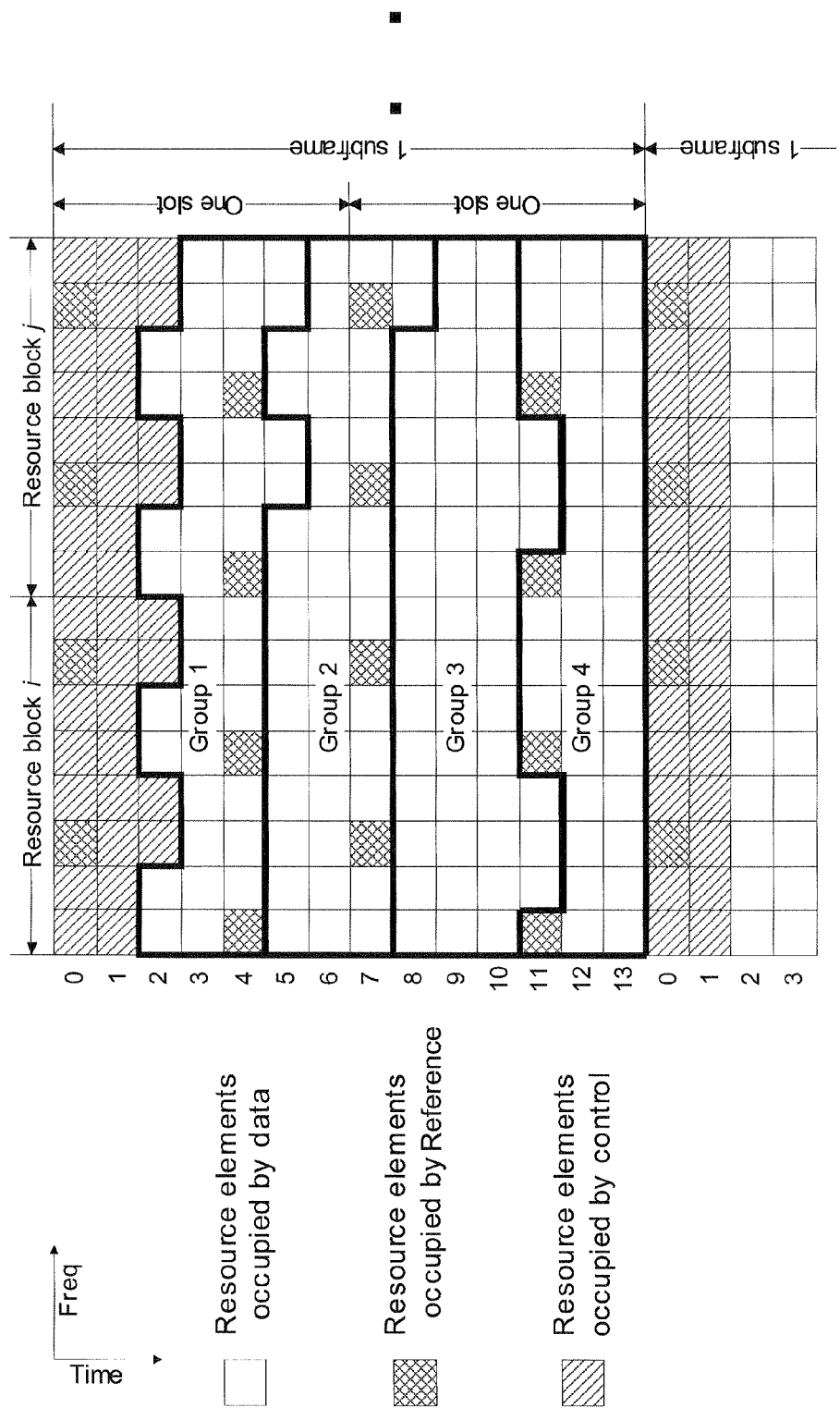
FIG. 30 shows another example of the configuration of grouping multiple OFDM symbols in a subframe suitable for the practice of the principles of one embodiment of the present invention.

FIG. 30 shows another example of the configuration of grouping multiple OFDM symbols in a subframe suitable for the practice of the principles of the present invention. In this example, although each group includes resource elements from contiguous OFDM symbols, some OFDM symbols, e.g., OFDM symbols 5, 8, and 11, may contain multiple groups. Again, note that the boundaries between groups are all located in OFDM symbols that carry Reference Signals or OFDM symbols that are immediately before or after the OFDM symbols that carry Reference Signals. This design allows more flexible group definition than the OFDM symbol based grouping while maintaining the benefits of allowing fast decoding without channel estimation performance loss.

Figure 32:
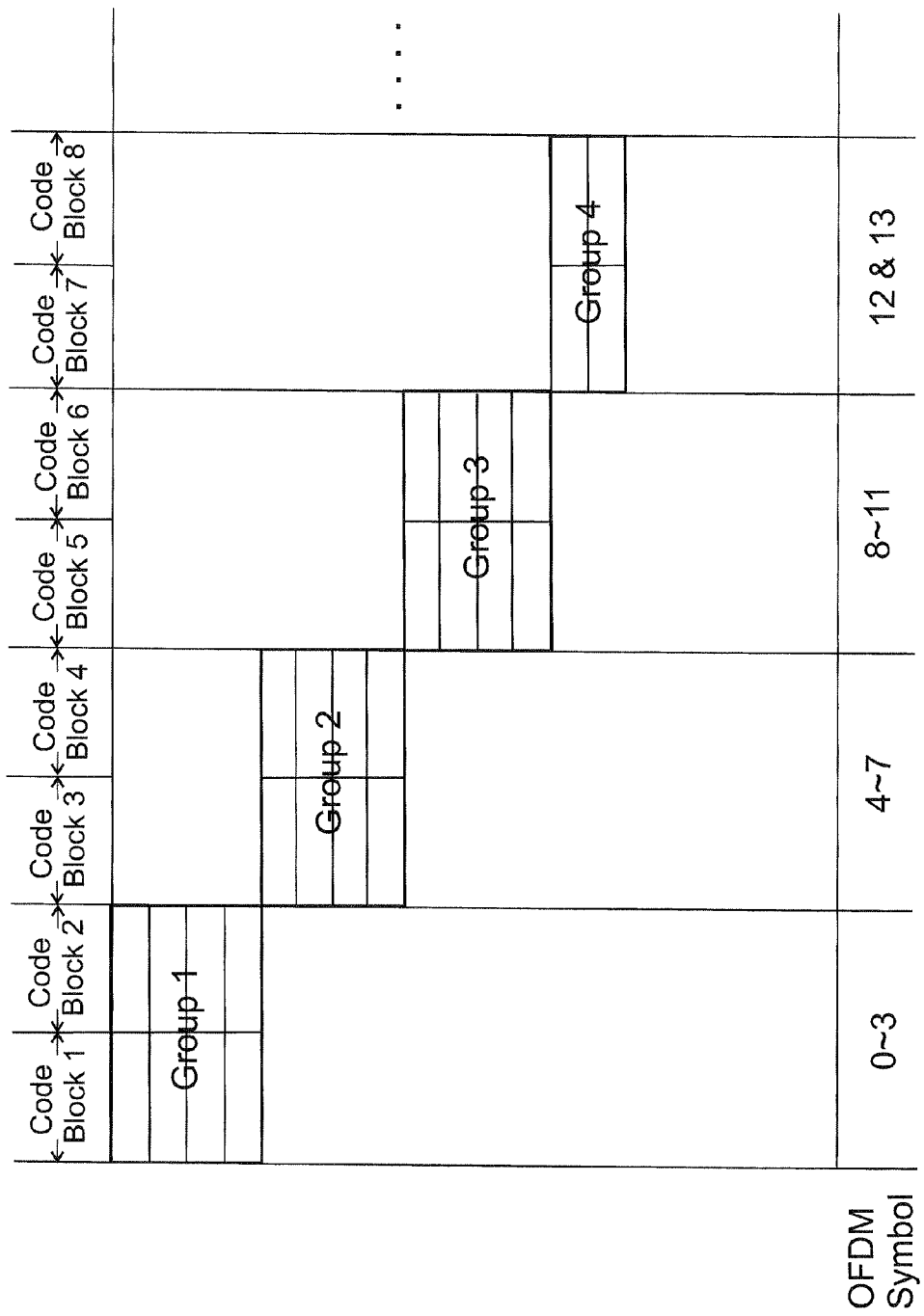
FIG. 32 shows an example of the configuration of grouping code bock suitable for the practice of the principles of another embodiment of the present invention.

In another embodiment of this invention, groups are defined based on code blocks instead of resource elements. FIG. 32 shows an example of the configuration of grouping code bock suitable for the practice of the principles of this embodiment of the present invention. Each group contains coded bits of at least one code block and may contain multiple code blocks. For example, code blocks 1 and 2 may be grouped as the first group, code blocks 3 and 4 may be grouped as the second group, code blocks 5 and 6 may be grouped as the third group, and code blocks 7 and 8 may be grouped as the fourth group. The first group is placed in the first a few OFDM symbols, and the second group is placed in the next a few OFDM symbols, etc. In this way, fast decoding of some code blocks without waiting until the end of a subframe is allowed.

With the group defined in aforementioned embodiments, either based on resource elements or code blocks, the rest of channel interleaving operations within each group may be defined. The channel interleaver may be quite general. For example, the channel interleaver may spread the coded bits of each code block within a group to as many resource elements in this group as possible. The channel interleaver may spread the coded bits of each code block within a group to different modulation positions as evenly as possible. The channel interleaver may attempt to make sure each modulation symbol within a group contains coded bits from multiple code blocks so that burst error on modulation symbols is spread on these code blocks.

The aforementioned embodiments of channel interleaver design can be extended to the case of MIMO transmissions. Suppose multiple layers are allocated to a MIMO codeword. This scenario can happen in long term evolution (LTE) systems, e.g., when the SU-MIMO transmission has rank greater than 1. In this case, a spatial dimension can be added to the definition of a group. A Multi-Input-Multi-Output (MIMO) codeword represents a transport block. A Multiple Input Multiple Output (MIMO) processor generating soft bits for at least one of a plurality of code blocks of a Multiple Input Multiple Output (MIMO) codeword FIG. 31 shows examples of parallel processing for successive interference cancellation either with or without group cyclic delay diversity (CRC) suitable for the practice of the principles of the present invention.

Figure 31:
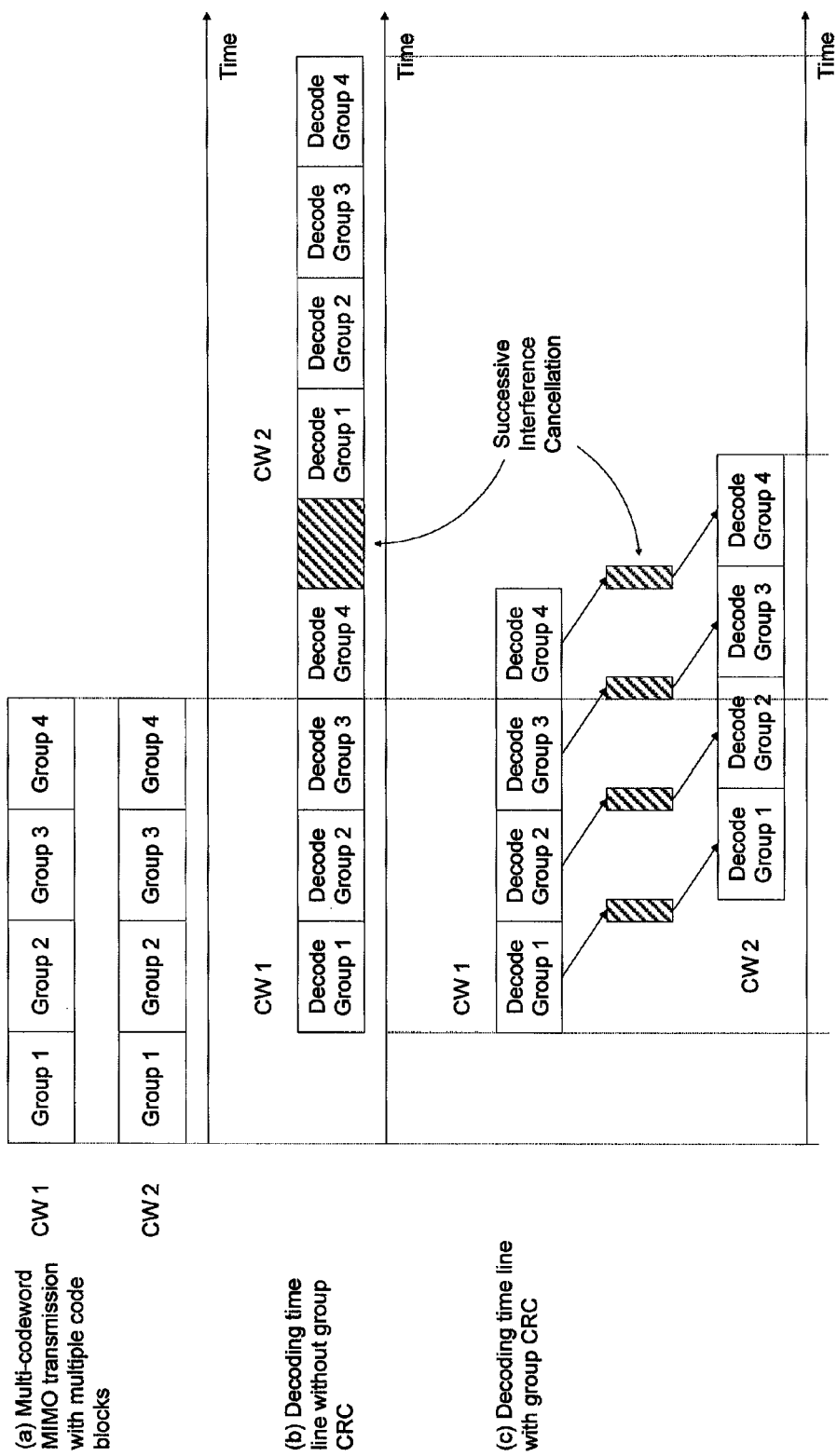
FIG. 31 shows examples of parallel processing for successive interference cancellation either with or without grouping cyclic delay diversity (CRC) suitable for the practice of the principles of the present invention.

A shown in FIG. 31, four groups are defined within a subframe: Group 1 can be defined as a set of resource elements in OFDM symbol 2, 3, and 4, including multiple MIMO layers or MIMO streams on those resource elements; Group 2 can be defined as a set of resource elements in OFDM symbol 5, 6, and 7, including multiple MIMO layers or MIMO streams on those resource elements; etc.

As shown in subfigure (a) of FIG. 31, within each group there are two layers; within each group there are two layers or streams; within each MIMO layer or MIMO stream there are four groups. In a multi-codeword MIMO transmission, each layer may incorporate a corresponding MIMO codeword (CW), i.e. CW1 and CW2, and each CW carries multiple code blocks and a 24-bit CRC as shown in subfigure (b) of FIG. 31. For each MIMO codeword, this CRC is applied to the whole MIMO codeword (a transport block having multiple code blocks), i.e., all the code blocks in Group 1, 2, 3, and 4 that belong to the MIMO codeword. Therefore, with the group definition, decoding of code blocks in MIMO CW1 may be started immediately after demodulation of modulation symbols in Group 1. By doing so, the demodulation of the later groups is parallelized with the decoding of earlier groups. In addition, with the help of this CRC, the interference from CW1 to CW2 may be cancelled by successive interference cancellation.

Further, the parallel processing capability may be significantly enhanced. In another embodiment of the present invention, CRC is added to one or multiple code blocks of a codeword within a group. One example is shown in subfigure (c) of FIG. 31: one CRC may be attached to each of groups. With the group definition, decoding of code blocks in CW1 may be started immediately after demodulation of Group 1. By doing so, the demodulation of the later groups is parallelized with the decoding of previous groups. With the per-group CRC, the interference from CW1 to CW2 in Group 1 may be cancelled and decoding of code blocks of CW2 in Group 1 may be started immediately after the decoding of those code blocks of CW1 in Group 1. By doing so, the demodulation of the later groups in CW1, the decoding of earlier groups in CW1, the successive interference cancellation, the demodulation of the later groups in CW2, and the decoding of earlier groups in CW2 can all be processed paralleled in one way or another.

Certainly, CRC may be added to the groups of both MIMO codewords CW1 and CW2 separately. In that case, it enables parallel processing even in the case of an iterative receiver. In other words, when the iterative receiver is used to decode CW1 and CW2, the iterative receiver for Group 1 is used in the decoding of the code blocks of CW1 in Group 1, and the decoding of the code blocks of CW2 in Group 1. In this case, even the iterative receiver can be parallelized between groups.

Certainly, many variations and receiver structures may be obtained. For example, the group definition across these two layers needs not to be exactly synchronized. This may cause some delay in processing or some performance degradation, but may allow more flexibility in group definition. Even the number of groups within each layer may be different.

What is claimed is:

1. A transmitter, comprising:
   a first cyclic redundancy check (CRC) calculator configured to generate a transport block CRC for at least one transport block of information bits;
   a separator configured to segment the transport block into a plurality of code blocks;
   a second CRC calculator configured to generate a plurality of code block CRCs for the plurality of code blocks, wherein at least one of the code block CRCs is generated based upon a corresponding code block; and
   a processing unit configured to transmit the plurality of code blocks and the plurality of code block CRCs.

2. The transmitter of claim 1, further comprising:
   an encoder configured to encode bits in each code block within the plurality of code blocks using a forward error correcting code, wherein the second CRC generator is configured to generate the code block CRCs based upon the encoded code blocks.

3. The transmitter of claim 1, wherein each of the plurality of code block CRCs is generated based upon a corresponding one of the plurality of code blocks.

4. The transmitter of claim 1, wherein each of the plurality of code block CRCs is generated based upon at least the corresponding one of the plurality of code blocks.

5. The transmitter of claim 1, wherein at least one of the plurality of code block CRCs is generated based upon a combination of the corresponding code block and at least one code block preceding the corresponding code block.

6. The transmitter of claim 1, wherein the plurality of code blocks comprise at least one code block from which no code block CRC is generated.

7. The transmitter of claim 1, further comprising:
   an encoder configured to encode data bits of the plurality of code blocks using a type of forward error correcting code.

8. The transmitter of claim 1, wherein the first CRC generator is further configured to attach the transport block CRC to the transport block, and wherein the second CRC generator is further configured to attach the at least one code block CRC to the corresponding code block.

9. The transmitter of claim 1, wherein the first CRC generator is configured to generate the transport block CRC for the transport block before the transport block is segmented into the plurality of code blocks.

10. The transmitter of claim 1, wherein each of the plurality of code block CRCs are generated based on a different one of the plurality of code blocks.

11. The transmitter of claim 1, wherein each of the code block CRCs is generated based upon a corresponding one of the plurality of code blocks.

12. The transmitter of claim 1, wherein each of the code block CRCs is generated based upon at least the corresponding one of the plurality of code blocks.

13. The transmitter of claim 12, wherein the each of the code block CRCs is generated based upon a combination of the corresponding of code block and code blocks preceding the corresponding code block.

14. A method for transmitting data bits, the method comprising:
   generating a transport block cyclic redundancy check (CRC) for at least one transport block of information bits;
   segmenting the transport block into a plurality of code blocks;
   generating a plurality of code block CRCs for the plurality of code blocks, wherein at least one of the code block CRCs is generated based upon a corresponding code block; and
   transmitting the plurality of code blocks and the plurality of code block CRCs.

15. The method of claim 14, further comprising:
   encoding bits in a code block selected from the plurality of code block using a forward error correcting code; and
   generating the code block CRCs based upon the encoded code blocks.

16. The method of claim 14, wherein each of the plurality of code block CRCs is generated based upon a corresponding one of the plurality of code blocks.

17. The method of claim 14, wherein each of the plurality of code block CRCs is generated based upon at least the corresponding one of the plurality of code blocks.

18. The method of claim 14, wherein at least one of the plurality of code block CRCs is generated based upon a combination of the corresponding code block and at least one code block preceding the corresponding code block.

19. The method of claim 14, wherein the plurality of code blocks comprise at least one code block from which no code block CRC is generated.

20. The method of claim 14 further comprising:
   encoding data bits of the plurality of code blocks using a type of forward error correcting code.

21. The method of claim 14, further comprising:
   attaching the transport block CRC to the transport block; and
   attaching the at least one code block CRC to the corresponding code block.

22. The method of claim 14, wherein the transport block CRC for the transport block is generated before the transport block is segmented into the plurality of code blocks.

23. The method of claim 14, wherein each of the plurality of code block CRCs are generated based on a different one of the plurality of code blocks.

24. The method of claim 14, wherein each of the code block CRCs is generated based upon a corresponding one of the plurality of code blocks.

25. The method of claim 14, wherein each of the code block CRCs is generated based upon at least the corresponding one of the plurality of code blocks.

26. The method of claim 25, wherein the each of the code block CRCs is generated based upon a combination of the corresponding of code block and code blocks preceding the corresponding code block.

\* \* \* \* \*